United States Patent
Goyal

(10) Patent No.: US 8,481,460 B2
(45) Date of Patent: Jul. 9, 2013

(54) FACETED CERAMIC FIBERS, TAPES OR RIBBONS AND EPITAXIAL DEVICES THEREFROM

(75) Inventor: Amit Goyal, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 13/529,410

(22) Filed: Jun. 21, 2012

(65) Prior Publication Data

US 2012/0309632 A1 Dec. 6, 2012

Related U.S. Application Data

(63) Continuation of application No. 11/861,949, filed on Sep. 26, 2007, now Pat. No. 8,227,082.

(51) Int. Cl.
*H01L 39/24* (2006.01)
*H01B 12/00* (2006.01)

(52) U.S. Cl.
USPC ........... 505/237; 505/236; 505/238; 505/230; 505/704; 428/702; 428/930

(58) Field of Classification Search
USPC ................. 505/230, 235, 236–239, 434, 701, 505/704; 428/298, 392, 698, 700, 702, 930; 257/33, 35
See application file for complete search history.

(56) References Cited

U.S. PATENT DOCUMENTS

| | | | |
|---|---|---|---|
| 5,057,484 A | 10/1991 | Shiota et al. | |
| 5,093,311 A | 3/1992 | Shiota et al. | |
| 5,432,151 A | 7/1995 | Russo et al. | |
| 5,543,630 A * | 8/1996 | Bliss et al. | 257/33 |
| 5,650,378 A | 7/1997 | Iijima et al. | |
| 5,739,086 A | 4/1998 | Goyal et al. | |
| 5,741,377 A | 4/1998 | Goyal et al. | |
| 5,846,912 A | 12/1998 | Selvamanickam et al. | |
| 5,849,670 A * | 12/1998 | Nabatame et al. | 505/230 |
| 5,872,080 A | 2/1999 | Arendt et al. | |
| 5,898,020 A | 4/1999 | Goyal et al. | |
| 5,958,599 A | 9/1999 | Goyal et al. | |
| 5,964,966 A | 10/1999 | Goyal et al. | |
| 5,968,877 A | 10/1999 | Budai et al. | |
| 6,077,344 A | 6/2000 | Shoup et al. | |
| 6,106,615 A | 8/2000 | Goyal et al. | |
| 6,114,287 A | 9/2000 | Lee et al. | |

(Continued)

FOREIGN PATENT DOCUMENTS

| | | |
|---|---|---|
| DE | 19740964 | 3/1999 |
| EP | 0718897 | 6/1996 |

OTHER PUBLICATIONS

Celik et al., Nb-doped SrTiO3 buffer layers on LaAlO3 substrates by metalorganic deposition for YBCO superconducting films, Mat. Sci. Eng. B, 110 (2004), pp. 96-102.

*Primary Examiner* — Stanley Silverman
*Assistant Examiner* — Kallambella Vijayakumar
(74) *Attorney, Agent, or Firm* — Novak Druce Connolly Bove + Quigg LLP

(57) ABSTRACT

A crystalline article includes a single-crystal ceramic fiber, tape or ribbon. The fiber, tape or ribbon has at least one crystallographic facet along its length, which is generally at least one meter long. In the case of sapphire, the facets are R-plane, M-plane, C-plane or A-plane facets. Epitaxial articles, including superconducting articles, can be formed on the fiber, tape or ribbon.

3 Claims, 37 Drawing Sheets

U.S. PATENT DOCUMENTS

| | | |
|---|---|---|
| 6,150,034 A | 11/2000 | Paranthaman et al. |
| 6,151,610 A | 11/2000 | Senn et al. |
| 6,154,599 A | 11/2000 | Rey |
| 6,156,376 A | 12/2000 | Paranthaman et al. |
| 6,159,610 A | 12/2000 | Paranthaman et al. |
| 6,180,570 B1 | 1/2001 | Goyal |
| 6,190,752 B1 | 2/2001 | Do et al. |
| 6,214,772 B1 | 4/2001 | Iijima et al. |
| 6,235,402 B1 | 5/2001 | Shoup et al. |
| 6,261,704 B1 | 7/2001 | Paranthaman et al. |
| 6,265,353 B1 | 7/2001 | Kinder et al. |
| 6,270,908 B1 | 8/2001 | Williams et al. |
| 6,331,199 B1 | 12/2001 | Goyal et al. |
| 6,361,598 B1 | 3/2002 | Balachandran et al. |
| 6,375,768 B1 | 4/2002 | Goyal |
| 6,399,154 B1 | 6/2002 | Williams et al. |
| 6,440,211 B1 | 8/2002 | Beach et al. |
| 6,447,714 B1 | 9/2002 | Goyal et al. |
| 6,451,450 B1 | 9/2002 | Goyal et al. |
| 6,468,591 B1 | 10/2002 | Paranthaman et al. |
| 6,486,100 B1 | 11/2002 | Lee et al. |
| 6,537,689 B2 * | 3/2003 | Schoop et al. .......... 428/701 |
| 6,599,346 B2 | 7/2003 | Goyal et al. |
| 6,602,313 B2 | 8/2003 | Goyal et al. |
| 6,607,313 B1 | 8/2003 | Farries et al. |
| 6,607,838 B2 | 8/2003 | Goyal et al. |
| 6,607,839 B2 | 8/2003 | Goyal et al. |
| 6,610,413 B2 | 8/2003 | Goyal et al. |
| 6,610,414 B2 | 8/2003 | Goyal et al. |
| 6,632,539 B1 | 10/2003 | Iijima et al. |
| 6,635,097 B2 | 10/2003 | Goyal et al. |
| 6,645,313 B2 | 11/2003 | Goyal et al. |
| 6,663,976 B2 | 12/2003 | Beach et al. |
| 6,670,308 B2 | 12/2003 | Goyal |
| 6,675,229 B1 | 1/2004 | Bruno et al. |
| 6,716,795 B2 | 4/2004 | Norton et al. |
| 6,740,421 B1 | 5/2004 | Goyal |
| 6,756,139 B2 | 6/2004 | Jia et al. |
| 6,764,770 B2 | 7/2004 | Paranthaman et al. |
| 6,782,988 B2 | 8/2004 | Cantacuzene et al. |
| 6,784,139 B1 | 8/2004 | Sankar et al. |
| 6,790,253 B2 | 9/2004 | Goyal et al. |
| 6,797,030 B2 | 9/2004 | Goyal et al. |
| 6,846,344 B2 | 1/2005 | Goyal et al. |
| 6,884,527 B2 | 4/2005 | Groves et al. |
| 6,890,369 B2 | 5/2005 | Goyal et al. |
| 6,899,928 B1 | 5/2005 | Groves et al. |
| 6,902,600 B2 | 6/2005 | Goyal et al. |
| 6,921,741 B2 | 7/2005 | Arendt et al. |
| 7,087,113 B2 | 8/2006 | Goyal |

* cited by examiner

PRIOR ART

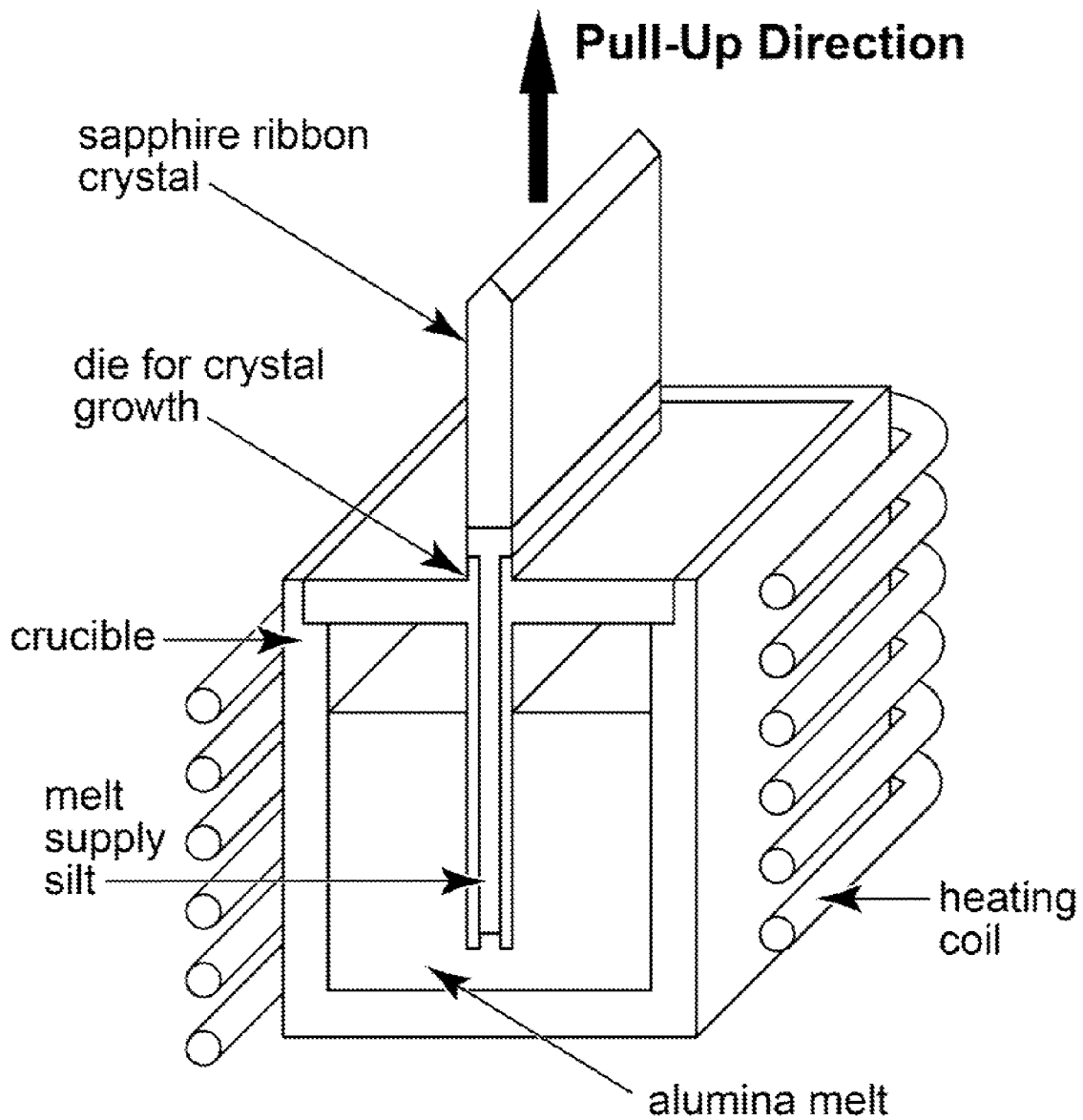

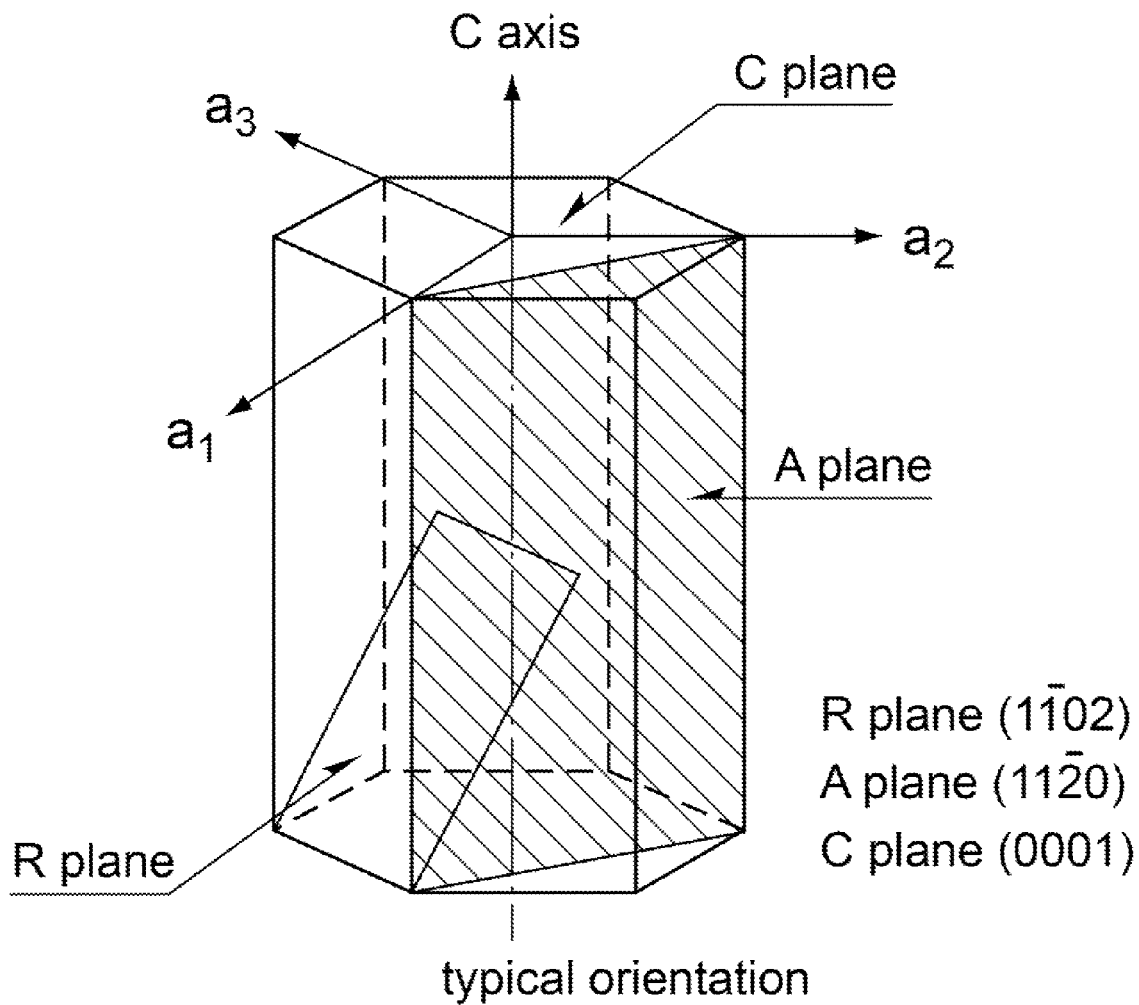
Unit Cell of Sapphire
PRIOR ART

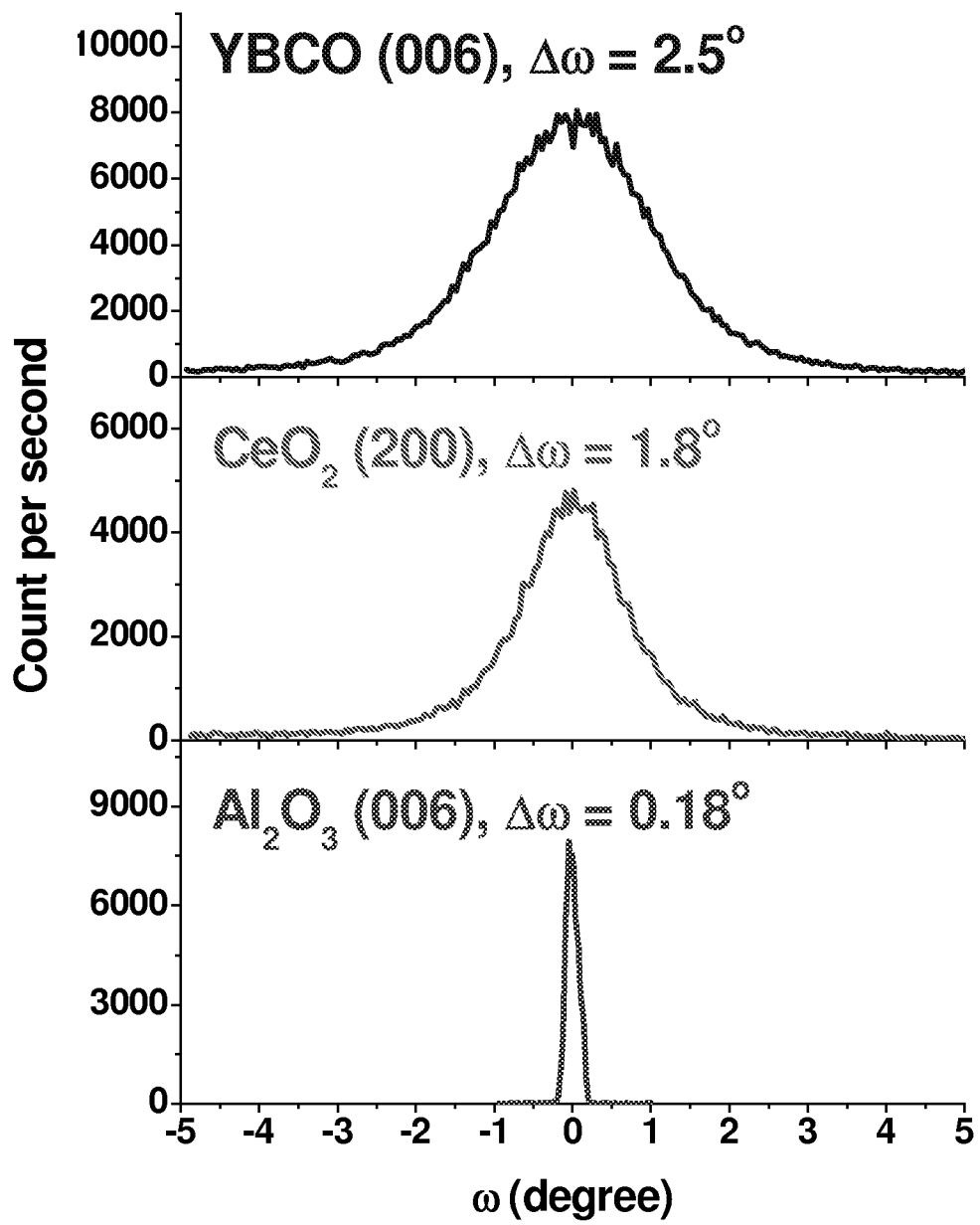

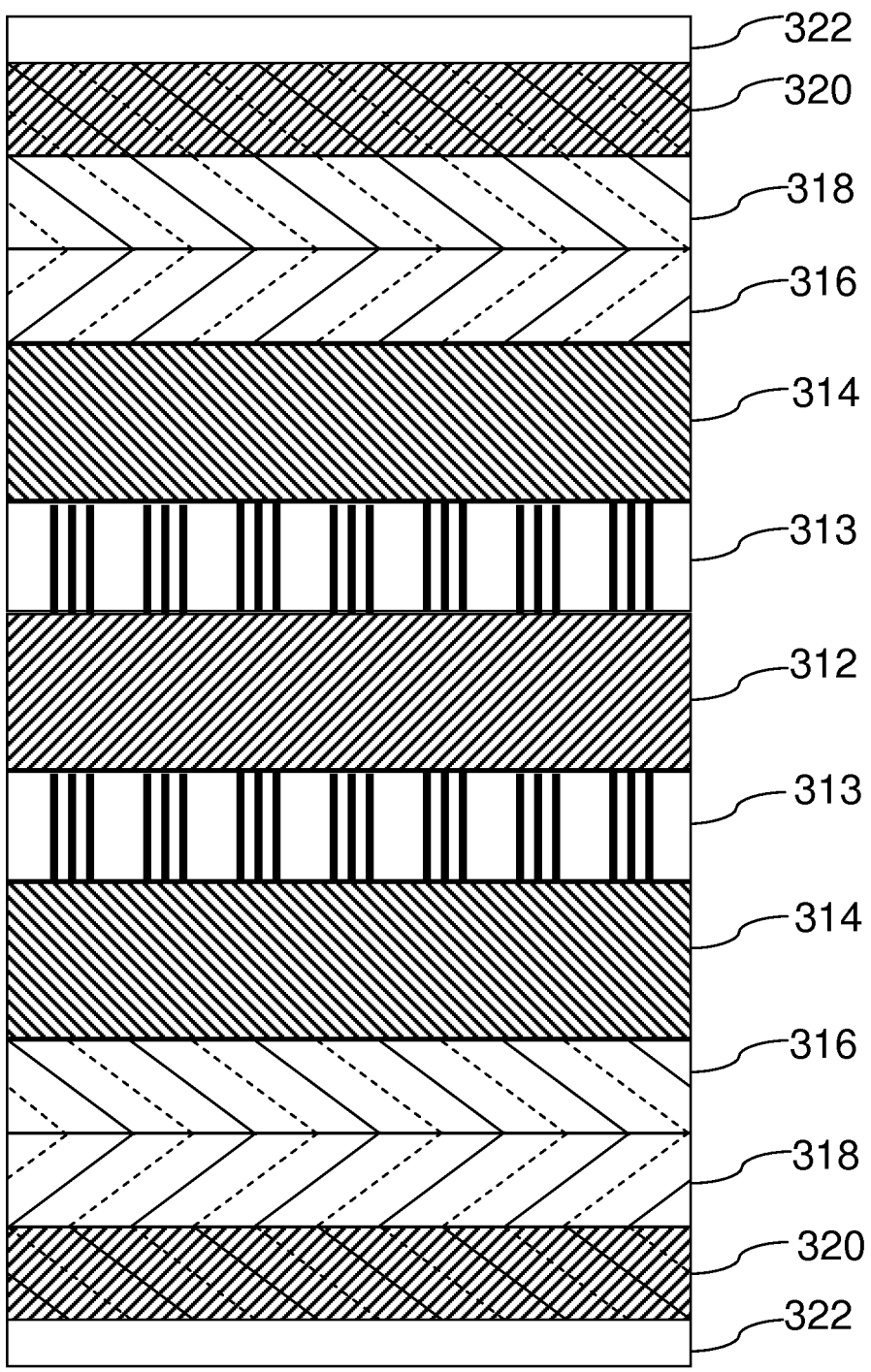

FIG. 18
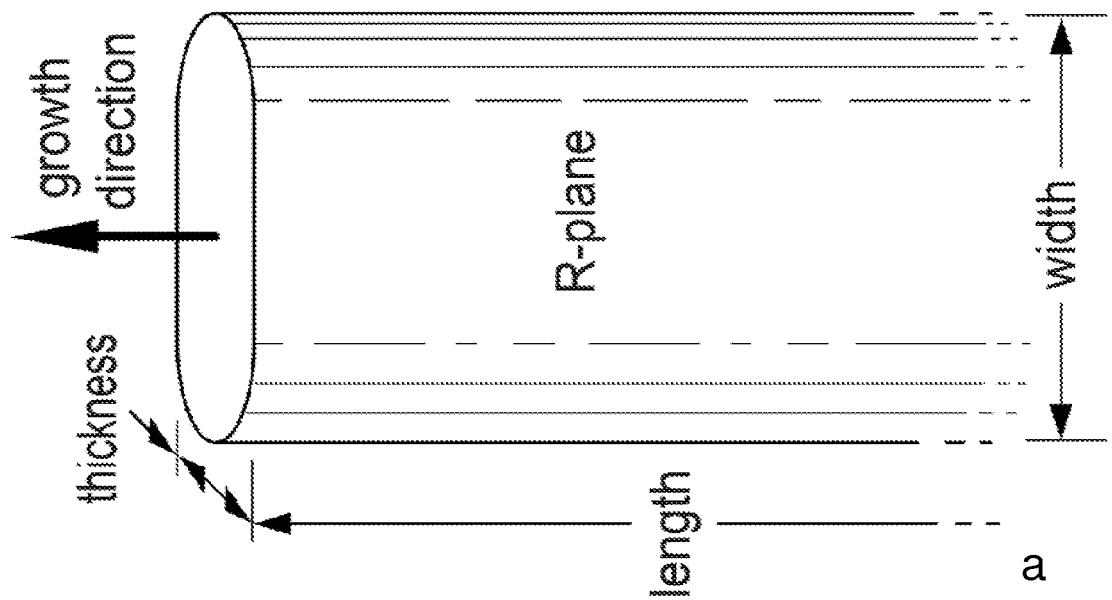
a
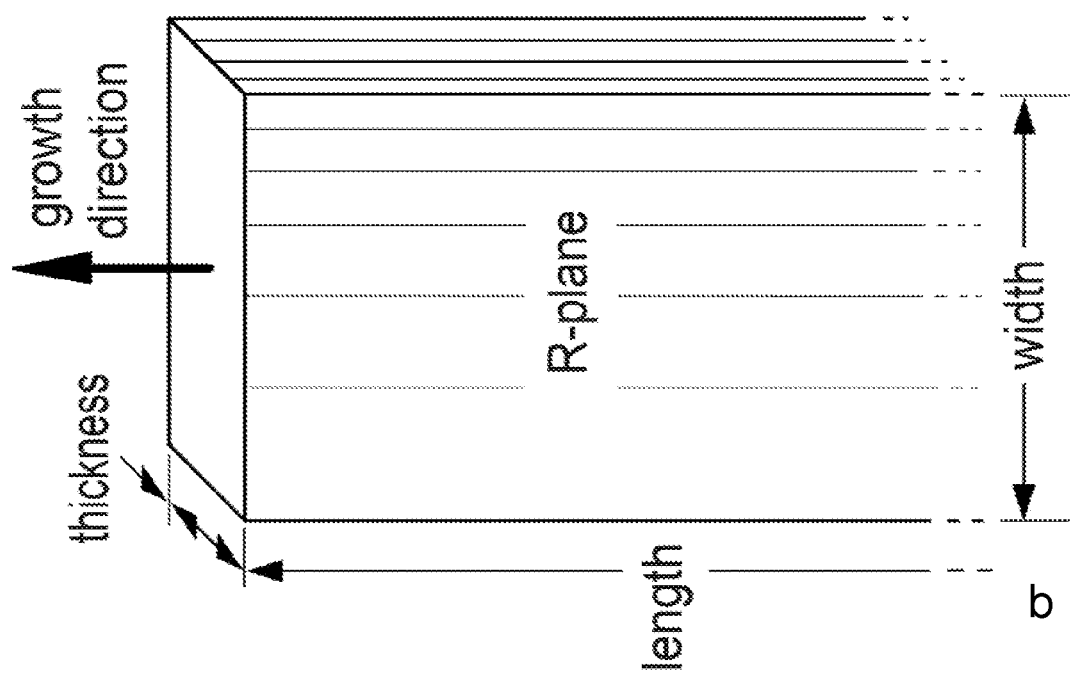
b

FIG. 33
a
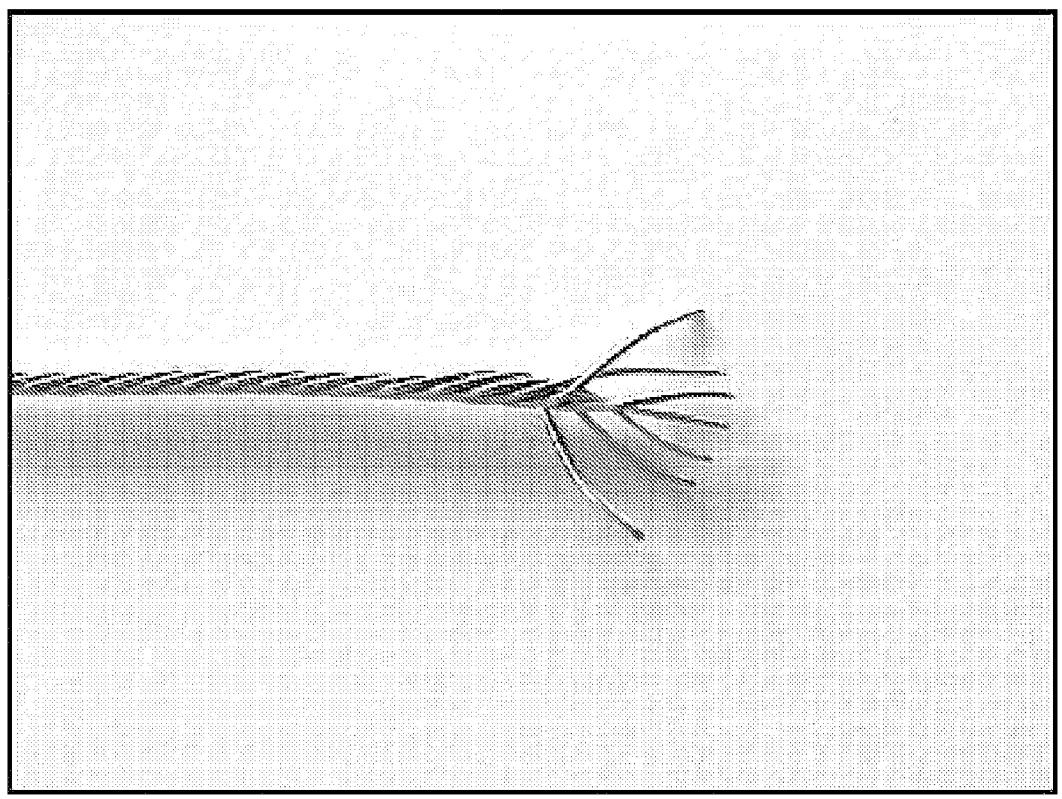
b

FACETED CERAMIC FIBERS, TAPES OR RIBBONS AND EPITAXIAL DEVICES THEREFROM

STATEMENT REGARDING FEDERALLY SPONSORED RESEARCH OR DEVELOPMENT

The United States Government has rights in this invention pursuant to Contract No. DE-AC05-00OR22725 between the United States Department of Energy and UT-Battelle, LLC.

CROSS-REFERENCE TO RELATED APPLICATION

This application Claims priority to U.S. patent application Ser. No. 11/861,949, filed Sep. 26, 2007, now U.S. Pat. No. 8,227,082 B2, which is hereby incorporated by reference in its entirety.

FIELD OF THE INVENTION

The present invention relates to the fabrication of faceted ceramic fibers, tapes or ribbons and epitaxial, functional layers thereon and/or devices prepared therefrom by deposition of one or more epitaxial layers on the surface of the facets.

BACKGROUND OF THE INVENTION

Many electrical, electronic, optical, magnetic, electromagnetic and electro-optical devices require single crystal-like device layers with few defects within the device layer for proper operation. For such applications, single-crystal or single-crystal-like devices offer the best performance. Fabrication of large-scale single-crystal-like devices can be accomplished by epitaxial growth of these devices on lattice-matched, single crystal substrates of ceramic materials of oxides, nitrides and carbides, such as MgO, $Al_2O_3$, $SrTiO_3$, $LaAlO_3$, $NdGaO_3$, $LaAlO_3$, $YAlO_3$, and LSAT (($La_{0.18}Sr_{0.82}$)($Al_{0.59}Ta_{0.41}$)$O_3$), Si, GaN, and SiC. However, these substrates cannot be fabricated using known processes in long lengths or in large areas and are generally limited to sizes of no more than about a foot in length and diameter. These substrates are also rigid and not flexible because these substrates are typically at least about 1 mm thick.

A variety of artificially fabricated, polycrystalline, single crystal-like (sometimes referred to as being sharply textured) substrates have been developed. Among them, an important class of substrates is known as rolling assisted, biaxially textured substrates (RABiTS). Biaxial texture in a substrate refers to a situation where the are a plurality of grains (thus being polycrystalline substrate), where the individual grains in the polycrystalline substrate are preferentially aligned within a certain angular range with respect to one another in two orthogonal directions. A polycrystalline material having biaxial texture of sufficient quality for electromagnetic applications, such as superconducting applications, can be generally defined as being characterized by an x-ray diffraction phi scan peak of no more than 20° full-width-half-maximum (FWHM) and a omega-scan of 10° FWHM. The X-ray phi-scan and omega-scan measure the degree of in-plane and out-of-plane texture, respectively. An example of biaxial texture is the cube texture with orientation {100} <100>, wherein the (100) crystallographic plane of all grains is parallel to the substrate surface and the [100] crystallographic direction is aligned along the substrate length.

A variety of buffer layers are known, generally for use with polycrystalline, biaxially textured substrates. The disclosure of the following U.S. patents is incorporated herein by reference for each of its disclosure regarding textured buffer layers: U.S. Pat. Nos. 5,739,086; 5,741,377; 5,846,912; 5,898,020; 5,964,966; 5,958,599; 5,968,877; 6,077,344; 6,106,615; 6,114,287; 6,150,034; 6,156,376; 6,151,610; 6,159,610; 6,180,570; 6,235,402; 6,261,704; 6,270,908; 6,331,199; 6,375,768, 6,399,154; 6,451,450; 6,447,714; 6,440,211; 6,468,591, 6,486,100; 6,599,346; 6,602,313, 6,607,313; 6,607,838; 6,607,839; 6,610,413; 6,610,414; 6,635,097; 6,645,313; 6,537,689, 6,663,976; 6,670,308; 6,675,229; 6,716,795; 6,740,421; 6,764,770; 6,784,139; 6,790,253; 6,797,030; 6,846,344; 6,782, 988; 6,890,369; 6,902,600; 7,087,113. Moreover, there are other known routes to fabrication of polycrystalline, biaxially textured, substrates, such as ion-beam-assisted deposition (IBAD) and inclined-substrate deposition (ISD). IBAD processes are described in U.S. Pat. Nos. 6,632,539, 6,214,772, 5,650,378, 5,872,080, 5,432, 151, 6,361,598, 5,872,080, 6,756,139, 6,884,527, 6,899,928, 6,921,741; ISD processes are described in U.S. Pat. Nos. 6,190,752 and 6,265,353; all these patents are incorporated herein by reference for their IBAD or ISD related disclosure. In the IBAD and ISD processes a flexible, polycrystalline, untextured substrate is used and then a biaxially textured layer is deposited on this substrate. Large-area and flexible single crystal metal or alloy substrates have also been fabricated as reported in U.S. Pat. No. 7,087,113 by Goyal. U.S. Pat. No. 7,087,113 by Goyal is also incorporated herein by reference for its disclosure regarding large-area and flexible single crystal metal or alloy substrates.

Superconducting tapes based on epitaxial growth of superconductors on biaxially textured substrates described above using RABiTS, ISD or IBAD processes or based on the single-crystal metal or alloy substrates disclosed in U.S. Pat. No. 7,087,113 by Goyal are currently slated to be used for most large-scale applications of high temperature superconductors. The conductors based on these techniques use a metallic substrate in the form of a tape, typically a cm or so wide from which about 0.4 cm wide wires are slit. However, for all these conductors, the AC losses are generally high. AC losses result in the YBCO coated conductor as a result of either applying ac currents to the conductor or placing the conductor in applied alternating magnetic fields. Minimizing these losses entails reduction of hysteretic losses in the superconductor, the substrate normal metal effects such as eddy currents, ferromagnetic substrate contributions, and coupling current losses. Depending on the application environment, certain types of these losses dominate. A principal concern is generally the hysteretic loss, but the other losses can become quite important, especially at high frequencies. These losses are high because it is not possible to fabricate narrow wires. Hence, the successful incorporation of superconducting tapes into these ac-applications will require the development of an ac-tolerant version of the superconducting wire that will sufficiently minimize these effects.

Methods to reduce the ac losses are being developed. Ferromagnetic loss of the substrate can essentially be removed by the use of non-magnetic substrates, as is one of the goals for the RABiTS process. Reduction in hysteretic losses in the superconductor layer can be done by making the coated conductor with a filamentary design and making the filament width very narrow, such as about 100 microns or so. Eddy currents and coupling currents can be reduced by increasing the resistance of the substrate and the interfilamentary path, respectively. Twisting (or some scheme to allow field penetration), whether in the YBCO coated conductor architecture or of the conductor itself is generally necessary to further reduce AC losses. However, these techniques to reduce AC losses are quite difficult to implement with the epitaxial superconductor on RABiTS, ISD and IBAD or single-crystal metal or alloy substrates. Addressing the issues with the metal or alloy substrate is perhaps the simplest to do and is generally the only primarily an issue with the RABiTS approach.

However, reducing the hysteretic losses in the superconductor layer is far more difficult. First of all, filamentization of the superconductor layer in the tape conductor into very narrow filaments is necessary. This is not only quite difficult and cumbersome to do in kilometer long superconducting tapes but also adds a very significant cost to the fabrication process making the total cost of the conductor too expensive for most large-scale applications. Second, as noted above, twisting and transposing of the filaments in a tape conductor is necessary to further reduce AC losses. However, twisting of a tape conductor is quite difficult and may not be possible in a practical process. So far twisting has not been demonstrated convincingly for coated conductors. Hence, it is unclear if a superconducting wire based on epitaxial superconductor on RABiTS, ISD and IBAD tape or single-crystal metal or alloy substrates will find use in large-scale applications of superconductors wherein low AC-losses are required. These applications include underground transmission lines, motors, generators, and high-field magnets, etc.

Ideally, a "round" superconducting wire is desired for most large-scale applications of high temperature superconductors. Of course, this wire needs to be single crystal or single-crystal-like in its crystallographic orientation since high-angle grain boundaries suppresses or disrupts supercurrents. Ideally, this wire will not be a metal or alloy based wire so that both ferromagnetic losses and eddy current losses are not an issue. This "round" wire also needs to be flexible in that it can be bended and twisted to transpose superconducting wires together to minimize AC losses. While this has been a need in the field of superconductivity for about two decades, no method or route exists to fabricate such a "round" superconducting wire.

As noted above, in addition to the high-temperature superconductor applications, for many other applications, including, but not limited to, electronic, optical, magnetic, electromagnetic and electro-optical applications, single crystal-like device layers with few defects within the device layer are required. For many of these applications, metal or alloy substrates are not desired. Furthermore, single-crystal-like substrates do not suffice for many semiconductor device applications as the use of these results in a high defect density in the device layer. In addition, for many of these applications, thick, rigid, ceramic single crystals are presently being used as substrates for the devices.

For example, single-crystal sapphire or $Al_2O_3$ substrates are commonly used in solid state lighting applications. The single-crystal ceramic substrates used in these applications are thick, inflexible, and non-faceted, and made using standard crystal growth processes which are generally both slow and expensive. For many of these device applications, reduction in cost of the substrate as well as reduction in the cost of fabricating or depositing the device layers on the substrates is a major concern. Finally, for many of these applications, having a flexible substrate offers great potential advantages. For example a single crystal wire or tape-like solid-state lighting device would be ideal for lighting applications. Many sensors which operate in harsh environments could use a long single crystal or single-crystal-like substrate which contains the device at one end. In addition, for some applications it may be desirable to couple semiconducting properties with optical properties for short fiber lengths. For other semiconductor-based applications such as photovoltaics or solar cells, it may be desired to have a tape geometry wherein the tape is flexible.

However, there is no known relatively rapid and low cost method for fabricating single-crystal wires, fibers or tapes of these device layers. Moreover, the crystals provided by available single-crystal, structural, ceramic fibers and tapes or ribbons, such as sapphire, are generally highly inflexible based on their thickness, and are also incompatible with the crystal orientation required by commercially valuable device layers, such as superconducting layers. Therefore, what is needed is a new low cost process that permits rapidly forming thin single-crystal, ceramic fibers and tapes or ribbons that include features that permit epitaxial device layers to be grown thereon to support a variety of new improved epitaxial devices. Thin single-crystal ceramic fibers and tapes or ribbons would provide flexibility to allow twisting, braiding or transposing relative to one another along a length of the article, such as for reducing AC losses.

SUMMARY OF THE INVENTION

In one embodiment of the invention an article comprises a single-crystal ceramic fiber, tape or ribbon having at least one facet along its length. At least one epitaxial layer of another material is on the facet. The epitaxial layer can have a single epitaxial orientation, such as evidenced, for example, by a phi-scan.

In embodiments of the invention the fiber, tape or ribbon is flexible. In one embodiment the fiber, tape or ribbon comprises is a metal oxide selected from the group consisting of $Al_2O_3$, MgO, Yttria-stabilized Zirconia (YSZ), $SrTiO_3$, $NdGaO_3$, $LaAlO_3$, $YAlO_3$ and LSAT (($La_{0.18}Sr_{0.82}$)($Al_{0.59}Ta_{0.41}$)$O_3$). The epitaxial layer can comprise an electrical, electronic, optical, magnetic, electromagnetic or electro-optical device layer. In this embodiment, at least one epitaxial buffer layer of an oxide, carbide, nitride or boride or combinations thereof can be interposed between the fiber, tape or ribbon and the epitaxial layer of another material. In the case of an oxide buffer layer, the oxide buffer layer can comprise $CeO_2$, a perovskite, a doped perovskite, a pyrochlores flourite; a doped flourite, a rock-salt oxide or a spinel. For example, perovskites can include $SrTiO_3$, $BaTiO_3$, $LaMnO_3$, $LaAlO_3$, doped perovskites include $(Sr,Nb)TiO_3$, $(Ba,Ca)TiO_3$, $(La,Sr)MnO_3$, $(La,Ca)MnO_3$; pyrochlores include $La_2Zr_2O_7$, $Ca_2Zr_2O_7$, $Gd_2Zr_2O_7$; doped pyrochlores include $(Y,La)_2Zr_2O_7$, $(La,Ca)_2Zr_2O_7$, $(La,Gd)_2Zr_2O_7$; flourites include $Y_2O_3$, $RE_2O_3$ (RE=rare-earth), YSZ; doped flourites include $(RE,Y)_2O_3$; rock-salt oxides include MgO or doped rock-salt oxides; and spinels include $MgAl_2O_4$. In the case of a nitride buffer, the nitride buffer layer can be TiN, GaN or AlN.

In one embodiment the device layer comprises a superconducting device layer, a solid state lighting device layer, or a photovoltaic device layer. In another embodiment the fiber, tape or ribbon can be sapphire or $Al_2O_3$-based. In this embodiment the facet can comprise an A-plane, R-plane, M-plane or a C-plane facet. In embodiments of the invention the facet is miscut from the exact A-plane, R-plane, M-plane or a C-plane an average along the length by ±1 to ±20 degrees, such as ±1 and ±10 degrees, or ±1 and ±5 degrees on average.

The fiber, tape or ribbon can be of structural quality and not of optical quality. In one embodiment the facet comprises two R-type facets, two A-type facets, two C-plane or two M-type facets, with the two facets being tilted about an axis parallel to the length by no more than 10 degrees on average, such as by no more than 5 degrees on average. The length of the article can be greater than 10 meters.

The cross-section of the fiber, tape or ribbon can be elliptical with flat facets on the two broad faces, rhombohedral with four flat facets, hexagonal with six flat facets, square with four flat facets, elliptical with flat facets on the two broad faces and additional minor facets on the curved sides, racetrack like with flat facets on the two broad faces and additional minor facets on the curved sides, or rectangular with four flat facets.

The epitaxial layer can comprise a semiconductor layer selected from the group consisting of bandgap semiconductors, indirect bandgap semiconductors, and multiband semiconductors. For example, the bandgap semiconductor can comprise Si, Ge, or GaP, the direct bandgap semiconductors comprise CdTe, CuInGaSe$_2$ (CIGS), GaAs, AlGaAs, GaInP or AlInP, and the multiband semiconductor comprises II-O-VI materials selected from the group consisting of $Zn_{1-y}Mn_yO_xTe_{1-x}$ or $GaN_xAs_{1-x-y}P_y$ thereof. In another embodiment the semiconductor layer is a compound semiconductor comprising elements from two or more different groups of the Periodic Table. The semiconductor layer can comprise an elemental semiconductor or alloys of elements within the same group or a compound semiconductor comprising elements of group IB, IIIA and VIA of the periodic table.

When the device layer comprises a superconducting layer, the article can further comprise a silver or silver alloy layer on the superconducting layer. The silver or silver alloy layer can cover only the facet area on said fiber, tape or ribbon. The superconducting article can further comprise a stabilizing layer on the silver or silver alloy layer, such as a layer of Cu or a Cu alloy. In one embodiment the silver or silver alloy layer and the stabilizing layer cover only the facet area on the fiber, tape or ribbon.

In another embodiment of the invention a crystalline article comprises a single-crystal ceramic fiber, tape or ribbon, said fiber, tape or ribbon having at least one crystallographic facet along its length. The crystal can be a hexagonal or rhombohedral crystal. The crystal can comprises a sapphire or aluminum oxide-based crystal and said facet comprise an R-plane, M-plane, A-plane or C-plane facet.

A method for forming ceramic fibers, tapes or ribbons having at least one crystallographically well-defined facet comprises the steps of providing a ceramic seed having an orientation and shape and containing a desired facet, securing the seed to a pulling mechanism, and growing the fiber, tape or ribbon from a melt, such as using a Stepanov technique or its variants. The method can comprise Edge-Defined Film-Fed Growth ("EFG") from the melt. At least one epitaxial layer is then formed on the fiber, tape or ribbon. The forming step can comprise chemical vapor deposition or metal-organic chemical vapor deposition, a chemical solution-based method, metalorganic deposition or polymeric precursor deposition, physical vapor deposition methods, electron-beam evaporation, thermal evaporation, pulsed electron deposition, or cathodic arc deposition.

The method can further comprise the step of twisting the fiber, tape or ribbon for reduction of AC losses, or transposing or braiding two or more of fibers, tapes or ribbons for reduction of AC losses.

The speed of extracting the fiber, tape or ribbon during the growing step can be greater than 1 m/hr, such as 3 to 10 m/hr. In one embodiment a plurality of fibers, tapes or ribbons are grown from said melt simultaneously from a die array.

BRIEF DESCRIPTION OF THE DRAWINGS

A fuller understanding of the present invention and the features and benefits thereof will be obtained upon review of the following detailed description together with the accompanying drawings, in which:

FIG. 7 shows a schematic of a EFG process adapted to growing a faceted tape or ribbon that can be used to practice embodiments of the invention.

FIG. 8 shows the unit cell of sapphire.

FIG. 9(a) shows omega-scans or rocking curves showing the out-of-plane texture of a C-plane sapphire substrate, and the epitaxial $CeO_2$ and YBCO layers deposited on it using pulsed laser ablation according to an embodiment of the invention. The full-width-half-maximum (FWHM) of the relevant peak is indicated for each layer.

FIG. 16($b$) shows a cross sectional depiction of an epitaxial article comprising a superconducting layer including an optional silver comprising layer and a stabilizing layer on the superconducting layer, according to another embodiment of the present invention.

FIGS. 18($a$) and ($b$) show two cross-sections of a fiber and tape or ribbon that can be used with embodiments of the invention. It shows a rectangular or a rhombohedral or a racetrack shaped cross-section. The large facets on the fiber and tape or ribbon correspond to R-planes.

FIG. 22 also shows that the two R-plane facets are tilted with respect to the fiber axis by about 4°.

FIG. 23($a$) shows ideal sapphire positions on the two reciprocal lattice planes that are close to being parallel to the fiber axis. FIG. 23($b$) shows the angle of tilt of the planes from the fiber axis. A 90° tilt in the chi angle shown means that this plane is parallel to the fiber axis, which in this case corresponds to (110).

FIG. 24 also shows that the two R-plane facets are tilted about 4° and 6° from the fiber axis respectively.

FIG. 33($a$) shows an example of how a faceted fiber with an epitaxial superconductor coating can be braided together for minimization of AC losses, according to an embodiment of the invention. FIG. 33($b$) shows an example of how a faceted fiber with an epitaxial superconductor coating can be braided together with multiple fibers for minimization of AC losses, according to an embodiment of the invention.

Figure 1A:
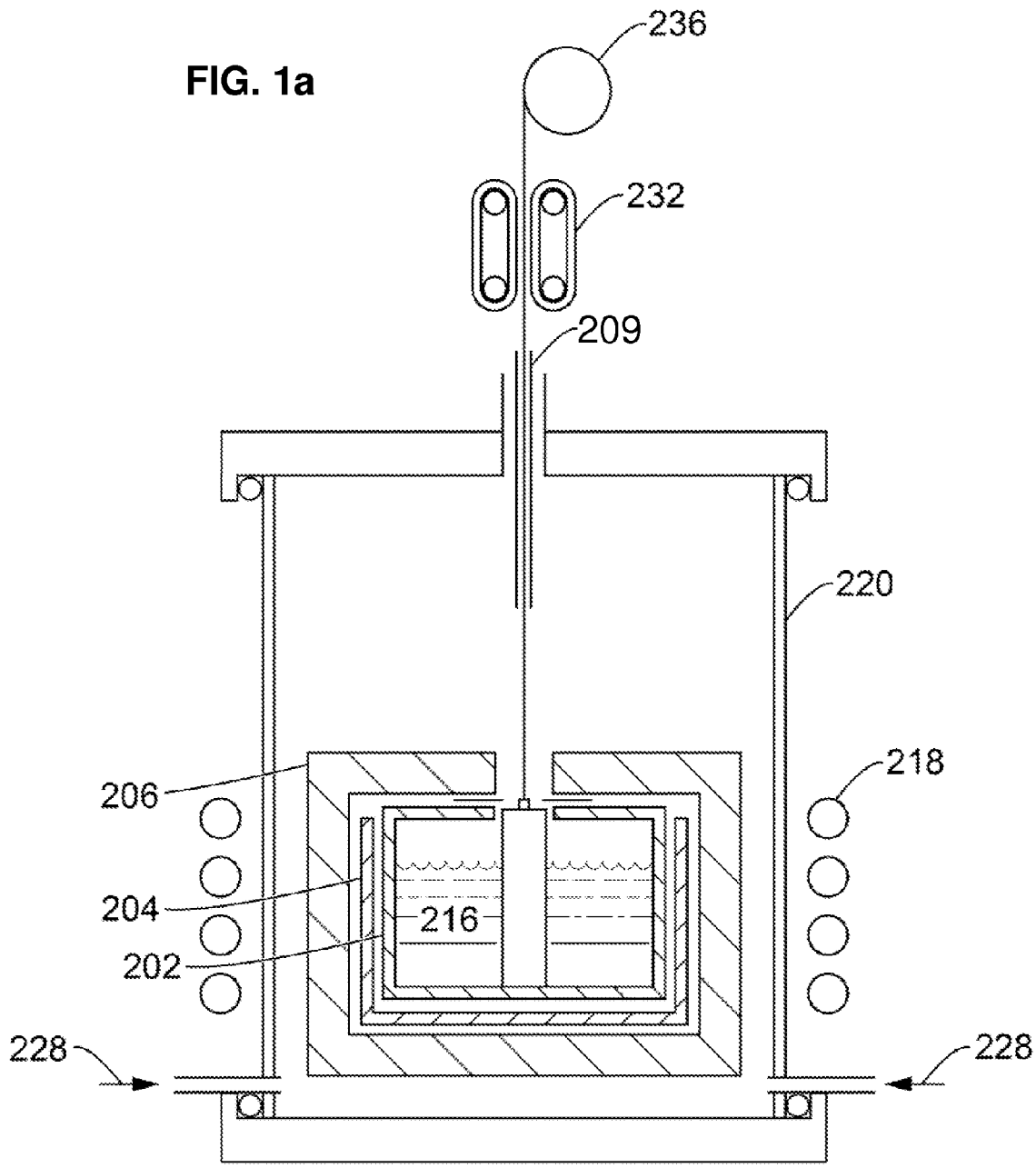
FIG. 1(a) shows a schematic diagram of an exemplary system for implementing an edge-defined film-fed growth (EFG) process that can be used to practice embodiments of the invention.

For a better understanding of the present invention, together with other and further objects, advantages and capabilities thereof, reference is made to the following disclosure and appended claims in connection with the above-described drawings.

DETAILED DESCRIPTION OF THE INVENTION

A crystalline article according to an embodiment of the present invention comprises a single-crystal, ceramic fiber, tape or ribbon. The fiber, tape or ribbon has at least one crystallographic facet along its length, which is generally at least one meter long. In contrast, conventional optical fibers are round, have no facets, and are amorphous.

As used herein, a single-crystal fiber, tape or ribbon is defined as a single grain having an orientation that is generally constant along the length of the fiber, tape or ribbon and can include a plurality of "very low angle" sub-grain boundaries. A "single grain" is distinct as compared to a polycrystalline fiber, tape or ribbon which includes a plurality of separate grains. The definition of a grain is a compositionally homogeneous region of material which has the same orientation in all directions. As used herein, the "low angle" sub-grain boundaries that may occur within the single-crystal fiber, tape or ribbon grain according to the present invention are primarily less than 2 degrees in misorientation in all directions and can be less than 1 degree in misorientation in all directions, such as 0, 0.1, 0.2, 0.3, 0.4, 0.5, 0.6, 0.7, 0.8, 0.9, 1.0, 1.1, 1.2, 1.3, 1.4, 1.5, 1.6, 1.7, 1.7, 1.8, 1.9, and 2.0 degrees. For a large grain, however, a series of sub-grain boundaries can make the total FWHM of the fiber somewhat larger. Such fibers can also contain a high density of dislocations. Such single-crystal fibers which contain a high density of defects are referred to as "structural" fibers. Compared to single-crystal "optical" fibers which have a very low-density of defects for use in telecommunications, structural fibers have little use in telecommunications since the optical attenuation is high for such fibers.

As used herein, a "facet" is defined as a planar surface in which the crystallographic orientation is the same, formed on a geometric (non-planar) shape, such as a fiber, tape or ribbon. The crystal orientation in the facet is more-or-less constant along the length of the fiber. Facets according to the present invention generally run along the length of the fiber, tape or ribbon, which as noted below are generally at least 1 meter, and can be up to 1,000 meters, or more in length. A planar surface as used above to define the "facet" has a flatness better than 5 degrees.

The single-crystal, structural, fibers or tapes are generally flexible due to the ability to form thin articles, generally being in the range of 0.05-0.3 mm thick. As defined herein, "flexible" refers to a fiber or tape that can be wound around a 12" mandrel without breaking. In some embodiments, the fiber and/or tape can be around a 3" mandrel or around a 1" mandrel.

Faceted single crystal articles according to embodiments of the present invention can be used to form laminate articles. In this embodiment, high quality epitaxial layers (having a single epitaxial orientation, that of the facet) of another material are formed on facet, such as evidencable by a phi-scan. The single-crystal epitaxial devices can comprise a range of electrical, electronic, optical, magnetic, electromagnetic and electro-optical applications which require single crystal-like device layers with few defects within the device layer.

Ceramics are defined herein as they are typically defined in the art as inorganic, nonmetallic (referring to their electrical conductivity) materials. They are typically crystalline in nature and are compounds formed between metallic and non-metallic elements such as aluminum and oxygen (alumina—$Al_2O_3$), magnesium and oxygen (magnesium oxide—MgO), and silicon and nitrogen (silicon nitride—$Si_3N_4$), silicon and carbon (silicon carbide—SiC). As defined herein, a "fiber" refers to a generally elongated article, wherein the length of then article is at least 10 times, and generally at least 100 times, the diameter (or average cross-sectional dimension) or the width and thickness of the article. Fibers according to this invention can be made in long lengths of many meters, and in some cases approaching 100 meters or 1,000 meters, or more. As defined herein, a "tape" or "ribbon" refers to a generally elongated article, wherein the length of then article is at least 10 times, and generally at least 100 times, the thickness of the article. Tapes or ribbons can be wide in the width direction ranging from 100 microns to about 0.25 meters in width. Tapes or ribbons according to embodiments the invention can be made in long lengths of many meters, and in some cases approaching 100 meters or 1,000 meters, or more.

An "Optical fiber" or "Fiber optics" refers to the medium and the technology associated with the transmission of information as light impulses along a glass or plastic wire or fiber. Fiber optic wire carries much more information as compared to conventional copper wire and is far less subject to electromagnetic interference. An "Optical fiber" can also be defined as a filament of transparent dielectric material, usually glass or plastic, and usually circular in cross section, that guides light. Glass optical fibers are almost always made from silica, but some other materials, such as fluorozirconate, fluoroaluminate, and chalcogenide glasses, are used for longer-wavelength infrared applications. Plastic optical fiber (POF) is commonly step-index multimode fiber, with core diameter of 1 mm or larger. POF typically has much higher attenuation than glass fiber (that is, the amplitude of the signal in it decreases faster), 1 dB/m or higher, and this high attenuation limits the range of POF-based systems. All glass and plastic based optical fibers are amorphous in nature.

Over short distances, such as networking within a building, fiber saves space in cable ducts because a single fiber can carry much more data than a single electrical cable. Fiber is also immune to electrical interference, which prevents crosstalk between signals in different cables and pickup of environmental noise. Because they are non-electrical, fiber cables can be used in environments where explosive fumes are present, without danger of ignition. Typically, glass fibers are used in telecommunications applications, because of the lower optical attenuation of these fibers.

Crystalline fibers are regarded as an attractive alternative to glass fibers because most non-oxide crystalline materials can transmit longer wavelength radiation than glasses. The disadvantage is that crystalline fibers are difficult to fabricate. There are two types of crystalline fiber; single-crystal (SC) and polycrystalline (PC) fiber. The technique used to make PC fibers is generally hot extrusion. As a result, only the silver and thallium halides have the requisite physical properties such as ductility, low melting point, and independent slip systems to be successfully extruded into fiber. In the hot extrusion process, a single-crystal billet or preform is placed in a heated chamber and the fiber extruded to net shape through a diamond or tungsten carbide die at a temperature equal to about one half the melting point. Meter-long lengths of SC fibers have been made from only a small number of crystalline materials. Initially some SC fibers were grown by zone-refining methods from the same metal halides used to extrude PC fibers. The idea was that removal of the grain boundaries in the PC fibers would improve the optical properties of the fiber. This did not occur so most of the crystalline materials chosen today for SC fiber fabrication have been oxides. Oxide materials like $Al_2O_3$ (sapphire) have the advantage over halides of high melting points, chemical inertness, and may be conveniently melted and grown in air. Currently, sapphire is the most popular SC optical fiber. These fibers are round and have a circular cross-section. Also, because a very low density of defects is needed to ensure the "optical" quality needed for the telecommunications, the maximum growth rates for such fibers is quite low.

A typical ceramic material which is widely used as a substrate for many current applications is sapphire or $Al_2O_3$. Sapphire is an anisotropic, hexagonal/rhombohedral single crystal form of aluminum oxide ($Al_2O_3$). Sapphire is currently a common substrate for depositing a high quality epitaxial layers, such as YBa$_2$Cu$_3$O$_{7-\delta}$ (YBCO) films using an interposed buffer layer, such as CeO$_2$. Sapphire is also a substrate of choice for solid-state lighting applications. There are several unique methods for growth of sapphire and other ceramic materials which have, with varying levels of resultant quality, size, and cost. Typically, growth from the melt is to fabricate large single crystals of ceramic materials and these include the Czochralski, Bridgman-Stockbarger, and Verneuil methods. All have in common the characteristics that a material of approximately the correct composition is melted congruently, i.e., the same crystalline phase is maintained before and after melting. The melt is then solidified in a carefully controlled fashion to cause the formation of a single crystal. In most crystal growth experiments, this solidification is accomplished using a well oriented seed material of the same crystal composition. A thorough review of single-crystal growth techniques is provided in Crystal Growth Technology, edited by H. J. Scheel and T. Fukuda, 2003 John Wiley & Sons, Ltd. ISBN: 0-471-49059-8. Typically methods such as Czochralski allow the formation of very high quality crystals such as sapphire or Si, but yield a rod like "blob" of crystal called a boule, which requires extensive machining to achieve a useable substrate.

Growth of shaped crystals and material structures, to form a melt column of a defined shape with the aid of a special shaper, and to subsequently crystallize the melt column outside the vessel walls for making shaped single crystals from the melt is referred to as the Stepanov method. A review of the of shaped crystal growth of sapphire for example is given by Peter I. Antonov and Vladimir N. Kurlov, "A Review of Developments in Shaped Crystal Growth of Sapphire by the Stepanov and Related Techniques," in Progress in Crystal Growth and Characterization of Materials, vol. 44, pgs 63-122, 2002. Antonov et al. is incorporated by reference herein. The most common variations of the Stepanov method is the Edge-defined Film-fed Growth (EFG) which has gained considerable attention. The EFG method or the variations of the Stephanov methods allow the directed growth of shapes like rods, ribbon, or even tubes. The EFG method is disclosed in a number of patents and papers, for example Bliss et al. U.S. Pat. No. 5,543,630; Pollock, J. T. A., "Filamentary Sapphire—Part 1: Growth and Microstructural Characterization," Journal of Material Science 7 (1972) 631-648; Pollock J. T. A., "Filamentary sapphire—Part 3: The growth of void-free sapphire filament at rates up to 3.0 cm/min," Journal of Material Science 7 (1972) 631-648; P. Rudolph and T. Fukuda, "Fiber Crystal Growth From the Melt," Crystal Research Technology, vol. 34, pages 3-40, 1999; V. N. Kurlov, S. N. Rossolenko and S. V. Belenko, "Growth of Sapphire Core-doped Fibers," Journal of Crystal Growth, vol. 191, pages 520-524, 1998; and Javier LLorca and Victor M. Orera, "Directionally solidified eutectic ceramic oxides," Progress in Materials Science, vol. 51 pages 711-809, 2006; However there are many limitations to what has been done in the past.

Other methods that can be used to grow single-crystal fibers of ceramic materials are micro float-zone methods such as the laser heated pedestal growth (LHPG) method (see for example, R. S. Feigelson: J. Crystal Growth 79 (1986) 669). In such methods, typically the growth speeds cannot be too large, else a breakdown in the growth of the fiber occurs. High speeds of 3 cm/min can be however attained with pulling techniques from a shaper die such as the Stepanov methods. The EFG method involves the contacting of a seed crystal with liquid Al$_2$O$_3$ where the liquid is carried to the growing crystal by capillary action as the growing crystal is drawn from a die generally vertically (although complex shapes can be generated by deviations in the drawing path as disclosed in V. N. Kurlov and F, Theodore *Cryst. Res Technol.* 34 (1999) 3, 293-300). The quality of the sapphire structure depends on a number of factors such as the thermal properties of the die material, the uniformity of the heating, and the draw rate of the single crystal alumina. This technique permits the preparation of very long fibers of sapphire where the fibers have a high tensile strength.

Figure 1B:
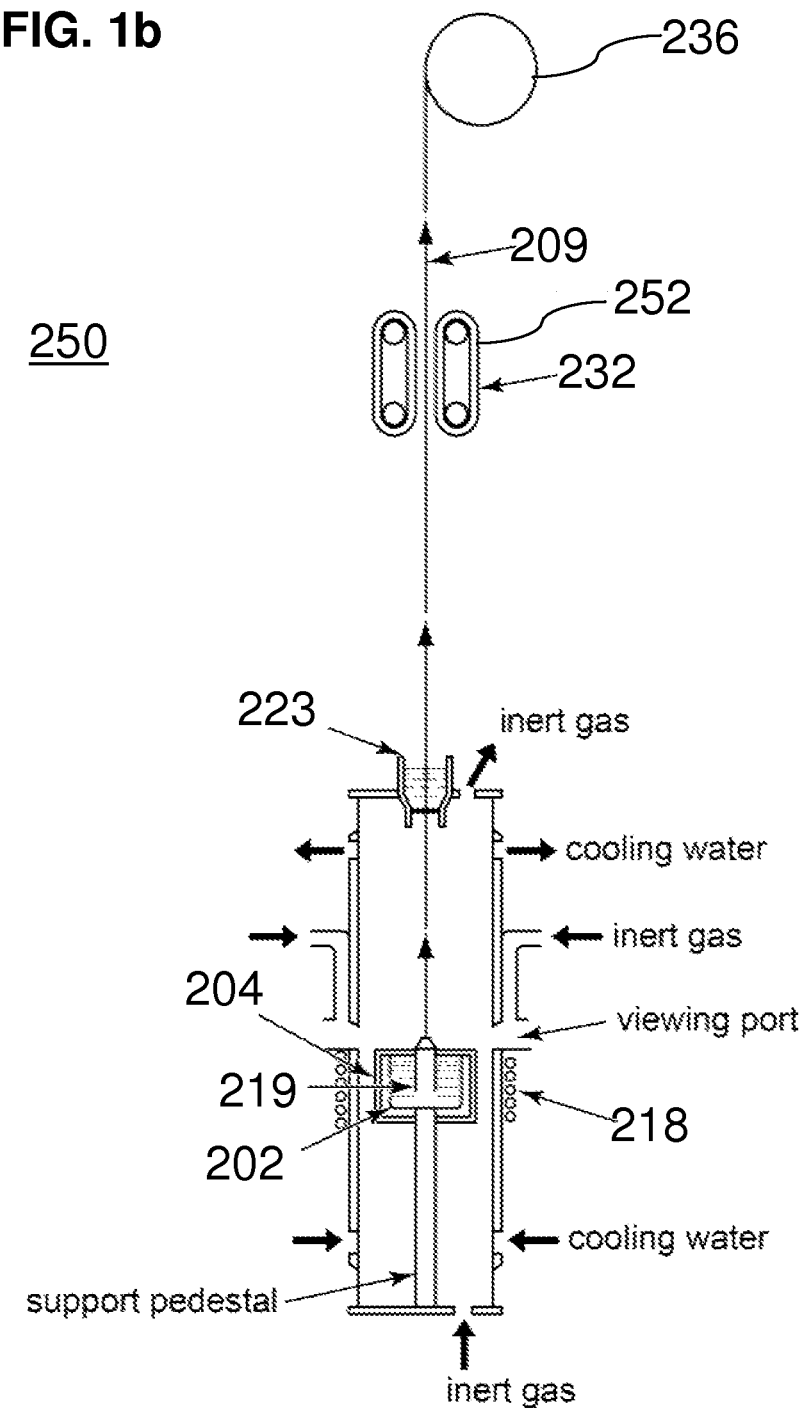
FIG. 1(b) shows a schematic diagram of another exemplary system for implementing an edge-defined film-fed growth (EFG) process that can be used to practice embodiments of the invention

A EFG fiber-growth system 200 is shown schematically in FIG. 1(*a*) that can be used to practice embodiments of the invention. The EFG technique allows the growth of a variety of cross-sectional shapes by making use of a shaped die. The liquid pool from which the crystal is withdrawn is formed on the top surface of the shaped die. The pool is fed by capillaries in the die which extend down into a molten reservoir. The edge-definition, which is the most important part of the method is maintained by the geometry of the top of the die and the fulfillment of a contact angle requirement between the liquid and the die material. This pool is continuously fed by capillary action from the melt held in the Mo or W crucible 202. Fiber 209 is continuously extracted from a melt through a die. A tungsten or molybdenum crucible 202 is surrounded by a carbon or graphite susceptor 204, within a rigid insulation layer 206. A die-tip array potentially with multiple tips, rests on the die body. The array's tips are fed by a liquid 216, such as liquid sapphire, rising by capillary action up a slot in the middle of the die body. The hot zone, heated by an induction coil 218, is surrounded by a quartz chamber 220 with water-cooled end caps. High-purity argon flows through an inlet 228 in the bottom of the chamber and out of a common outlet at the top of the chamber. Above the chamber is an endless-belt puller 232 which controls the motion of the sapphire fiber. Instead of this device, a winding roll capable of applying a small tension to the fiber could be used. The finished fiber is spooled onto a spooling device 236. The die-tip arrays are generally fabricated from tungsten or molybdenum. A feed hole is drilled down the center of each tip. A large number of tips may be arranged in a line on a single array.

FIG. 1(*b*) shows a schematic diagram of another exemplary system 250 for implementing an edge-defined film-fed growth (EFG) process that can be used to practice embodiments of the invention. System 250 is an adaptation of an EFG system disclosed in Pollock, J. of Mat. Sci., 7 (1972) 631-648. Between the orifice 219 and the belt puller 232 is located a small-necked down container pipe 223 containing a liquid, either paraffin, starch, or epoxy, and through which the filament passes. This liquid "bearing" has several functions including that of a coating device and as a sealant protecting the furnace atmosphere from outside contamination and most importantly its function of dampening fiber motion as a result of thermal convective currents within the furnace.

Sapphire (or other) fibers can be propagated from sapphire (or other) seeds which are prepared and fastened to a die tip. In the case of sapphire, to initiate growth, the sapphire crystal is touched to the top surface of a hot, wetted die tip where a portion of the seed crystal melts onto the tip adhering it to the tip. The seed is then drawn steadily upwards. The cross section of the growing fiber is the same shape as the top of the die tip, where liquid sapphire continuously crystallizes onto the end of the withdrawing crystal. The liquid at the die tip is replenished from the crucible by capillary action.

At steady state, free surface capillarity replenishes with additional liquid alumina, whereas conduction, convection, and radiation heat losses dictate the liquid-solid interface location above the die tip. The crystallographic orientation of the sapphire fiber is obtained by starting the growth with a seed of the desired orientation. EFG fiber growth is known to be dominated by the physics of fluid flow and heat transfer within the small meniscus region. As the fiber is pulled upward, molten alumina is drawn into the meniscus in response to a pressure drop associated with surface tension forces acting on the free surface. Meniscus shape is dictated by meniscus pressure, the shape of the die contact zone, and by the necessity of surface tension force balance at the liquid-solid interface triple point. Heat transfer in the vicinity of the meniscus is complicated and all major modes of thermal transport are operative.

Figure 2:
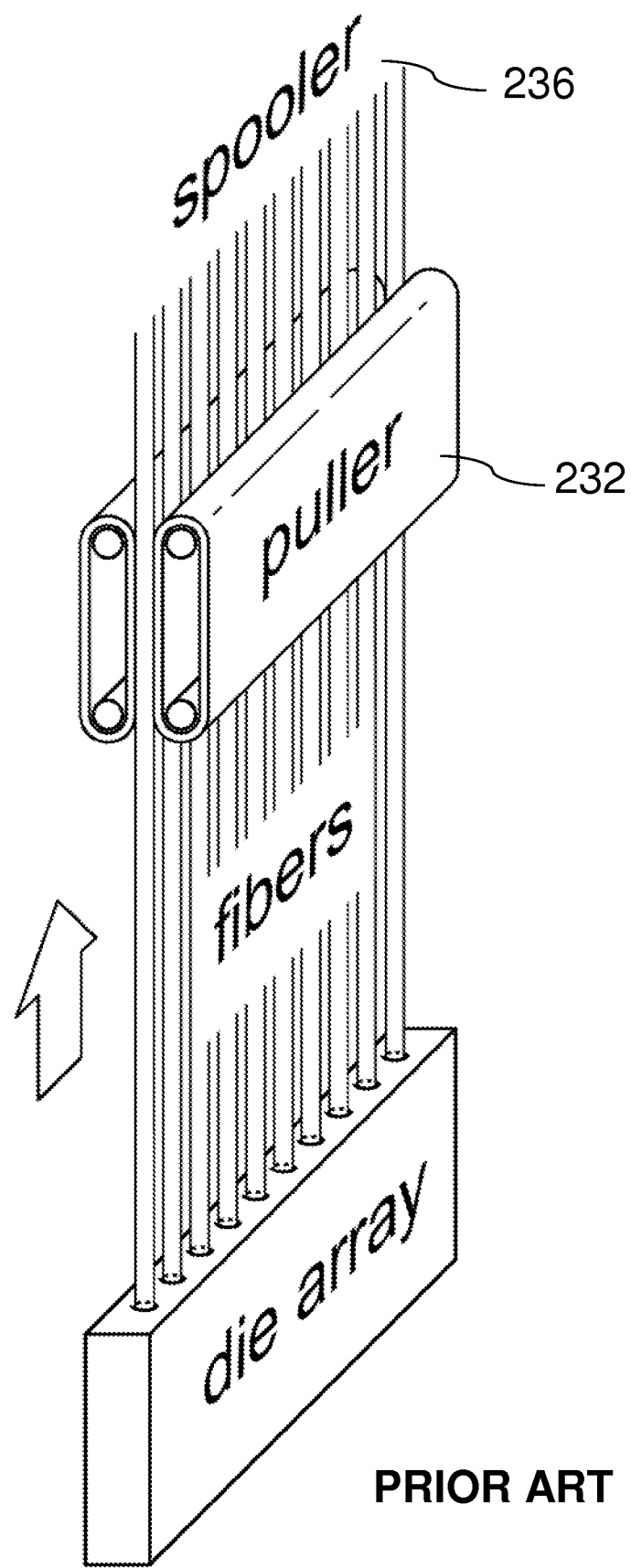
FIG. 2 shows a die array from which multiple fibers can be extracted in series using endless belt pullers and a spooler, according to an embodiment of the invention.
Figure 3:
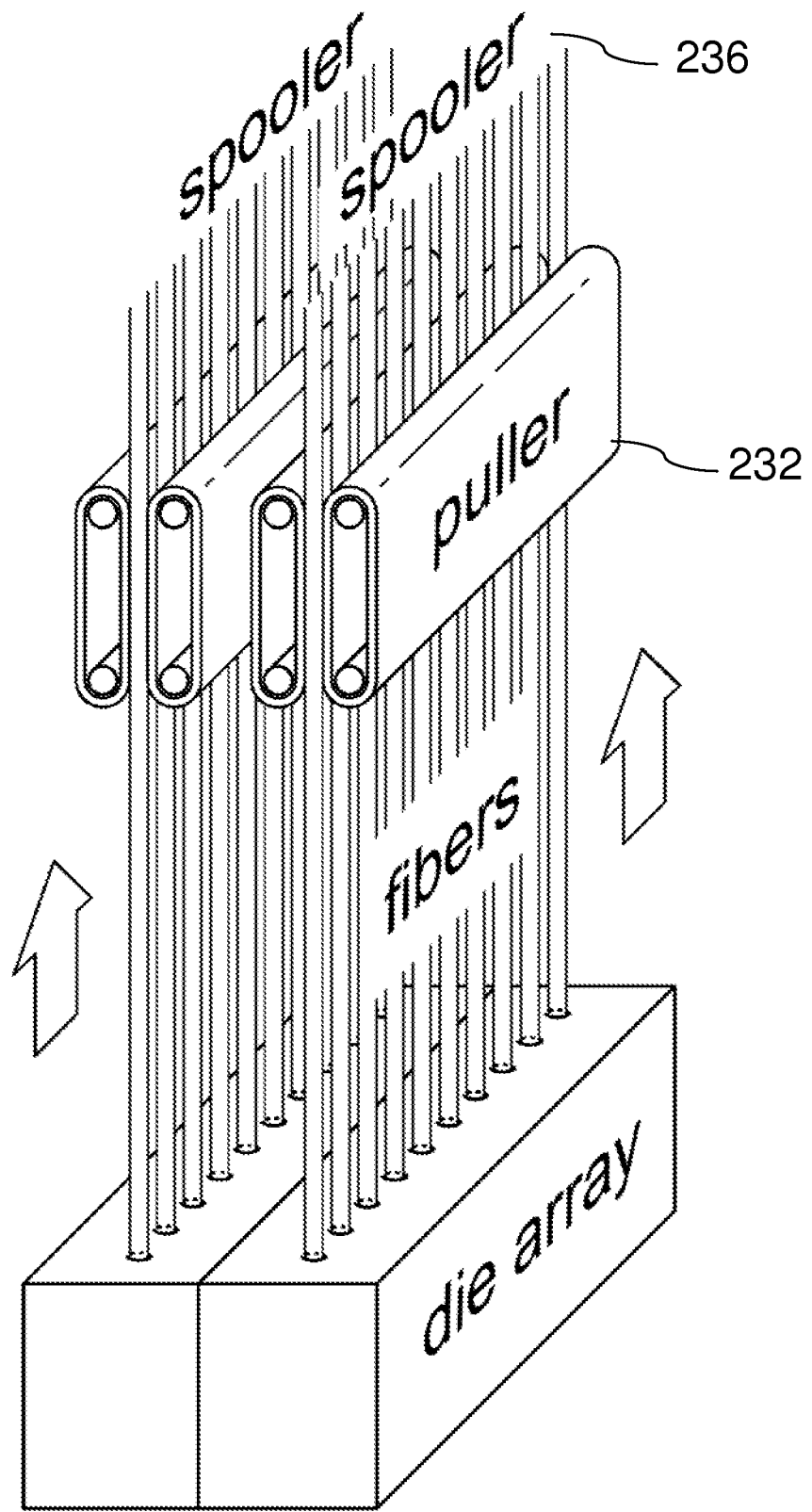
FIG. 3 shows that two die arrays, similar to the one shown in FIG. 2, can be attached in parallel. Many more dies can be attached in parallel. This way, using a single effective die-array many fibers and/or tapes can be continuously extracted from the melt.
Figure 4:
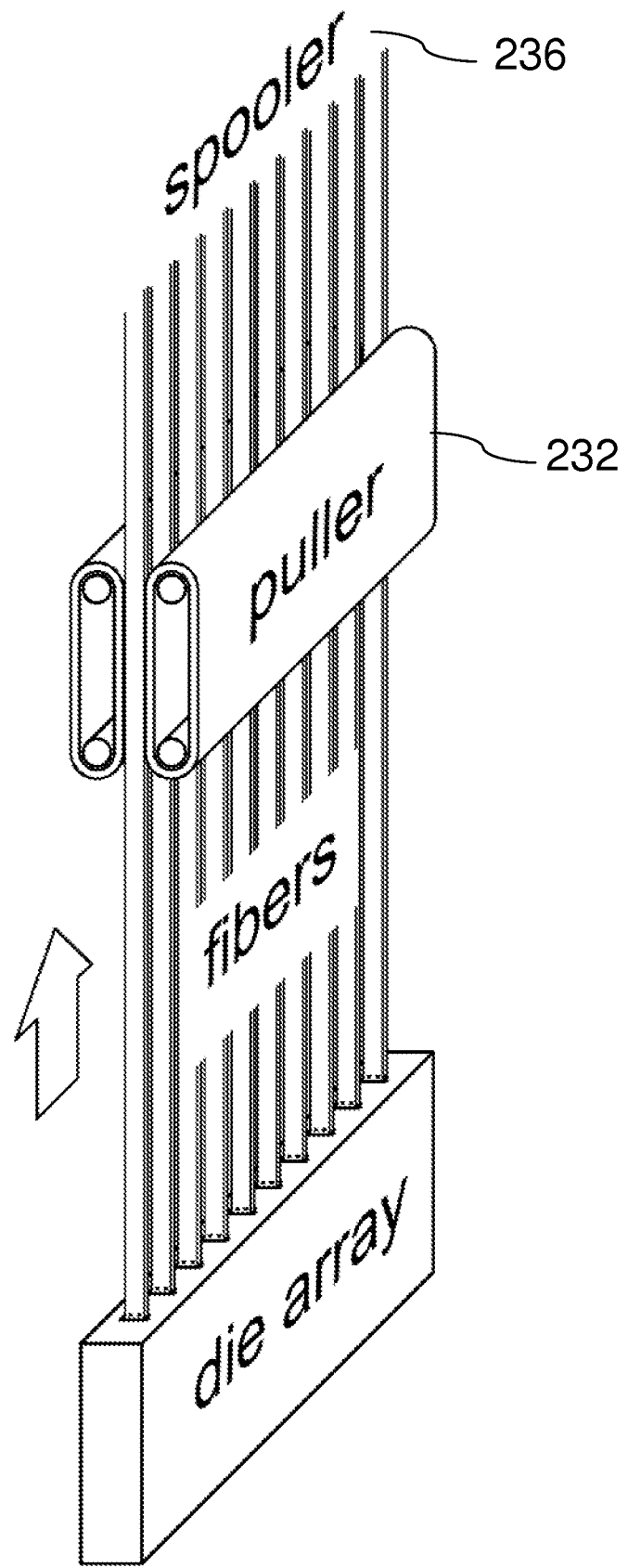
FIG. 4 shows a die array from which multiple, faceted fibers are being extracted in series using endless belt pullers and a spooler according to an embodiment of the invention.
Figure 5:
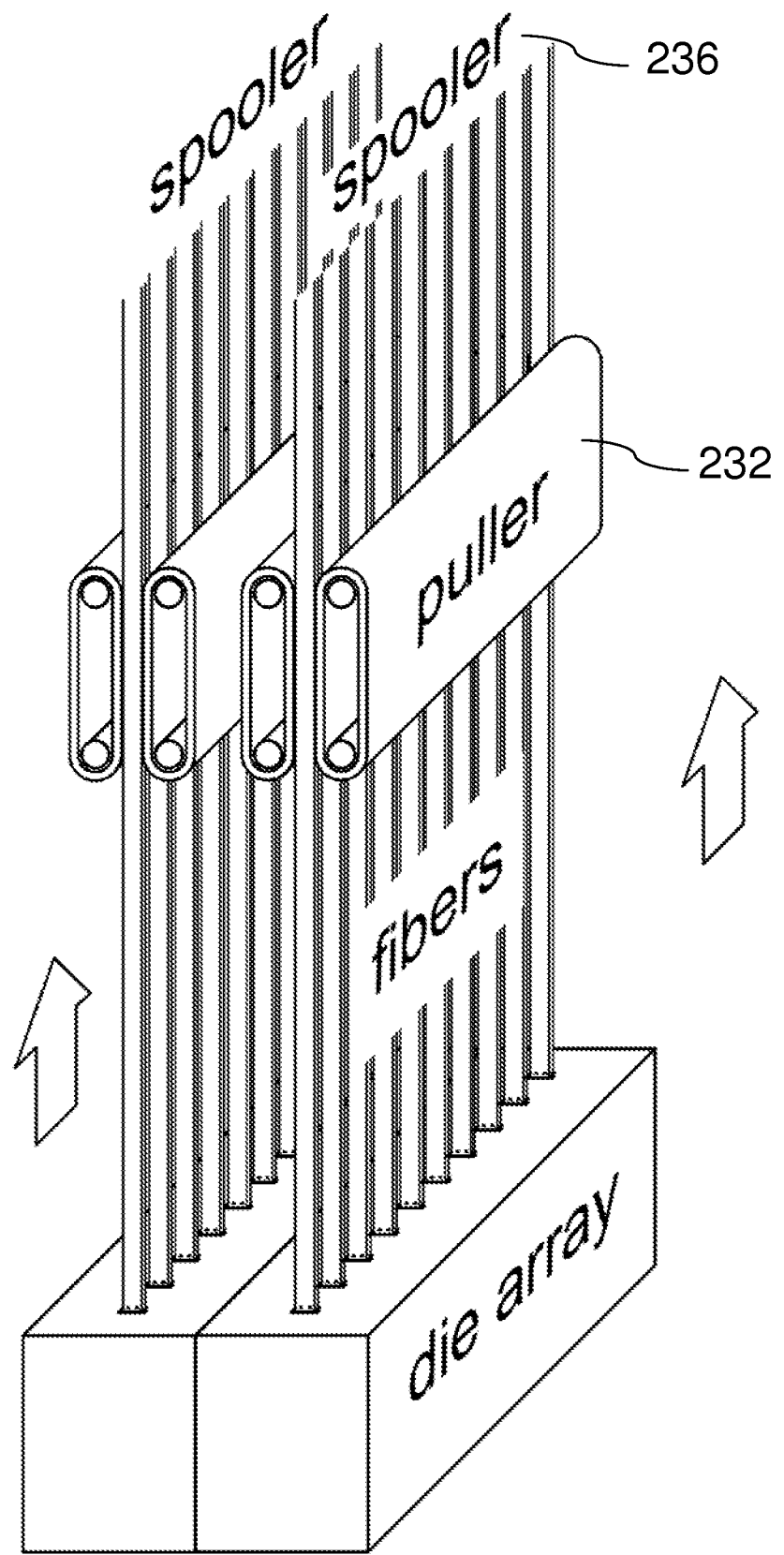
FIG. 5 shows that two die arrays, similar to the one shown in FIG. 4, can be attached in parallel. Many more dies can be attached in parallel. This way, using a single effective die-array many faceted, fibers and/or tapes can be continuously extracted from the melt.

FIG. 2 shows an adaptation of a fiber growth module from a NASA Contractor Report CR-195377 by Daniel G. Backman, Edward S. Russell, Daniel Y. Wei, Robert F. Irwin and Earle Rich, "High Productivity Fiber Growth Module for Single Crystal Oxide Fibers", August 1994, that permits multiple fibers to be grown from a single die that can be used to practice embodiments of the invention. A die array, a plurality of fibers along with belt puller 232 and spooling device 236 are shown. As with FIG. 2, a die array, a plurality of fibers, belt puller 232 and spooling device 236 are shown in FIGS. 3-5, which show alternate fiber growth arrangements. FIG. 3 shows that multiple dies can be arranged in series in a fiber growing system which can also be connected into a single die. FIG. 4 shows production of multiple faceted fibers in accordance with an embodiment of the present invention. FIG. 5 shows that multiple dies can be arranged in series in a fiber growing system which can also be connected into a single die to form many faceted fibers.

The orientation of the facet with respect to the die is not necessary to be exactly the same as some as shown in FIGS. 4 and 5. For example, all the fibers shown in FIGS. 4 and 5 can be rotated 90 about the length direction and still grow the same faceted fiber.

Figure 6:
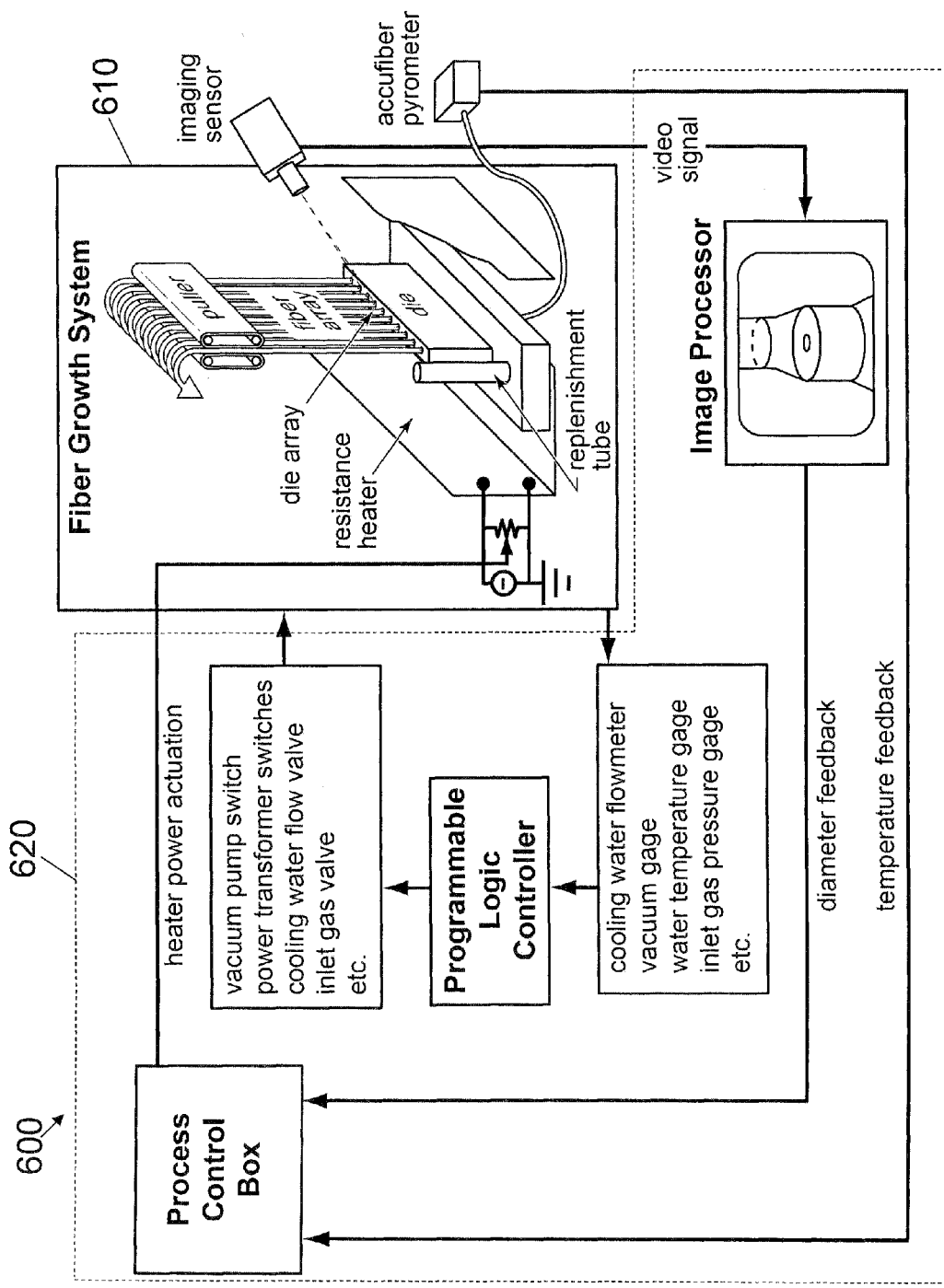
FIG. 6 shows a schematic of a fiber growth system including a process controller which controls the heater power actuation for the melt pool and other important process parameters based on active feedback from a temperature controller, image processors, etc, can be used to practice embodiments of the invention. Using a system like this, 100's if not 1000's of fibers and/or tapes and ribbons can be continuously extracted.

FIG. 6 is a schematic of an exemplary scaled-up system 600 for fabrication of multiple fibers in accordance with an embodiment of the present invention. System 600 includes a fiber growth system 610 and process control portion 620. This schematic is an adaptation from a similar process reported in NASA Contractor Report CR-195377 by Daniel G. Backman, Edward S. Russell, Daniel Y. Wei, Robert F. Irwin and Earle Rich, "High Productivity Fiber Growth Module for Single Crystal Oxide Fibers,", August 1994. The goal of the NASA project was to establish a modular fiber growth facility that would allow growth of 1,500 fibers simultaneously at high growth rates. The sapphire fibers disclosed in the NASA Contractor Report were essentially round with the fiber axis parallel to the c-axis of sapphire. The fibers did not have any facets. While such facetless fibers are unsuitable for the present invention, the NASA Contractor Report does establish that simultaneous growth of many fibers can be accomplished.

Multiple fibers can be continuously extracted from the melt and spooled onto a reel. An online temperature monitoring using the pyrometer shown at the solid-liquid interface as well as imaging of the solid-liquid interface and estimation of the diameter of the fiber can be done during growth of the fibers. The fiber growth system 610 is shown connected to an automated process control box which takes in all inputs and controls the power to keep the melt molten, controls all gages, pressures, vacuum etc. Using such a system, the simultaneous growth of multiple fibers can be accomplished to grow long fibers and tapes or ribbons. To grow a tape or ribbon, the schematic of the process shown in FIG. 7 can be used. In FIG. 7, an example is given for growing a faceted tape or ribbon, having at least two surfaces (the top and bottom surfaces of the tape) parallel to each other in the long direction.

As described above, once the faceted fibers and/or tapes or ribbons are fabricated, epitaxial devices can then be deposited on the fibers, tapes or ribbons. In particular, epitaxial layers can be grown on the flat facets of the fibers or tapes. For example, a sapphire or $Al_2O_3$ fiber with well-defined crystallographic facets is grown. Upon these facets, epitaxial $CeO_2$ or $SrTiO_3$ can be deposited via physical vapor deposition, chemical vapor deposition, chemical solution deposition, or other suitable method. Upon this epitaxial $CeO_2$ or $SrTiO_3$ layer, an epitaxial superconductor layer, such as corresponding to $YBa_2Cu_3O_x$, can be deposited using physical vapor deposition, chemical vapor deposition, chemical solution deposition, or other suitable method.

For the particular case of $Al_2O_3$ or sapphire, only certain crystallographic planes are generally of interest to the present invention. Sapphire has a rhombohedral structure, and is usually describes as a simpler hexagonal structure. The unit cell of sapphire is shown in FIG. 8. This structure shows the C-plane (0001), which is perpendicular to the C-axis, the A-plane (1120) which is parallel to the C-axis and the R-plane (1012) which is at an angle of 57.6° with the C-plane. Another plane of interest to embodiments of the present invention is the M-plane corresponding to (1010).

Typically, fibers obtained using the EFG method are grown parallel to the C-axis and have essentially a rounded cross-section and barely resolve or show any crystallographic facets. When the facets do begin to get resolved, six facets are favored in this orientation, all corresponding to the A-plane. Such fibers are not very suitable for growth of epitaxial layers since they have only a small area occupied by the facets. Only fibers or tapes with very well-defined facets can generally sustain epitaxial growth. Ideally, for a sapphire fiber in this orientation, the c-axis is aligned along the fiber direction, six, well-defined facets are desired. These facets in this case would correspond to the A-plane of sapphire. For a fiber or tape/ribbon made of sapphire, the desired facets on the surface for epitaxial growth of cubic oxides (such as for superconducting articles) are the R-plane and M-plane facets. This is because the R-plane and M-plane in sapphire have a pseudo cubic surface structure. A fiber with A-plane facets can also give a single orientation epitaxy of a cubic material such as $CeO_2$ under the correct growth conditions. For epitaxial deposition of hexagonal materials, fibers or tapes/ribbons with C-plane facets are desired.

As noted above, the present invention also includes the use of a structural quality, faceted, single crystal fiber and/or tape/ribbon grown at high speeds with epitaxial layers grown on the facet. For different device layers of interest, different crystallographic planes of sapphire are favored. For example, growing cubic materials on the surface of a C-plane facet, will yield 60 degree, high-angle grain boundaries everywhere, due to the 3-equivalent, epitaxial orientations possible when growing on a hexagonal surface or a cubic (111) surface. Therefore, such fibers with such facets are not suitable for growing single orientation, cubic epitaxial layers, such as for the high temperature superconducting (HTS) application.

Figure 9B:
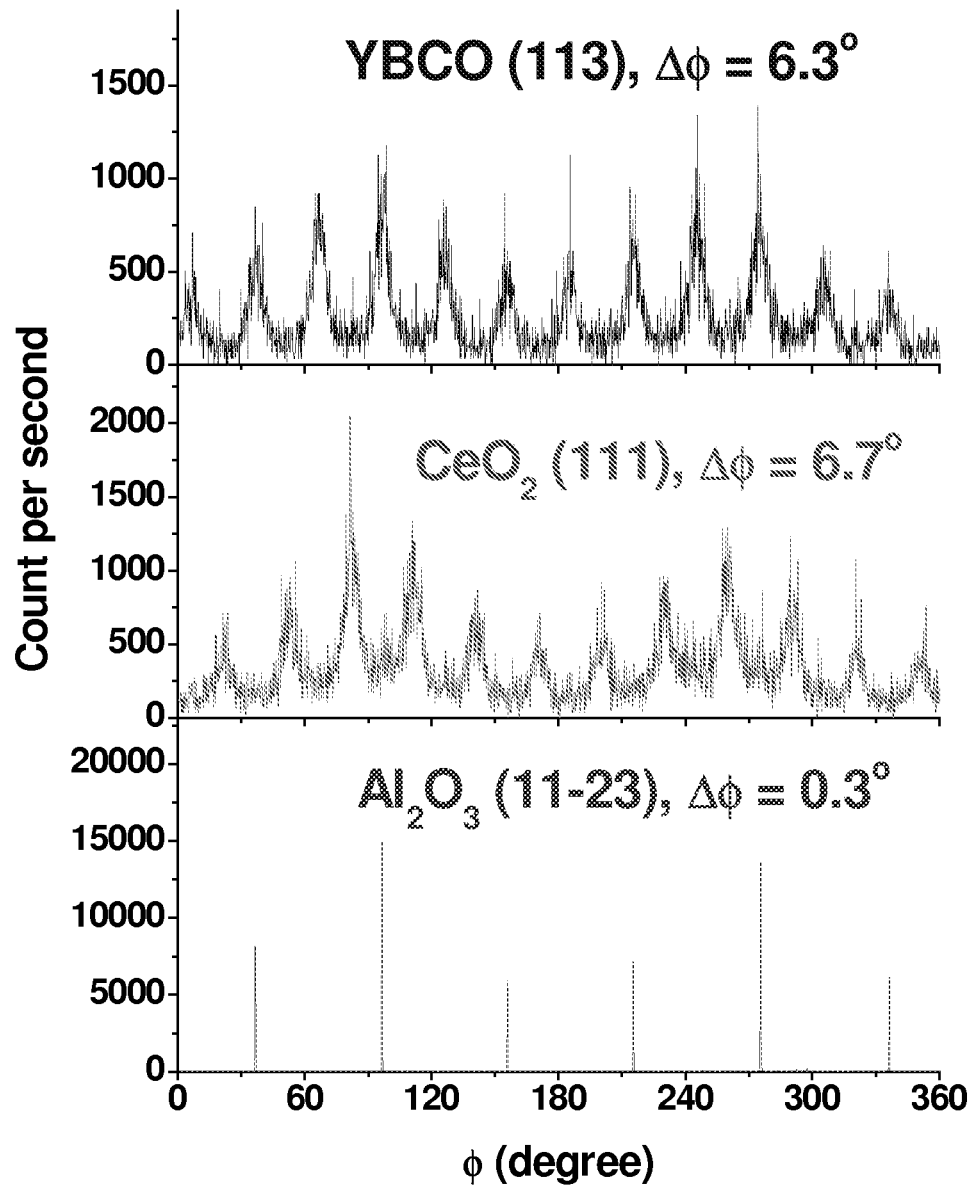
FIG. 9(b) shows the phi-scan or in-plane texture of the $CeO_2$ and YBCO layers deposited epitaxially on the C-plane sapphire substrate according to an embodiment of the invention. Three crystallographically equivalent epitaxial orientations of the cubic $CeO_2$ form on the C-plane of sapphire which is of hexagonal symmetry. The YBCO layer grown epitaxially on the $CeO_2$ layer also has three epitaxial orientations rotated by 60°.

FIG. 9(*a*) are omega scans and phi-scans of the faceted sapphire substrate according to the present invention as well as the epitaxially deposited layers of $CeO_2$ and $YBa_2Cu_3O_x$ (YBCO) layers formed by a process comprising by pulsed laser ablation onto the C-plane sapphire substrates according to the present invention. As is evident from the FIG. 9(*b*), three crystallographically equivalent epitaxial orientations form in both the $CeO_2$ and the YBCO layers resulting in many high-angle grain boundaries. For superconducting or HTS layers, ideally the most desired facet orientation on the fiber or tape is the R-orientation.

Figure 10:
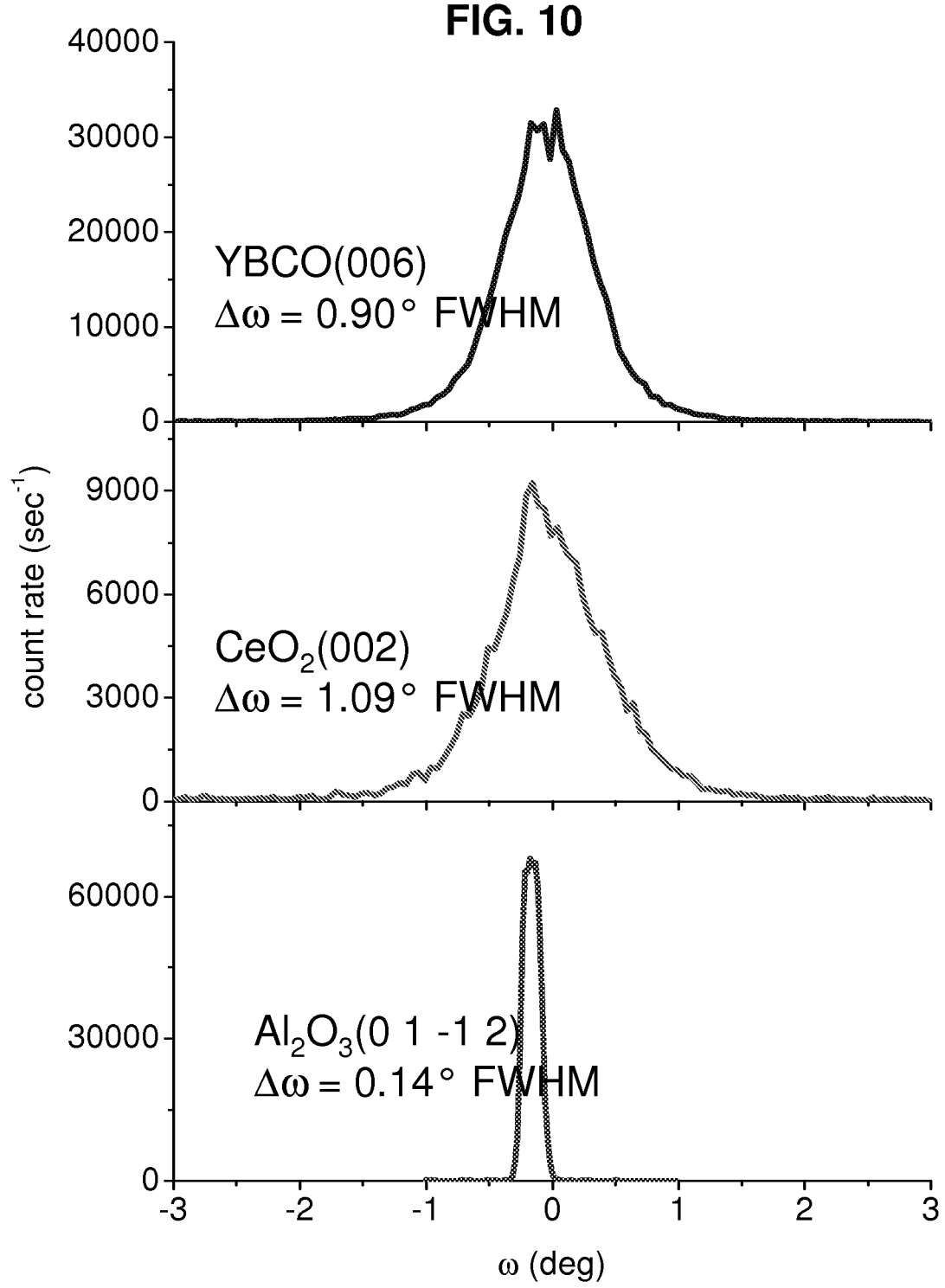
FIG. 10 shows omega-scans or rocking curves showing the out-of-plane texture of an R-plane sapphire substrate, and the epitaxial $CeO_2$ and YBCO layers deposited on it using pulsed laser ablation according to an embodiment of the invention. The full-width-half-maximum (FWHM) of the relevant peak is indicated for each layer.
Figure 11:
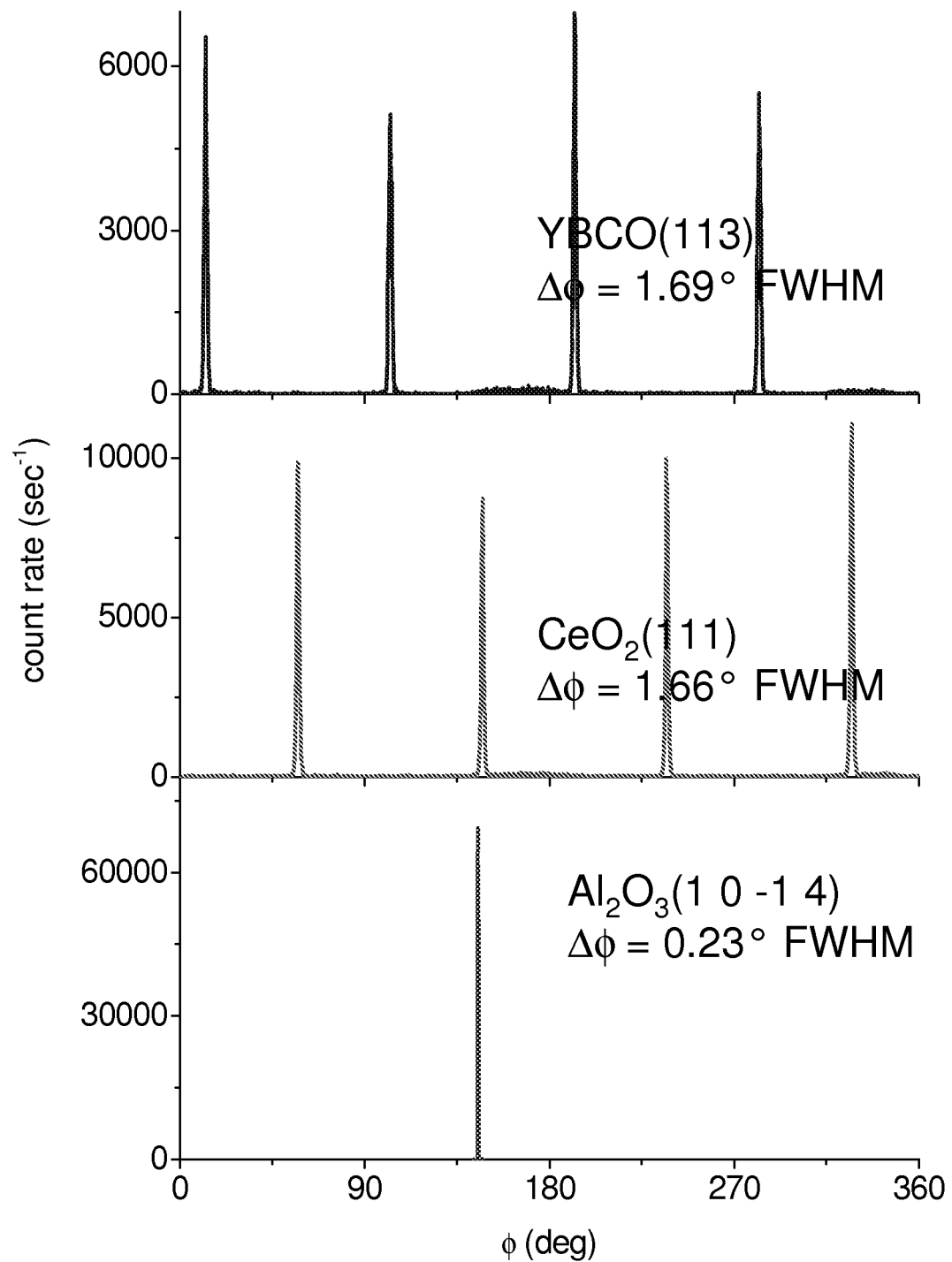
FIG. 11 shows the phi-scan or in-plane texture of the $CeO_2$ and YBCO layers deposited epitaxially on the R-plane sapphire substrate according to an embodiment of the invention. A single epitaxial orientation of the cubic $CeO_2$ form on the pseudo cubic, R-plane of sapphire. The YBCO layer grown epitaxially on the CeO$_2$ layer also has a single epitaxial orientation (the four peaks correspond to the same orientation).

FIG. 10 shows X-ray diffraction omega scans or rocking curves of an epitaxially grown layer of a YBCO superconductor with an intervening $CeO_2$ buffer layer on an R-plane sapphire substrate according to the present invention. This Fig. shows that the out-of-plane texture is good in both the $CeO_2$ and the YBCO layer. FIG. 11 shows phi-scans or the in-plane texture of a $CeO_2$ and YBCO film grown on the R-plane substrate according to the present invention. Good in-plane alignment is seen for the $CeO_2$ and YBCO layers.

Figure 12:
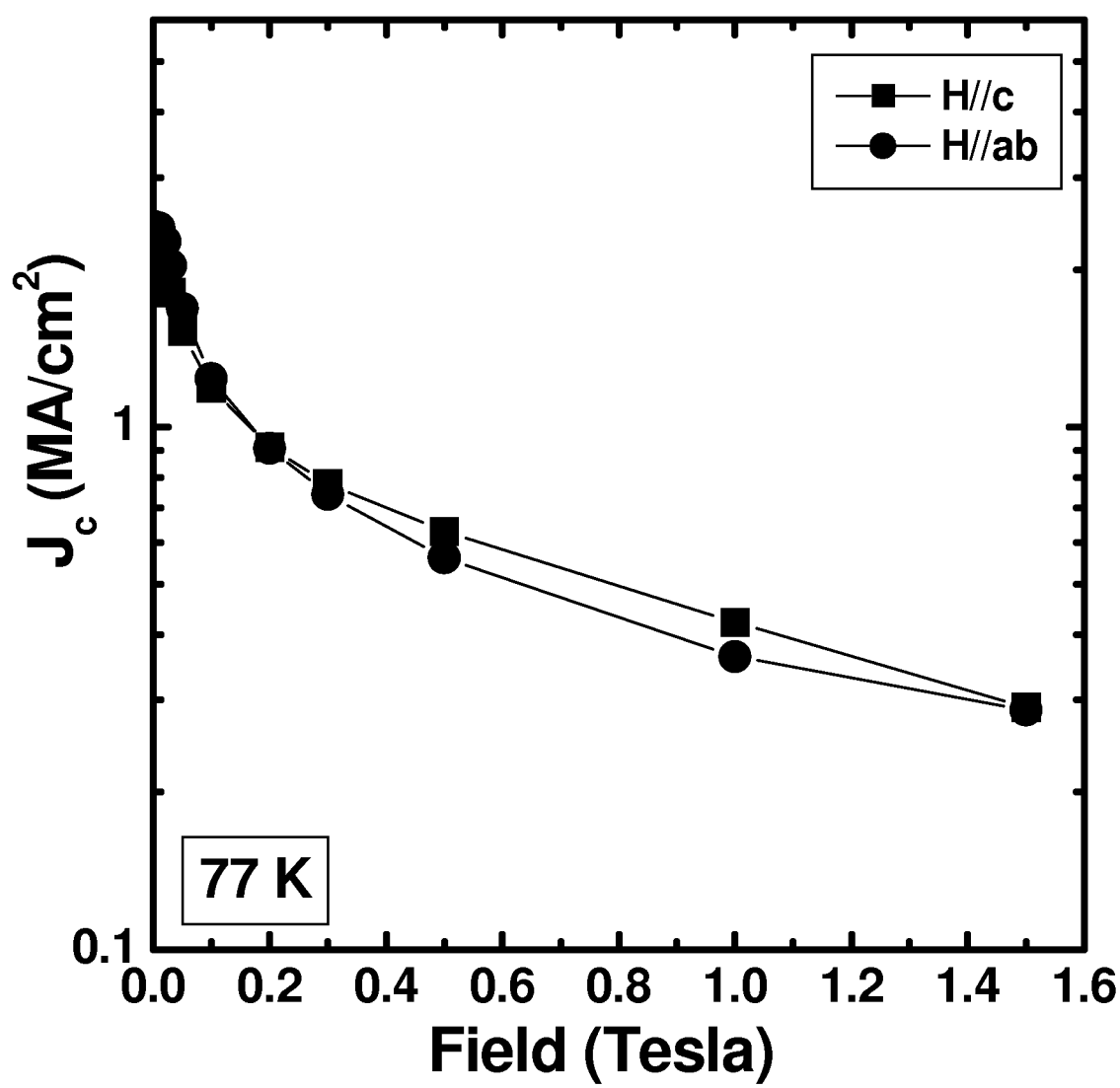
FIG. 12 shows the critical current density (J$_c$) at 77K of a YBCO superconductor layer on a R-plane faceted sapphire substrate according to an embodiment of the invention. Both the J$_c$ for the external magnetic field applied parallel and perpendicular to the substrate is shown. The self-field field J$_c$ is shown to be over 2 Million Amps per cm$^2$.
Figure 13:
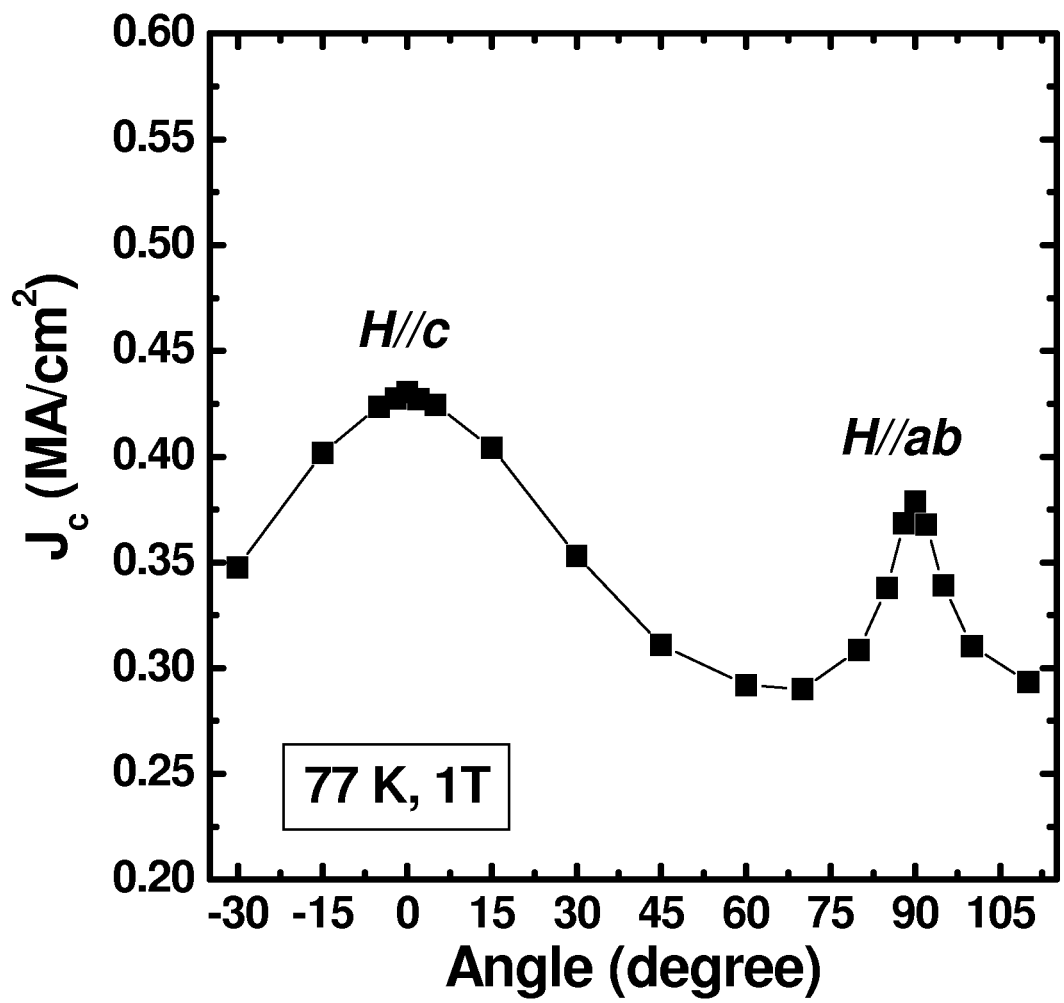
FIG. 13 shows the angular dependence of the critical current density (J$_c$) of the YBCO superconductor layer on the R-plane faceted sapphire substrate (with its Jc shown in FIG. 12) at 77K with an externally applied magnetic field of 1 T according to an embodiment of the invention. As can be seen very high J$_c$'s are seen with two prominent peaks.

FIGS. 12 and 13 show the critical current density, $J_c$, versus applied magnetic field as well as $J_c$ versus angle respectively, at 77K. The YBCO film on this sample was also doped with 1% $BaZrO_3$ by volume to enhance the pinning. The superconducting transport properties shown in FIG. 12 evidence a $J_c>1$ $MA/cm^2$ in self field and FIG. 13 a $J_c$ generally > about 0.3 $MA/cm^2$ at 1 T, as a function of angle (degree). The angle of the applied magnetic field is in a plane so that the magnetic field and current are always perpendicular to one another. This is also commonly referred to as the maximum Lorentz force configuration. Both FIGS. 12 and 13 thus confirm that high quality, epitaxial layers can be deposited a faceted sapphire substrate, in the case shown an R-plane faceted sapphire substrate.

In one embodiment of the present invention, a sapphire fiber is fabricated with R-plane facets followed by subsequent epitaxial growth of electrical, electronic, optical, magnetic, electromagnetic or electro-optical layers to make corresponding devices. In addition to the R-plane, M-plane, C-plane and A-plane sapphire substrates can be used to grow single orientation epitaxial buffer layers, such as $CeO_2$.

Figure 14:
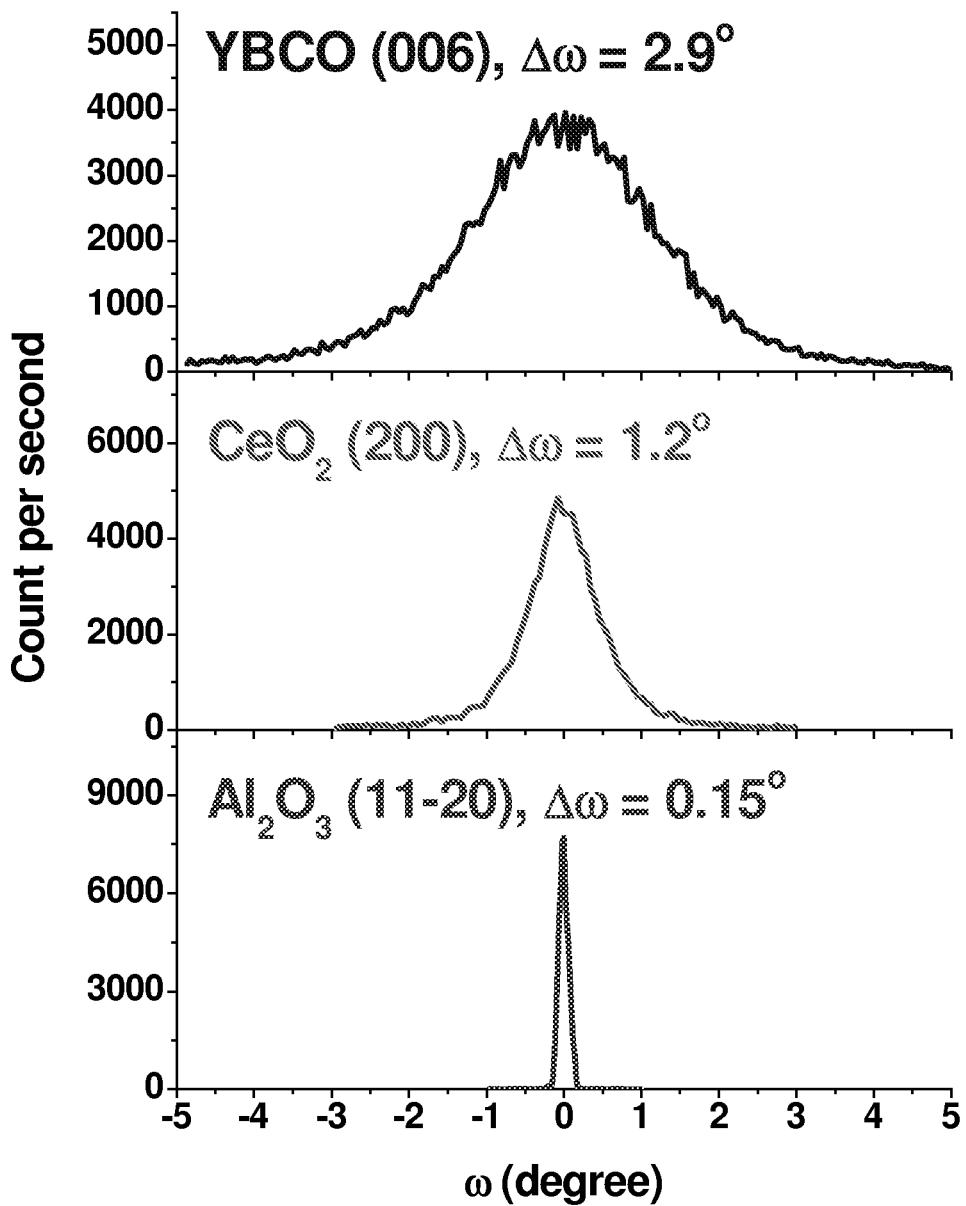
FIG. 14 shows omega-scans or rocking curves showing the out-of-plane texture of an A-plane faceted sapphire substrate, and the epitaxial CeO$_2$ and YBCO layers deposited on it using pulsed laser ablation, according to an embodiment of the invention. The full-width-half-maximum (FWHM) of the relevant peak is indicated for each layer.
Figure 15:
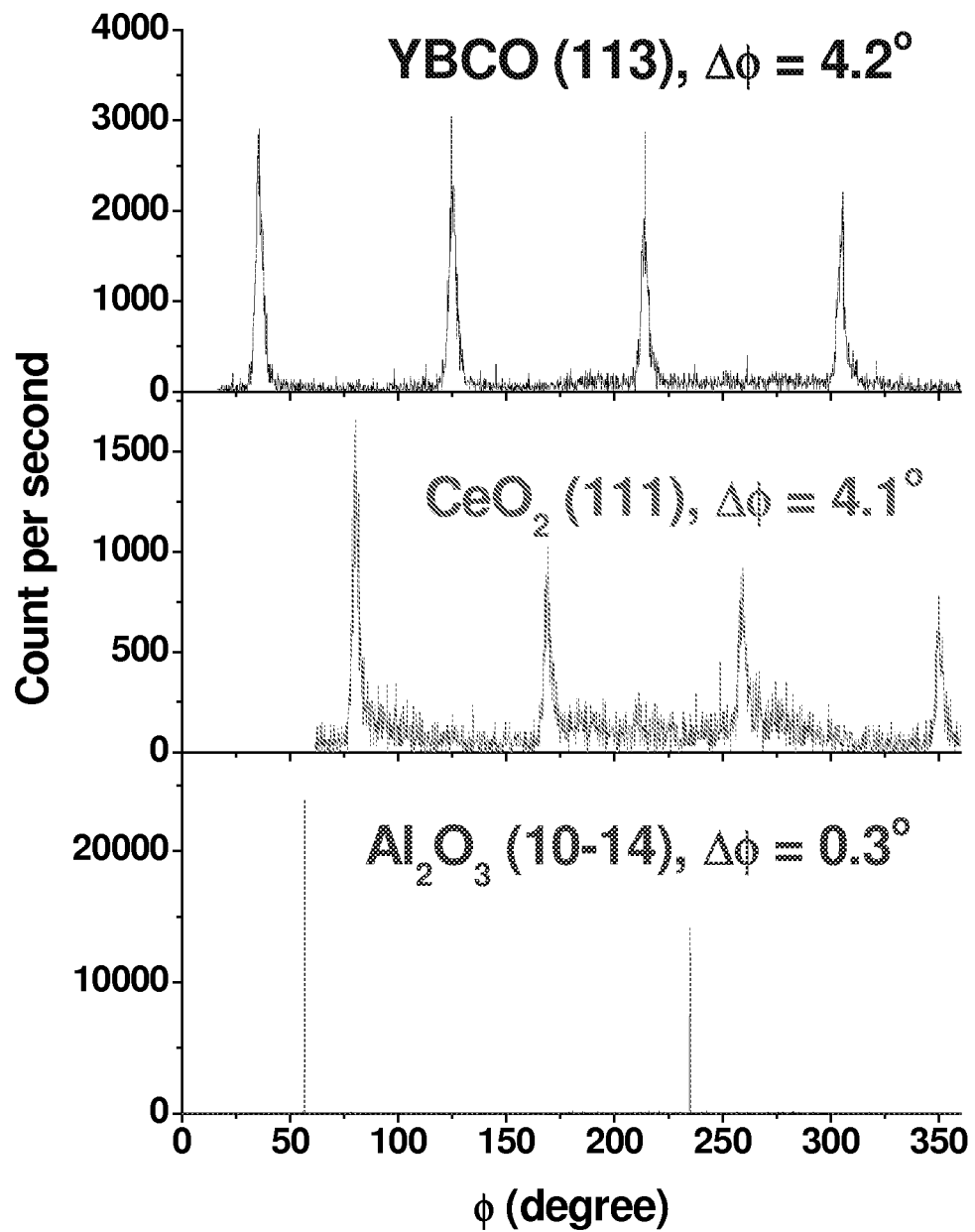
FIG. 15 shows the phi-scan or in-plane texture of the CeO$_2$ and YBCO layers deposited epitaxially on the A-plane faceted sapphire substrate according to an embodiment of the invention. A single epitaxial orientation of the cubic CeO$_2$ form on the A-plane of sapphire. The YBCO layer grown epitaxially on the CeO$_2$ layer also has a single epitaxial orientation (the four peaks correspond to the same orientation).

An example for growth of cubic oxides with a single epitaxial orientation is shown in FIGS. 14 and 15. In FIG. 14, X-ray diffraction omega scans indicating the out-of-plane texture are shown for $CeO_2$ and YBCO layers deposited epitaxially on A-plane sapphire substrates. In FIG. 15, X-ray diffraction phi scans indicating the in-plane texture are shown for $CeO_2$ and YBCO layers deposited epitaxially on A-plane sapphire substrates. Excellent in-plane epitaxy and orientation is observed as shown. In summary, single orientation, high-quality, epitaxial, cubic and pseudo-cubic materials were shown to be successfully deposited onto A-plane sapphire substrates. Similar results can be obtained for M-plane faceted sapphire substrates.

Instead of using $CeO_2$ as a buffer, typically MgO has been used as a buffer for YBCO on M-plane substrates. Epitaxial MgO layers have been shown possible on the R-plane, A-plane, M-plane and the C-plane of sapphire. See for example, P. A. Stampe, M. Bullock, W. P. Tucker and Robin J. Kennedy, "Growth of MgO thin films on M-, A-, C- and R-plane sapphire substrates by laser ablation," vol. 32, pages 1778-1787, 1999. For superconducting applications, it may be useful to deposit a perovskite layer such as $LaMnO_3$ or $SrTiO_3$ on the epitaxial MgO layer on sapphire for better lattice match to YBCO.

The sapphire fibers or tapes based on the present invention, may provide R-plane facets oriented nearly parallel to the fiber axis, generally within 10 degrees, such as 4 to 10 degrees, relative to the fiber axis. Structural fibers according to the present invention have been found to be suitable for growing some important cubic epitaxial layers thereon, such as high temperature superconducting (HTS) layers.

To grow R-plane faceted fibers according to the present invention the sapphire should be correctly oriented such that its R-planes are nearly parallel to the direction that the fiber is drawn. The initial seed can be cut out of a large piece of commercially available sapphire which has been oriented, such as assisted by X-ray crystallography. The R planes of a sapphire crystal are known to form a three-sided pyramid, with an 86° angle between the sides of the pyramid. The seed is cut so its axis lies along a corner of the pyramid. Thus, the seed has two R planes parallel to its axis. One plane is coincident with the broad face of the seed.

Propagating a fiber from a large seed generally involves three growth steps, described relative to system 200 shown in FIG. 1a. First, the seed (attached to a long, flat shaft, which can travel through the belt puller 232) is used to grow an initial fiber. Second, the puller is then placed as close to the tips as possible, and the initial fiber (removed from the seed) is drawn through the puller 232. The fiber resulting from this second operation is typically of good crystal orientation but poor straightness. Third, the puller 232 is raised higher, and a guide is inserted between the puller 232 and the tips. The fiber of the second step is threaded through the guide, and is used to grow a long, straight fiber, which serves as the seed for future runs. This fiber is of the correct crystal orientation, and is generally of adequate straightness.

Although the fiber material is described above as being sapphire, alternatively, doped sapphire can be used. Materials other the sapphire can also be used, such as MgO, $SrTiO_3$, etc. Exemplary sapphire dopants include such as but not limited to chromium, titanium, iron, erbium, neodymium, praseodymium, europium, thulium, ytterbium and cerium. and Magnesium. Besides sapphire, faceted single-crystal fibers, tapes and ribbons of MgO, $SrTiO_3$ etc are desired for certain applications.

As noted above, the resulting faceted structural fibers according to the present invention can then be coated and/or reacted by a variety of techniques to produce chemically and structurally compatible, epitaxial textured barrier layers and/or alloys to form a variety of devices. An epitaxial layer of another material can then be grown on the faceted fiber (or tape or ribbon) substrate, or on a barrier layer, using any of a variety of known techniques. Known methods include chemical solution deposition methods, and chemical vapor deposition methods, including conventional CVD and MOCVD, vapor deposition methods such as pulsed laser ablation, sputtering and evaporation, liquid phase epitaxy techniques as well as hybrid LPE techniques which combine LPE with another process such as sputtering or evaporation. In the case of superconducting devices, $CeO_2$ or other buffer layers known in the art, such as $SrTiO_3$, $LaMnO_3$, can be deposited followed by deposition of a HTS film, such as a $YBa_2Cu_3O_{7-\delta}$ (YBCO) film. The texture from the faceted fiber substrate or the barrier layer is then induced in the epitaxial layer. Embodiments of the invention thereby enable depositing biaxially aligned devices having sharp biaxial textures without the need for expensive processing to obtain the texture, such as IBAD.

Epitaxial layers can be deposited by either an in-situ process or an ex-situ process. In an in-situ process, the epitaxial layers are deposited on the facet on the fiber or tape directly, such as using certain physical vapor deposition or chemical vapor deposition methods. In these cases the deposition is typically conducted at high substrate temperatures. Alternatively, epitaxial layers including device layers can be deposited using the ex-situ process. In an ex-situ process, a precursor film the desired layer is first deposited on the fiber or tape surface. This precursor layer can be amorphous, microcrystalline or crystalline. Upon subsequent heating under controlled conditions of temperature and surrounding gaseous atmosphere, epitaxial orientation is obtained. This occurs via full crystallization in amorphous or microcrystalline films and by recrystallization in crystalline films. For example, a chemical solution deposition method can be used to coat via dip-coating a precursor of $CeO_2$ on a sapphire fiber with an R-plane facet, followed by subsequent heat-treatment to form an epitaxial $CeO_2$ layer. This is then followed by a precursor coating of the superconductor layer on the formed $CeO_2$ layer, followed by subsequent heat-treatment to form an epitaxial superconductor layer.

As noted above, fiber, tape or ribbon substrates according to the present invention may be used to form a variety of epitaxial devices having electromagnetically active layers disposed on the substrate. The electromagnetically active layer may be, for example, a superconductor, a semiconductor, a photovoltaic, a ferroelectric or an optoelectric, or any other electromagnetic device wherein grain boundary control is important.

Figure 16A:
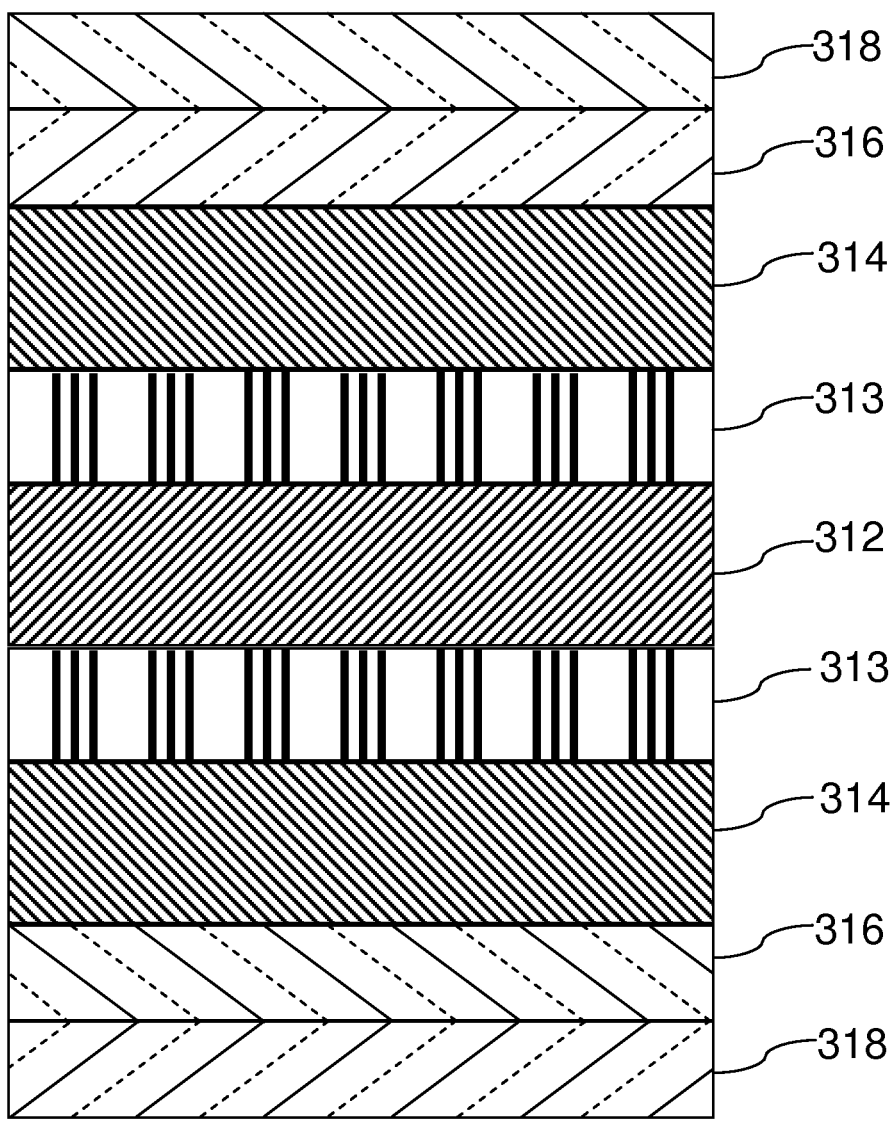
FIG. 16($a$) shows a cross section depiction of an epitaxial article comprising an electromagnetically active layer according to an embodiment of the present invention.

For example, a cross sectional view of a "round" biaxially-textured electromagnetically active layer comprising article 300 generally has a multi-layer composition, as shown in FIG. 16(a). Article 300 includes faceted fiber substrate 312 at its center. At least one epitaxial buffer layer, such as buffer layers 313, 314 and 316, can be disposed radially on the outer surface of faceted fiber substrate 312. Article 300 can comprise a variety of devices, such as a superconducting device, a solid state lighting device, or a photovoltaic device. The electromagnetically active layer 318 can comprises an electrical, electronic, optical, magnetic, electromagnetic or electro-optical device layer.

Although shown having three (3) buffer layers 313, 314 and 316, article 300 can be formed by disposing an electromagnetically active layer 318, such as a superconducting layer 318, directly on and in contact with the faceted fiber substrate 312, provided the respective layers are both chemically and structurally compatible. The fiber substrate 312 provides mechanical support for the superconductor article, and can be fabricated over long lengths and large areas. Alternatively, one, two or three or more buffer layers can be used.

Particularly for superconductor articles, optional epitaxial metal oxide, nitride, carbide or boride buffer layers 314 and 316 may comprise the next layer in the article. In the superconductor embodiment, the buffer layers 314 and 316 can be formed from suitable materials, such as one or more layers selected from $CeO_2$, YSZ, $Y_2O_3$, $LaAlO_3$, $LaCrO_3$, $NdGaO_3$, $LaNiO_3$, $SrTiO_3$, Nb-doped $SrTiO_3$, $RE_2O_3$, where RE is a rare earth, $LaMnO_3$, lanthanum zirconate (LZO), MgO, $NdGaO_3$, $NbTiO_3$, TiN, TZN, $TiB_2$, Pd, Ag, Pt and Au, which can serve as chemical barriers between the substrate surface 312 and the electromagnetically active layer 318 when embodied as a superconducting layer.

Buffer layers can be deposited by known techniques including physical or chemical vapor deposition, chemical solution deposition methods such as sol-gel deposition and electrodeposition. Deposition is followed by annealing to form epitaxial, biaxially textured layers on the fiber substrate. The electromagnetically active layer 318 such as a superconducting layer can then be deposited on buffer layer 316. Alternatively, the electromagnetically active layer 318 such as a superconductor layer can be disposed directly on and in contact with fiber substrate 312.

In one embodiment, the electromagnetically active layer comprises a superconducting article, such as for power transmission lines. FIG. 16(b) shows a cross sectional view of a "round" biaxially-textured superconducting article 350. In this embodiment, the electromagnetically active layer comprises superconducting layer 318. Optional silver comprising layer 320 and stabilizing layer 322 are shown on the superconducting layer 318.

The superconductor layer 318 can be an oxide superconductor. For example, the oxide superconductor can be selected from oxide superconductors, such as $REBa_2Cu_3O_7$ where RE is a rare earth element, $Tl_1Ba_2Ca_{n-1}Cu_nO_{2n+}$; where n is an integer between 1 and 4; $Tl_2Ba_2Ca_{n-1}Cu_nO_{2n+4}$ where n is an integer between 1 and 4; and $Hg_1Ba_2Ca_{n-1}Cu_nO_{2n+2}$, where n is an integer between 1 and 4.

In one embodiment the silver or silver alloy layer covers only the facet area on the fiber, tape or ribbon. In the embodiment also including a stabilizing layer, the silver or silver alloy layer and said stabilizing layer can cover only the facet area on said fiber, tape or ribbon. In one embodiment the stabilizing layer comprises a layer of Cu or Cu alloy.

The ability to form substrate 312 having at least one A-plane, R-plane, M-plane or a C-plane facet, permits subsequent cubic epitaxially grown layers to have correspondingly improved crystalline qualities. In particular, articles having lengths on the order of meters (e.g. >10 meters) including electromagnetically active layers such as superconducting layer 318 can be formed having a single-crystal nature having some low-angle grain boundaries as defined above, but being essentially without high-angle grain boundaries. In the case of superconductors, the ability to form such a structure results in significant improvement in the superconducting properties.

The superconductor, or other electromagnetically active layer, may be deposited by a variety of techniques, such as vapor deposition, laser ablation, sputtering, sol-gel, dip coating, electrodeposition, electrophoretic deposition, spray pyrolysis and doctor blade techniques. In some of the techniques, such as laser deposition, the as-deposited superconductor layer may be textured, but in other cases an additional oxygen anneal at appropriate oxygen partial pressures will be required to induce the texture from the substrate into the superconductor. The method also applies to solution precursor deposits to which one or more cations must be added from the vapor during the reaction to form the superconducting phase.

Figure 17:
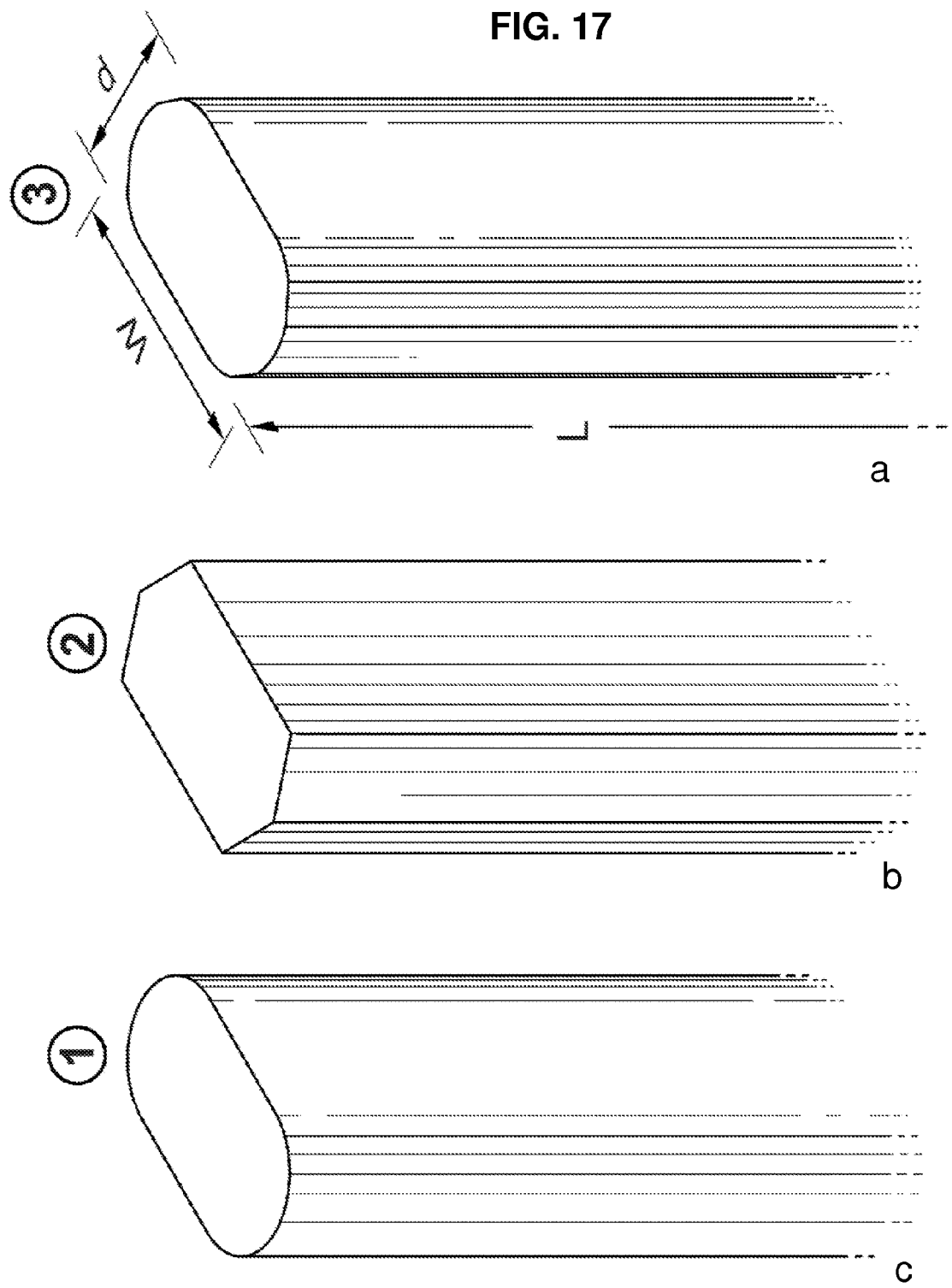
FIG. 17($a$)-($c$) shows a race-track shaped fiber with two facets on the broad face of the fiber, a fiber of a hexagonal cross-section, and a fiber similar to that shown in FIG. 17($a$) but with facets in the curved portion of the fiber as well, respectively, according to an embodiment of the invention.

FIG. 17(a)-(c) show schematics of various faceted fibers desired in this invention. FIG. 17(a) shows a race-track shaped fiber with two facets on the two broad faces of the fiber. The facet region is shown in shading. FIG. 17(b) shows another variation of this fiber and having a different cross-section. In this case the fiber cross-section is hexagonal. FIG. 17(c) shows a variation which is a combination of FIGS. 17(a) and (b), wherein minor facets are indicated in the curved regions shown in FIG. 17(a). In all cases, the definition of a fiber as defined above applies. In the case of tapes or ribbons, in general the cross-section remains the same, however the width, W, is also significantly greater than the thickness, d.

Figure 19B:
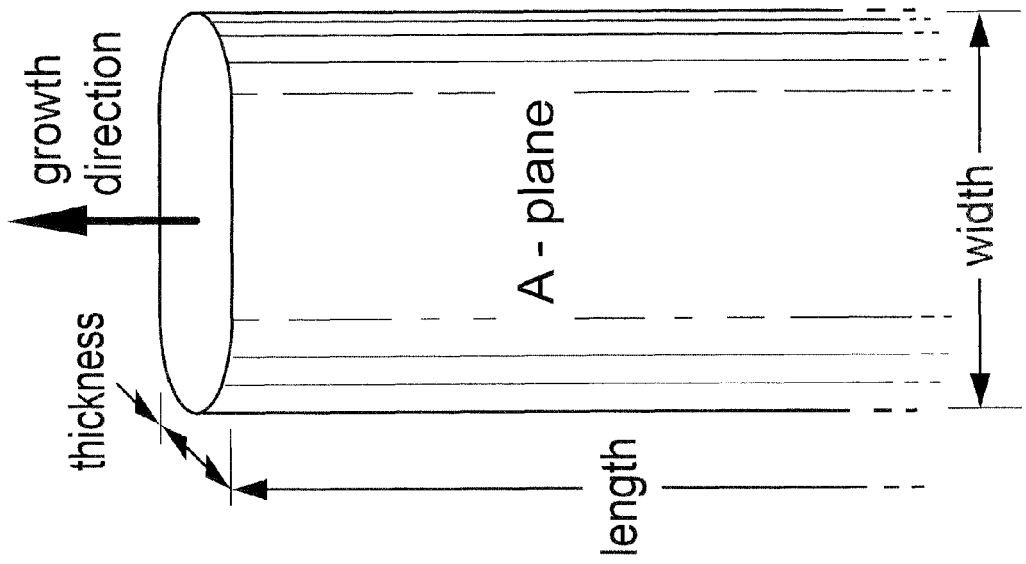
FIGS. 19($a$) and ($b$) show two cross-sections of a fiber and tape or ribbon of interest that can be used for the invention. It shows a rectangular or a rhombohedral or a racetrack shaped cross-section. The large facets on the fiber and tape or ribbon correspond to A-planes.
Figure 19A:
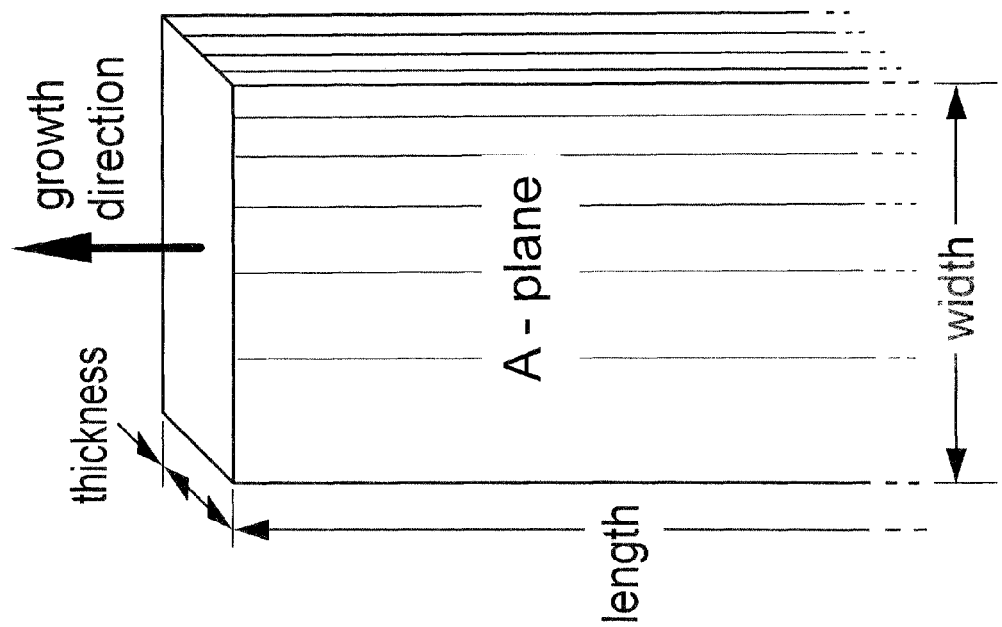
Figure 20B:
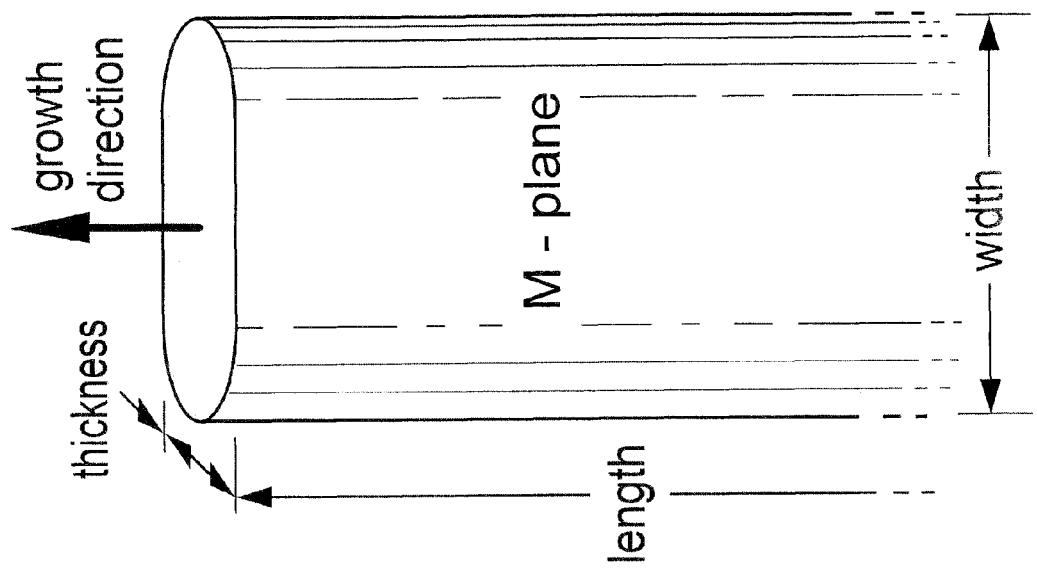
FIGS. 20($a$) and ($b$) show two cross-sections of a fiber and tape or ribbon of interest that can be used for the invention. It shows a rectangular or a rhombohedral or a racetrack shaped cross-section. The large facets on the fiber and tape or ribbon correspond to M-planes.
Figure 20A:
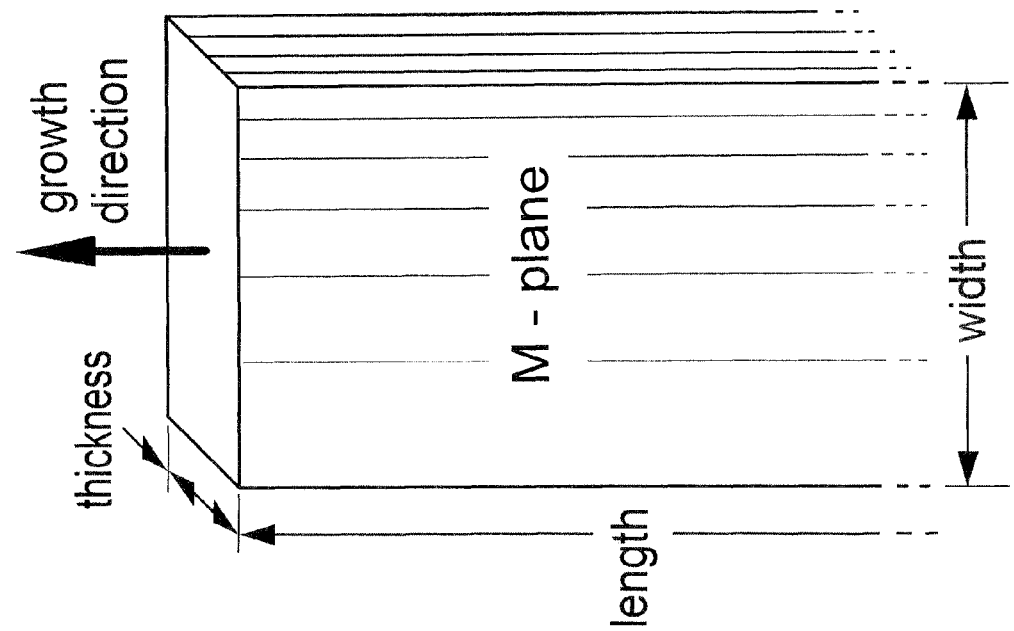
Figure 21B:
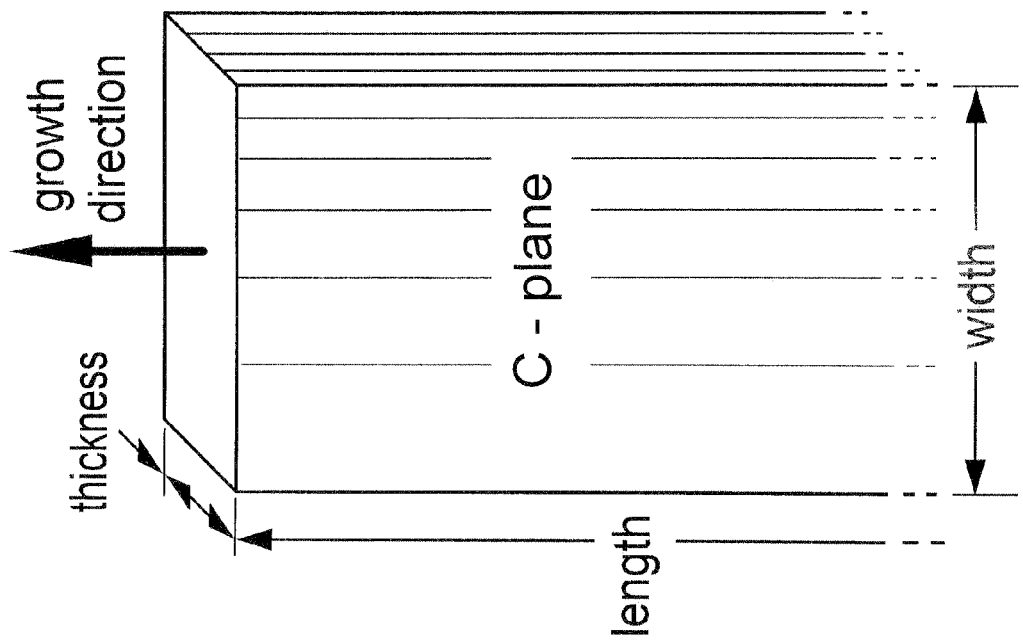
FIGS. 21($a$) and ($b$) show two cross-sections of a fiber and tape or ribbon of interest that can be used for the invention. It shows a rectangular or a rhombohedral or a racetrack shaped cross-section. The large facets on the fiber and tape or ribbon correspond to C-planes.
Figure 21A:
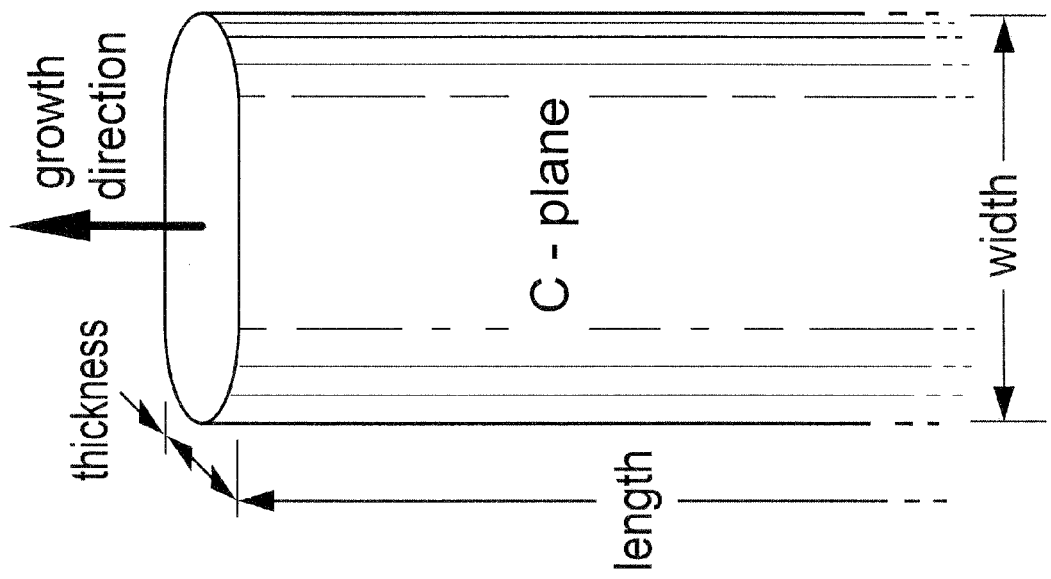

FIGS. 18(a) and (b) show two cross-sections of a fiber or tape/ribbon of interest for embodiments of the present invention, a rectangular or a rhomohedral shaped fiber or tape. FIGS. 18(a) and (b) also shows a fiber configuration, wherein the large facets correspond to R-plane. FIGS. 19(a) and (b) and 20(a) and (b) show the same faceted geometrical configurations as in FIGS. 18(a) and (b), but with facets corresponding to A (FIGS. 19(a) and (b)), M (FIGS. 20(a) and (b)) and C (FIGS. 21(a) and (b)) planes respectively.

Examples of epitaxial layers deposited on fibers, tapes or ribbons according to the present invention are described below in the Examples section.

EXAMPLES

The present invention is further illustrated by the following specific Examples, which should not be construed as limiting the scope or content of the invention in any way.

Example 1

Using system 200 as shown FIG. 1, a structural sapphire fiber with R-plane facets according to the present invention was prepared. An initial sapphire seed of approximately ⅛"× 1/16"×1" with a pointed end was attached to the die tip by melting the pointed end to the die tip. As noted above, it is known that the R planes of a sapphire crystal form a three-sided pyramid, with an 86° angle between the sides of the pyramid. The seed was cut so its axis lies along a corner of the pyramid. Thus, it has two R planes parallel to its axis. The R planes are at an angle of 86° to each other. One plane is coincident with the broad face of the seed. The seed was attached to a long, flat shaft, which can travel through the belt puller 232 shown in FIG. 1a. The puller was then placed as close to the tips as possible, and the initial fiber was drawn through the puller. The fiber resulting from this second operation is typically of good crystal orientation but can be of poor straightness. The puller was then raised higher, and a guide was then inserted between the puller and the tips. The fiber of the second step is threaded through the guide, and is used to grow a long, straight fiber, which serves as a seed for future runs. The procedure described above is standard procedure for EFG growth. A 2 m long fiber was grown from the seed at 1000-3000 mm/hr. The fracture surface indicated it is of the correct R-plane orientation. X-ray analysis confirmed that the two R planes were parallel to the fiber axis to 0±0.5° and 3.4±0.5°, respectively.

Figure 22:
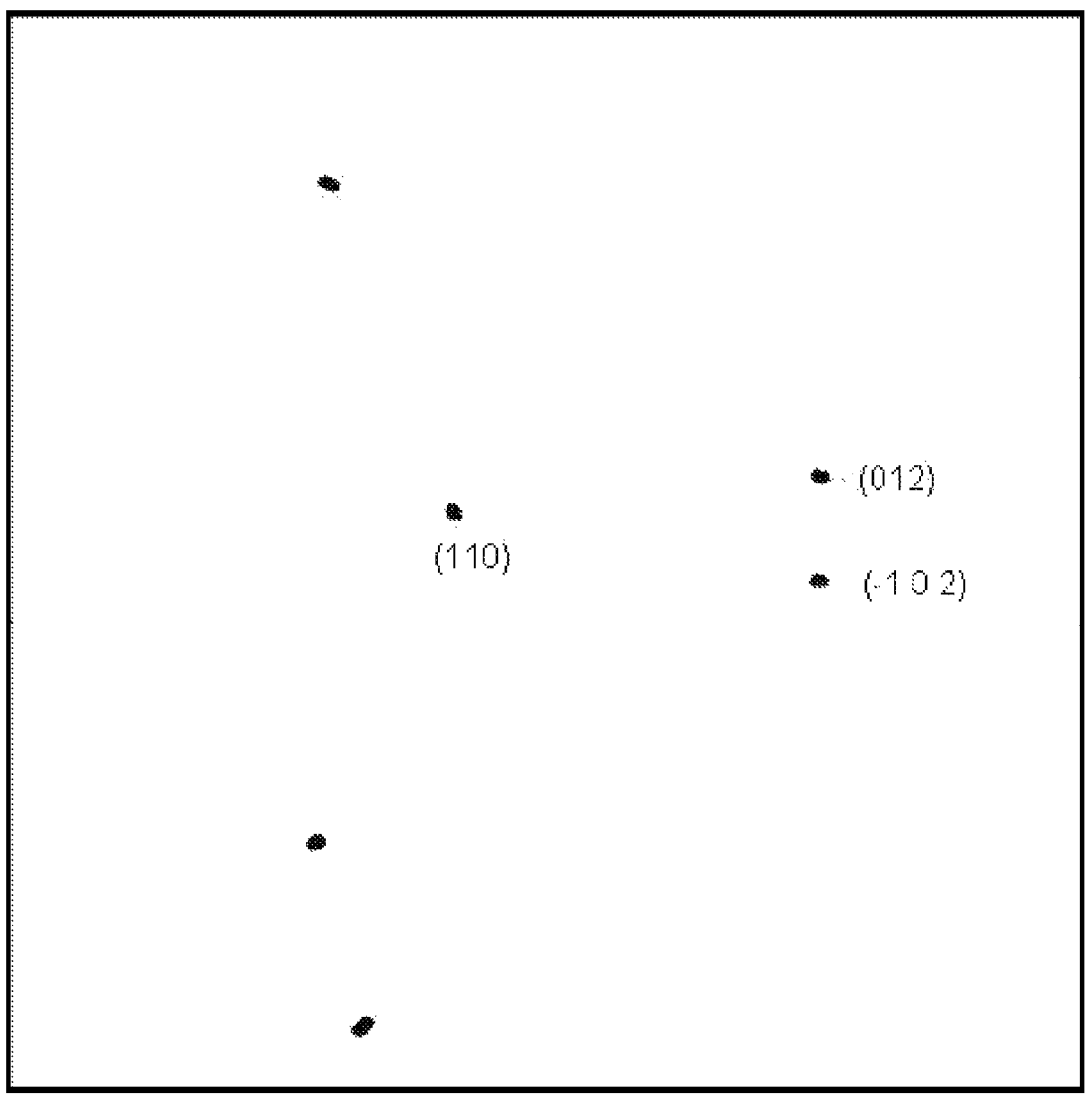
FIG. 22 shows a 2D detector image of the reflections of the reciprocal lattice relative to the fiber which is vertical as described in Example 1, according to an embodiment of the invention.
Figure 23A:
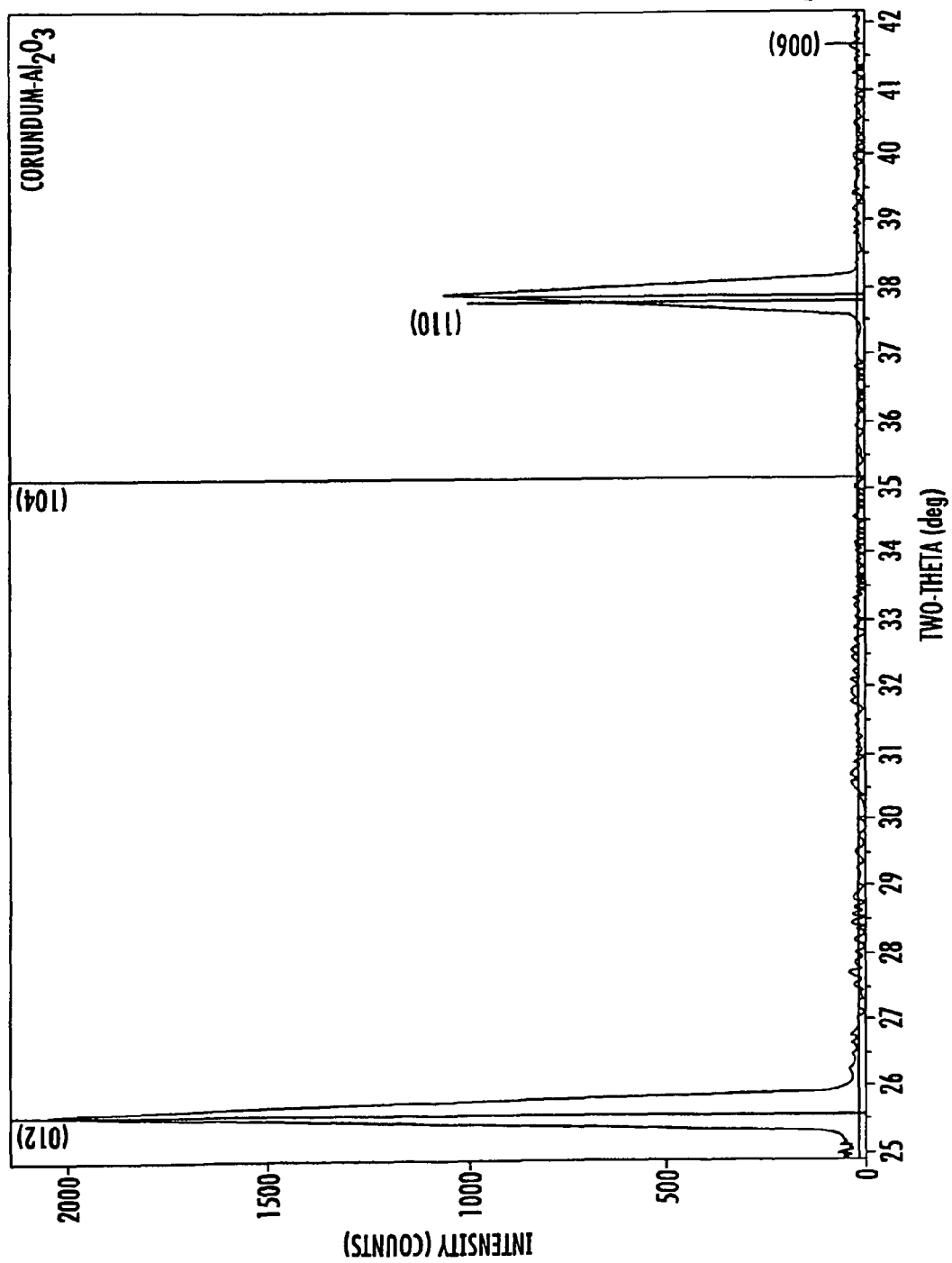
FIGS. 23($a$) and ($b$) show diffraction data from the fiber described in Example 1, according to an embodiment of the invention.
Figure 23B:
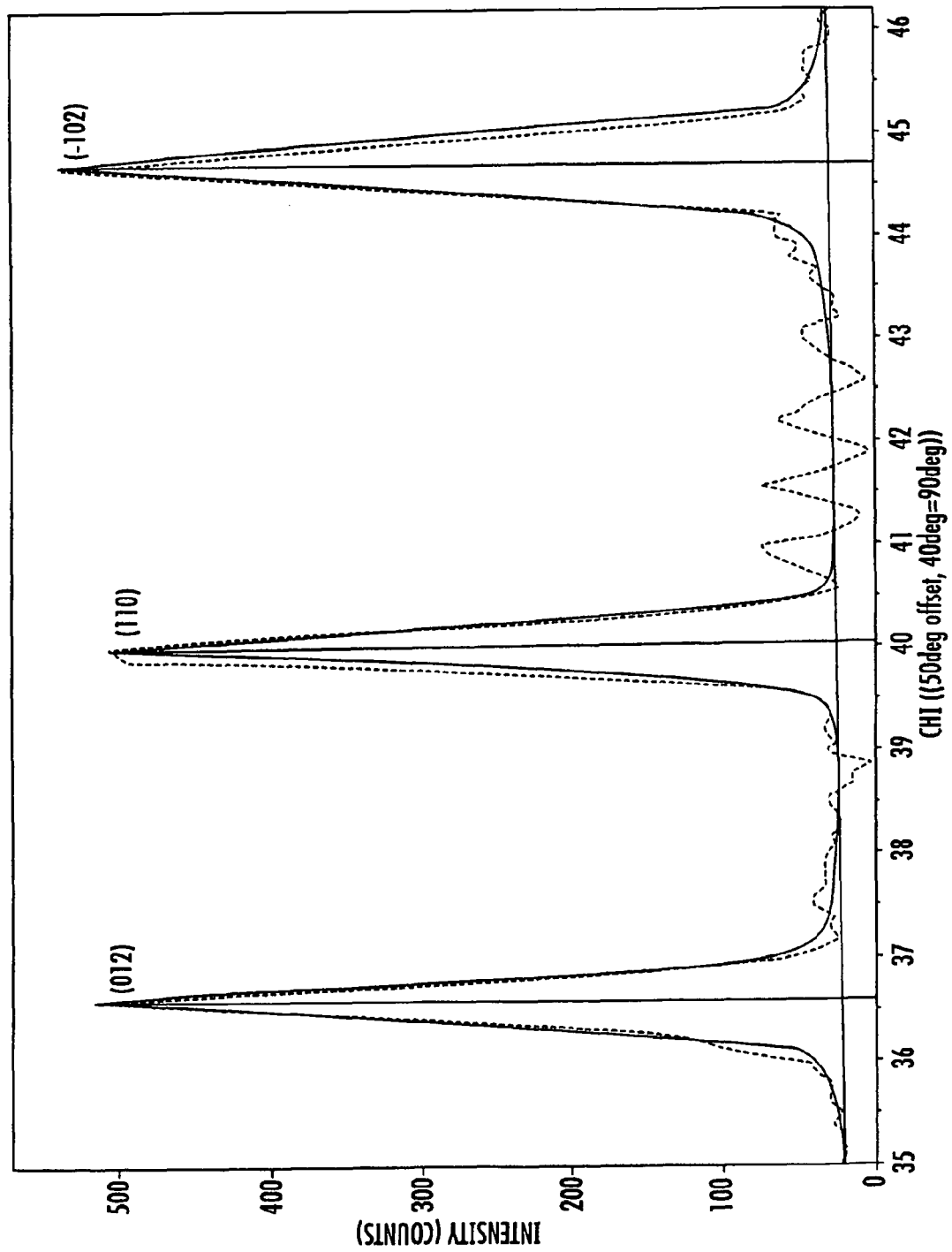

Table 1 (below) gives the tilt of the reciprocal plane normals and the reciprocal lattice plane with respect to the sapphire's physical axis. FIG. 22 shows a detector image of reflections of the reciprocal lattice relative to the fiber axis which is vertical. The (110) reflection is situated at 90° relative to the fiber indicating that this plane is parallel to the fiber. FIG. 22 also shows the (−1 0 2) and the (0 1 2) reflection which are tilted with respect to the fiber axis by about 4°. For rhombohedral or hexagonal materials such as sapphire, typically the four (h, k, i, l) instead of three (h, k, l) miller indicies are used. In order to go from the three indicies notation to the four indicies notation, "i" can be calculated as i=−(h+k). Accordingly, (110) will correspond to (11-20). FIGS. 23(a) and (b) show the diffraction data from which the tilts and indices were obtained. FIG. 23(a) shows ideal sapphire positions on the two reciprocal lattice planes that are close to being parallel to the fiber axis. FIG. 23(b) shows the angle tilt of planes from the fiber axis. A 90° tilt in the chi angle means that this plane would be parallel to the fiber axis, and in this that corresponds to (110). Only two R-plane facets were observed on the fiber surface.

TABLE 1

Tilt of R-plane and (110) with respect to fiber axis

| Plane index | Tilt of plane normal | Tilt of plane from fiber axis |
|---|---|---|
| (110) | 90.0 ± 0.5 | 0.0 ± 0.5 |
| (012) | 86.6 ± 0.5 | −3.4 ± 0.5 |
| (−1 0 2) | 94.7 ± 0.5 | 4.7 ± 0.5 |

Example 2

Figure 24:
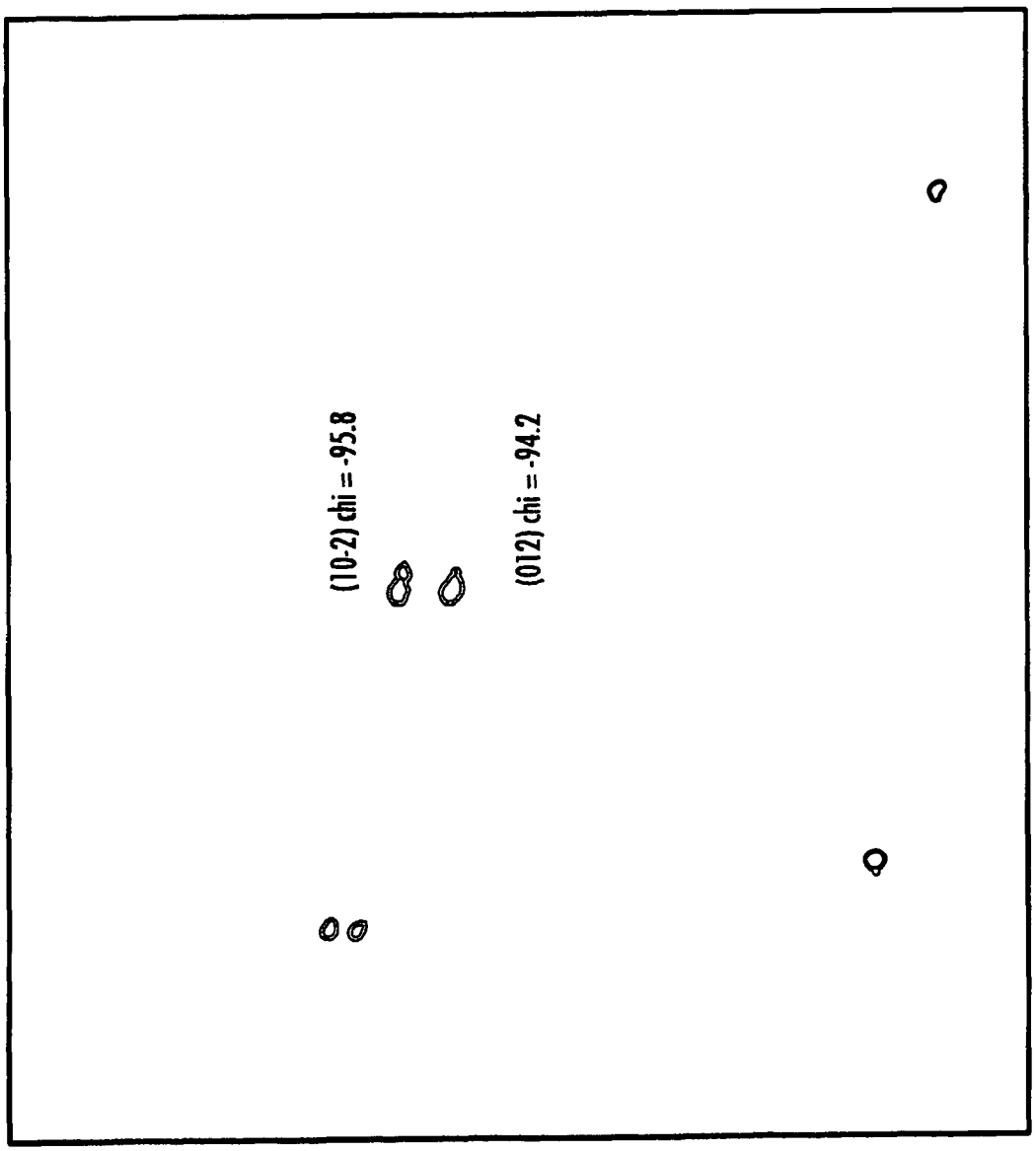
FIG. 24 shows a 2D detector image of the reflections of the reciprocal lattice relative to the fiber which is vertical as described in Example 2, according to an embodiment of the invention.
Figure 25:
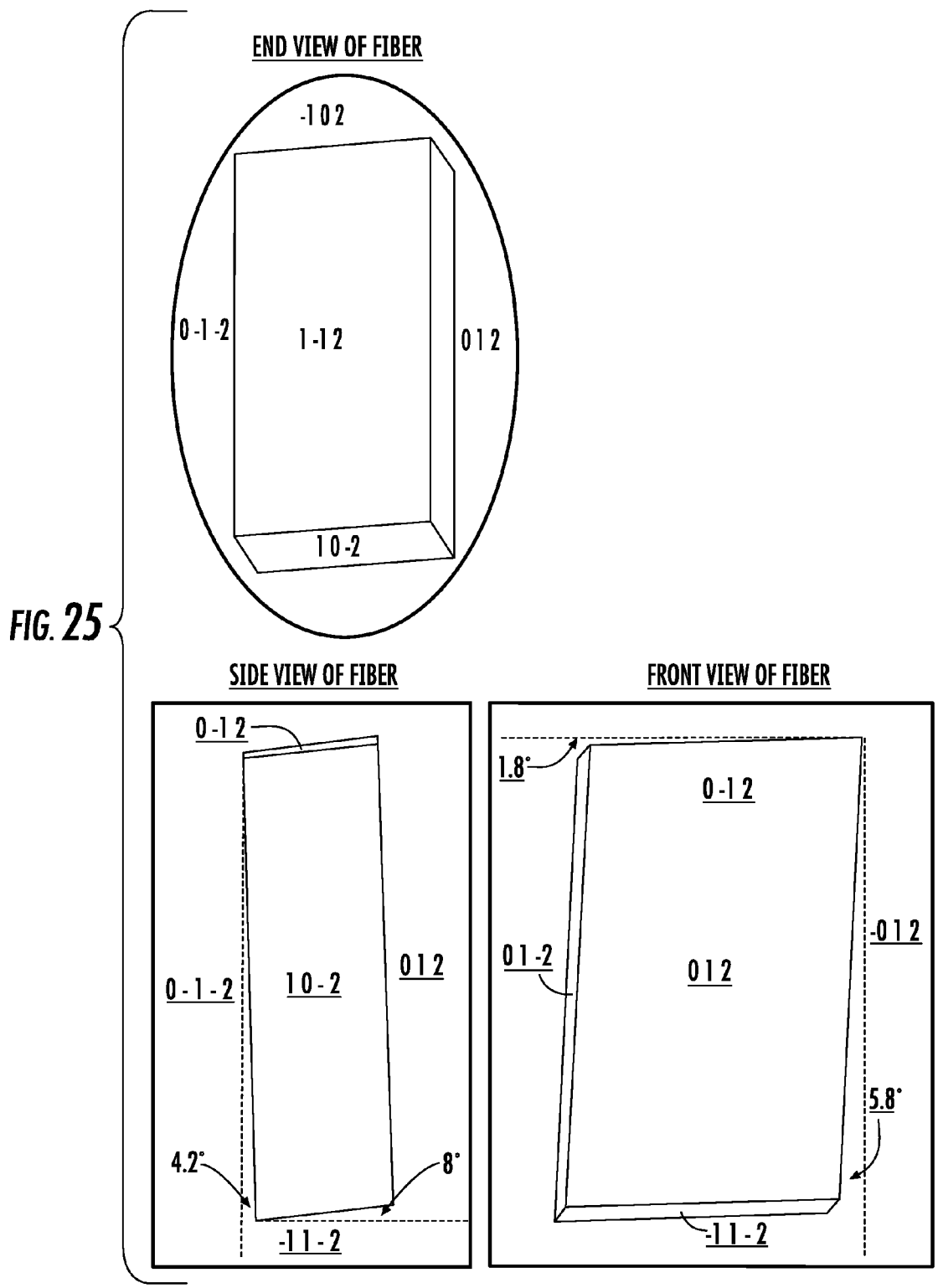
FIG. 25 shows the schematic of the R-planes in the fiber described in Example 2 according to an embodiment of the invention. An end view, a side view and a front view are all provided.

Again using system 200 described in FIG. 1a, a fiber of smaller dimensions was prepared. A fiber of cross-section 205 μm (thick)×460 μm (wide) was grown with two R-plane facets using a race-track shaped (composed of opposing semicircular end sections or curved edges and opposing straight parallel lines or flat faces) seed. The fiber was grown at a speed of 500 mm/hr, to a length of 848 mm. The sides of the racetrack-shaped fiber were flat. Table 2 gives the tilt of the R planes in the fiber. The "large face" is the broad, flat side of the fiber. The large face of the fiber is coincident to within 4.28° of an R plane. FIG. 24 shows a 2D detector image of the reciprocal lattice in relation to the fiber axis which is vertical was taken which revealed the R-planes being tilted by about 4° and 6° from the axis. FIG. 25 shows in schematic form the relationship of the R planes relative to the physical fiber in schematic form. An end view, a side view, and a front side view of the fiber are all provided.

TABLE 2

Tilt of R-plane and (011) with respect to the physical fiber axis

| Plane index | Tilt of plane normal | Tilt of plane from physical axis | Theoretical tilts based on faceplanes |
|---|---|---|---|
| (012) large face | 94.2 ± 0.5 | −4.2 ± 0.5 | 4.28 |
| (−1 0 2) edge | 95.8 ± 0.5 | −5.8 ± 0.5 | 5.72 |
| (1 −1 2) fiber axis | 8.0 ± 0.5 | 8.0 ± 0.5 | 8.33 |

Example 3

Using system shown in FIG. 1a, a sapphire fiber of was grown using a racetrack shaped seed containing two R-plane facets. The fiber grew stably to a length of approximately ten meters. Cross-section fracture mages of the fiber revealed that the fiber maintained its race-track shaped cross-section.

The above demonstrates that race-track shaped seeds can be used to create R-plane facets on a sapphire fiber. Race-track-shaped fibers were found to grow robustly and stably, and have the potential to be extended to very long lengths without degradation of crystal structure. The crystal was oriented to give two pairs of R planes parallel to the growth axis. These R-plane facets can also result in miscut R-plane facets on the substrates, miscut by about 5 degrees. It is expected that the miscut of the facets will not have a detrimental effect on film growth especially with respect to superconductivity application and may in-fact be beneficial from a flux-pinning perspective (see example 5). It is likely that the thickness of these racetrack-shaped fibers can be decreased to 50 microns without significant problems. The maximum speed of growth is expected to be above 3,000 mm/hr, and possibly substantially higher.

For long length growth, if the fiber rotates as it passes through the drive belts, over time the facets may rotate out of alignment with the R planes of the crystal structure. Increasing the width of the fiber and decreasing its thickness will likely be sufficient to prevent change of rotational orientation along the fiber's length. Also, using standard issues in reel-to-reel processing such as tensioning control can aid in avoiding twisting during the growth of long fibers.

Example 4

Using the fiber prepared according to Example 1, a $CeO_2$ layer was epitaxially deposited using pulsed laser ablation (PLD). This is done by first bonding the fiber with its R-plane facet parallel to the heater block surface. Bonding can be accomplished using silver paste. The fiber is then heated to a temperature of 760° C. and a $CeO_2$ layer is deposited from a $CeO_2$ target using PLD. This is then followed by deposition of a YBCO+1% BZO layer from a target of the same composition via PLD at the same fiber temperature. Similar to the findings in reported in FIGS. 16 and 17, both the $CeO_2$ and YBCO layers were epitaxial with the R-plane facet on the fiber. As shown in FIGS. 12-13 described above, a respectable critical density is obtained for such a configuration of a superconducting wire.

Example 5

Figure 26:
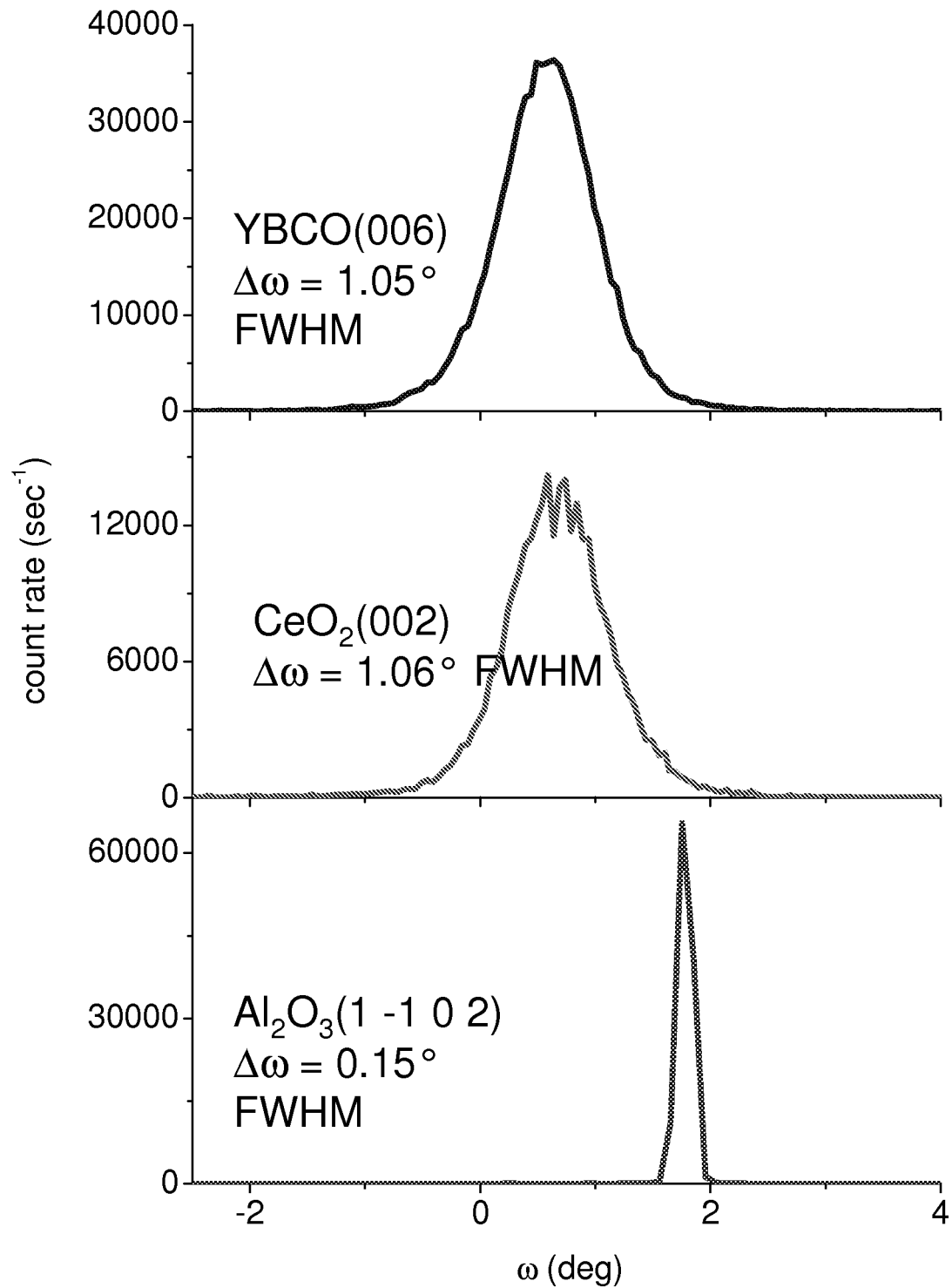
FIG. 26 shows omega scans or the out-of-plane texture of a miscut R-plane sapphire substrate with epitaxial layers of CeO$_2$ and YBCO, according to an embodiment of the invention.
Figure 27:
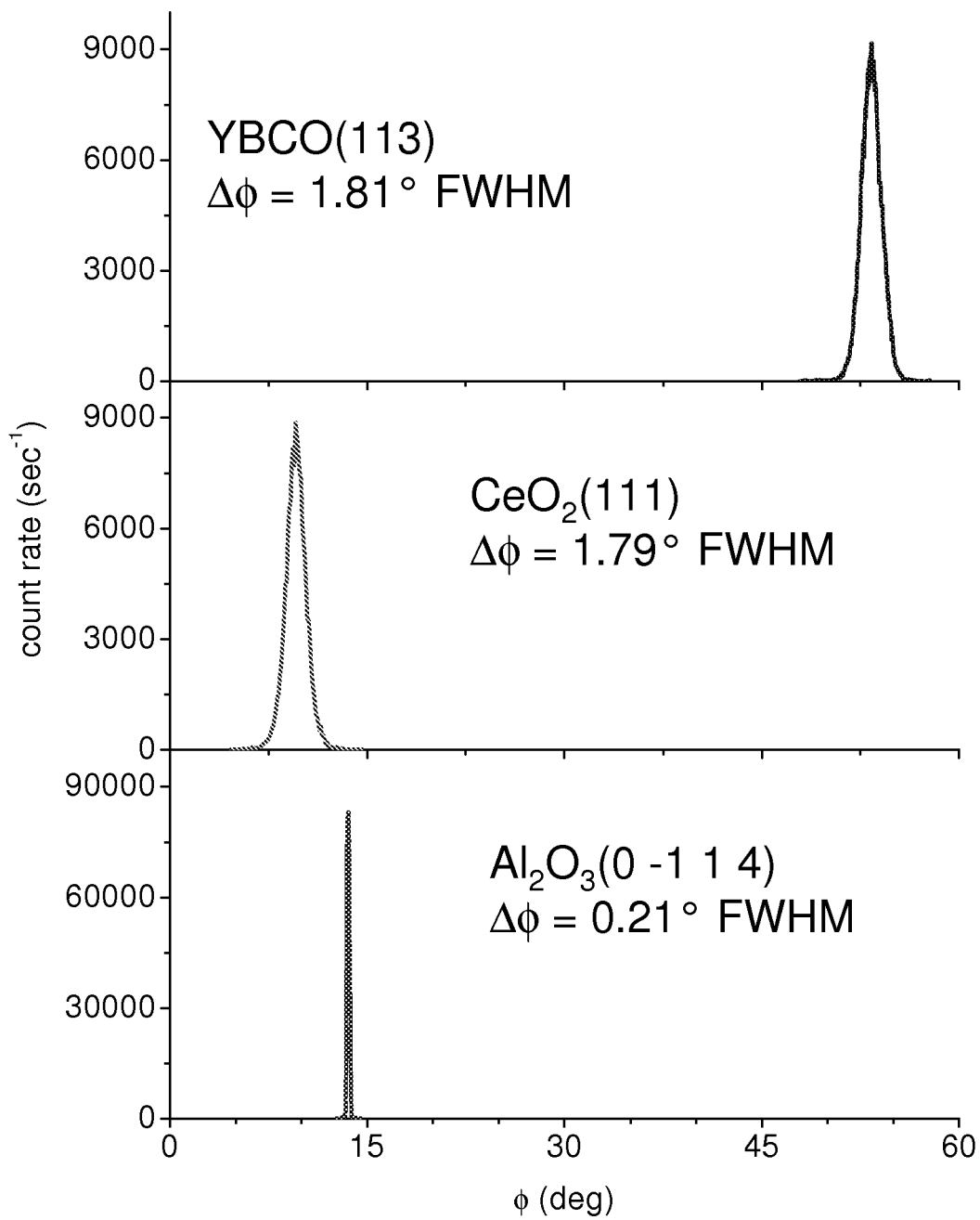
FIG. 27 shows phi scans of the in-plane texture of a miscut R-plane sapphire substrate with epitaxial layers of CeO$_2$ and YBCO, according to an embodiment of the invention.
Figure 28:
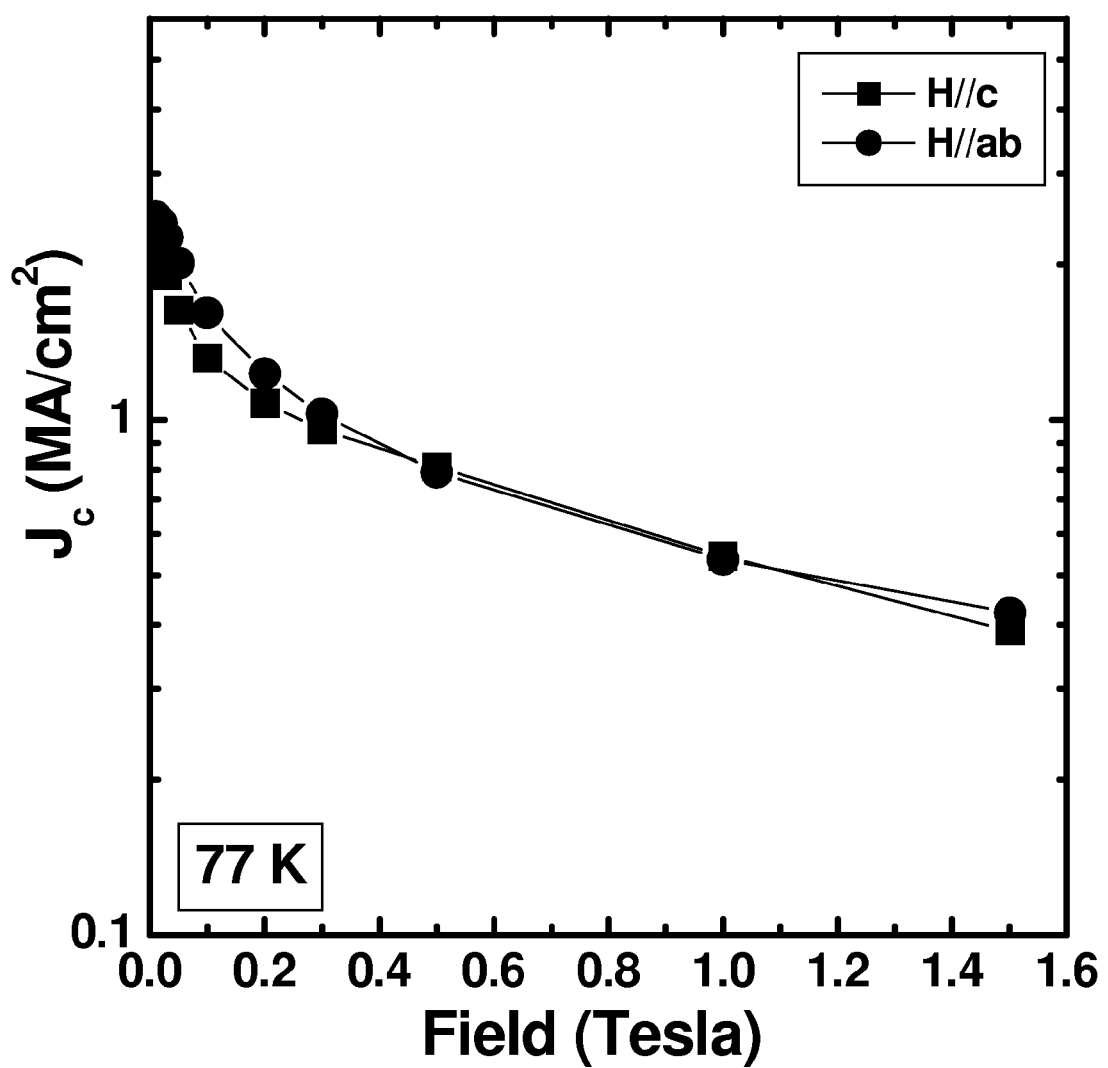
FIG. 28 shows the critical current density (J$_c$) as a function of applied field for YBCO on the miscut fiber shown in FIG. 28-29. The J$_c$ for the magnetic field (H) applied parallel to the c-axis (H//c) and the ab-planes (H//ab) of YBCO is shown. The self-field J$_c$ of the sample at 77K was found to be over 2 Million Amps per cm$^2$.
Figure 29:
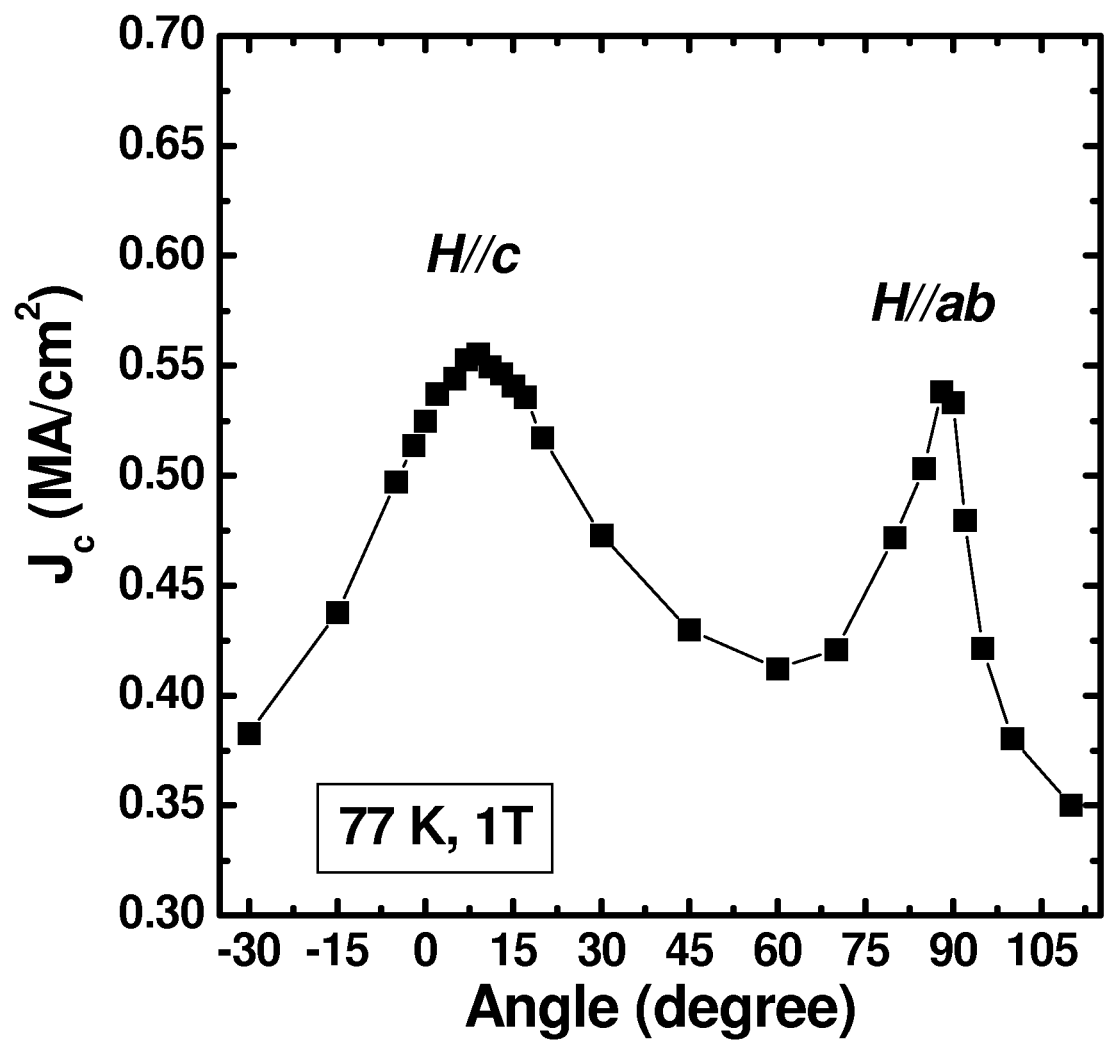
FIG. 29 shows the critical current density (J$_c$) as a function of angle at 77K, 1T for YBCO on the miscut fiber shown in FIG. 28-30, according to an embodiment of the invention. High J$_c$ is shown for all field orientations.

A 5 degree miscut, R-plane substrate was used to deposit $CeO_2$ and YBCO+1% BZO by PLD. The substrate was first bonded its R-plane facet parallel to the heater block surface. Bonding can be accomplished using silver paste. The fiber is then heated to a temperature of 760° C. and a $CeO_2$ layer is deposited from a $CeO_2$ target using PLD. This is then followed by deposition of a YBCO+1% BZO layer from a target of the same composition via PLD at the same fiber temperature. FIG. 26 shows X-ray diffraction omega scans showing the out-of-plane texture for an epitaxially grown layer of a YBCO superconductor with an intervening $CeO_2$ buffer layer on the miscut, R-plane sapphire substrate. FIG. 27 shows X-ray diffraction phi scans showing the in-plane texture for an epitaxially grown layer of a YBCO superconductor with an intervening $CeO_2$ buffer layer on the miscut, R-plane sapphire substrate. FIGS. 26 and 27 show that the out-of-plane texture as well as the inplane texture is good in both the $CeO_2$ and the YBCO layers. FIGS. 26 and 27 confirm that high quality, epitaxial layers can be deposited on miscut R-plane sapphire substrates. The YBCO film on this sample was also doped with 1% $BaZrO_3$ by volume to enhance the pinning. FIGS. 28 and 29 show the critical current density, $J_c$, versus applied magnetic field and $J_c$ versus angle respectively. As can be seen from the figure, excellent superconducting properties were obtained.

Example 6

Using the fiber prepared according to Examples 1 and 2, a fiber with a 5 degree miscut R-plane facet was fabricated. The fiber was first bonded to the heater block with its miscut R-plane facet parallel to the heater block surface. Bonding can be accomplished using silver paste. The fiber is then heated to a temperature of 760° C. and a $CeO_2$ layer is deposited from a $CeO_2$ target using PLD. This is then followed by deposition of a YBCO+1% BZO layer from a target of the same composition via PLD at the same fiber temperature. Similar to the findings in reported in FIGS. 26-27, epitaxial $CeO_2$ and YBCO layers were obtained on the R-plane facet on the fiber and the superconducting properties obtained are also similar to those reported in FIGS. 28 and 29.

Example 7

Using the process described in Example 1, a racetrack or rectangular shaped tip was used to grow a fiber with R-plane facets. This fiber was grown at a rate of 2000 mm/hr. A 100 meter long, continuous fiber was grown.

Example 8

Using the process described in Example 5, a racetrack or rectangular shaped tip was used to grow a fiber with R-plane facets. This fiber was grown at a rate of 3000 mm/hr. A 100 meters long fiber was stably grown with no disruption.

Example 9

Using the process described in Example 1, a racetrack or rectangular shaped tip was used to grow a fiber with A-plane facets. This fiber was grown at a rate of 2000 mm/hr.

Example 10

Using the process described in Example 7, a racetrack or rectangular shaped tip was used to grow a fiber with R-plane facets. This fiber was grown at a rate of 3000 mm/hr. A 1000 meters long fiber was stably grown.

Example 11

Using the process described in Example 1, a die-tip array was used for simultaneously growing multiple fibers from the melt. Die-tip arrays similar to those shown in FIG. 2-6 were used. These multiple fiber were grown at a rate of 1000-3000 mm/hr. 100 meter long, multiple, faceted fibers were stably grown.

Example 12

Using the process described in Example 1, a die-tip array was used for simultaneously growing multiple fibers from the melt. The fibers were shaped according to the geometries depicted in FIG. 18. The orientation of the fibers was such that the broad face was approximately parallel to the R-plane of sapphire with a miscut angle of less than 10 degrees. Die-tip arrays similar to those shown in FIG. 2-6 were used. These multiple fibers were grown at a rate of 1000-3000 mm/hr. 100 meter long, multiple fiber strands were stably grown.

Example 13

Using the process described in Example 1 and 2, a tape instead of a fiber shaped geometry was grown from the melt using EFG. The broad flat faces of the tape have an orientation such that the broad face was approximately parallel to the R-plane of sapphire with a miscut angle of less than 10 degrees.

Example 14

Using the process described in Example 1, a die-tip array was used for simultaneously growing multiple fibers from the melt. The fibers were shaped according to the geometries depicted in FIGS. 17 and 19. The orientation of the fibers was such that the broad face was approximately parallel to the A-plane of sapphire with a miscut angle of less than 10 degrees. Die-tip arrays similar to those shown in FIG. 2-6. These multiple fibers were grown at a rate of 1000-3000 mm/hr. 100 meter long, multiple fiber strands were stably grown.

Example 15

Using the process described in Example 1, a die-tip array was used for simultaneously growing multiple fibers from the melt. The fibers were shaped according to the geometries depicted in FIGS. 17 and 21. The orientation of the fibers was such that the broad face was approximately parallel to the C-plane of sapphire with a miscut angle of less than 10 degrees. Die-tip arrays similar to those shown in FIG. 2-6.

These multiple fibers were grown at a rate of 1000-3000 mm/hr. 100 meter long, multiple fiber strands were stably grown.

Example 16

Using the process described in Example 1, a die-tip array was used for simultaneously growing multiple fibers from the melt. The fibers were shaped according to the geometries depicted in FIGS. 17 and 20. The orientation of the fibers was such that the broad face was approximately parallel to the M-plane of sapphire with a miscut angle of less than 10 degrees. Die-tip arrays similar to those shown in FIG. 2-6. These multiple fibers were grown at a rate of 1000-3000 mm/hr. 100 meter long, multiple fiber strands were stably grown.

Example 17

Using the process described in Example 1, a tape instead of a fiber shaped geometry was grown from the melt using EFG. The broad flat faces of the tape have an orientation such that the broad face was approximately parallel to the A-plane of sapphire with a miscut angle of less than 10 degrees.

Example 18

Using the process described in Example 1, a tape instead of a fiber shaped geometry was grown from the melt using EFG. The broad flat faces of the tape have an orientation such that the broad face was approximately parallel to the C-plane of sapphire with a miscut angle of less than 10 degrees.

Example 19

Using the process described in Example 1, a tape instead of a fiber shaped geometry was grown from the melt using EFG. The broad flat faces of the tape have an orientation such that the broad face was approximately parallel to the M-plane of sapphire with a miscut angle of less than 10 degrees.

Example 20

Using the process described in Example 1, a die-tip array was used for simultaneously growing multiple MgO fibers from the melt. The fibers were shaped according to the geometries depicted in FIG. 17. The orientation of the fibers was such that the broad face was approximately parallel to the 100-plane of MgO with a miscut angle of less than 10 degrees. Die-tip arrays similar to those shown in FIG. 2-6. These multiple fibers were grown at a rate of 1000-3000 mm/hr. 100 meter long, multiple fiber strands were stably grown. An epitaxial layer of another material was grown on the surface of the facet using an in-situ or an ex-situ deposition method as described previously.

Example 21

Using the process described in Example 1, a die-tip array was used for simultaneously growing multiple MgO fibers from the melt. The fibers were shaped according to the geometries depicted in FIG. 17. The orientation of the fibers was such that the broad face was approximately parallel to the 110-plane of MgO with a miscut angle of less than 10 degrees. Die-tip arrays similar to those shown in FIG. 2-6. These multiple fibers were grown at a rate of 1000-3000 mm/hr. 100 meter long, multiple fiber strands were stably grown. An epitaxial layer of another material was grown on the surface of the facet using an in-situ or an ex-situ deposition method as described previously on at least a portion of the fiber.

Example 22

Using the process described in Example 1, a die-tip array was used for simultaneously growing multiple MgO fibers from the melt. The fibers were shaped according to the geometries depicted in FIG. 17. The orientation of the fibers was such that the broad face was approximately parallel to the 111-plane of MgO with a miscut angle of less than 10 degrees. Die-tip arrays similar to those shown in FIG. 2-6. These multiple fibers were grown at a rate of 1000-3000 mm/hr. 100 meter long, multiple fiber strands were stably grown. An epitaxial layer of another material was grown on the surface of the facet using an in-situ or an ex-situ deposition method as described previously on at least a portion of the fiber.

Example 23

Using the process described in Examples 20, 21 and 22, a MgO tape instead of a fiber shaped geometry was grown from the melt using EFG. The broad flat faces of the MgO tape have an orientation such that the broad face was approximately parallel to either the (100), (110) or (111) plane of MgO with a miscut angle of less than 10 degrees. An epitaxial layer of another material was grown on the surface of the facet using an in-situ or an ex-situ deposition method as described previously on at least a portion of the fiber.

Example 24

Using the process described in Example 1, a die-tip array was used for simultaneously growing multiple perovskite fibers from the melt. The fibers were shaped according to the geometries depicted in FIG. 17. The orientation of the fibers was such that the broad face was approximately parallel to either the (100) plane, the (110) plane or the (111) plane of the perovskite with a miscut angle of less than 10 degrees. Die-tip arrays similar to those shown in FIG. 2-6. These multiple fibers were grown at a rate of 1000-3000 mm/hr. 100 meter long, multiple fiber strands were stably grown. The perovskite material can be selected from a group comprising of but not limited to $SrTiO_3$, $LaAlO_3$, $YAlO_3$, $NdGaO_3$, LSAT. An epitaxial layer of another material was grown on the surface of the facet using an in-situ or an ex-situ deposition method as described previously.

Example 25

Using the process described in Example 24, a die-tip array was used for simultaneously growing multiple perovskite tapes instead of fibers from the melt. The orientation of the tapes was such that the broad face was approximately parallel to either the (100) plane, the (110) plane or the (111) plane of the perovskite with a miscut angle of less than 10 degrees. Die-tip arrays similar to those shown in FIG. 5-7. These multiple tapes were grown at a rate of 1000-3000 mm/hr. 100 meter long, multiple tape strands were stably grown. The perovskite material can be selected from a group comprising of but not limited to $SrTiO_3$, $LaAlO_3$, $YAlO_3$, $NdGaO_3$, LSAT. An epitaxial layer of another material was grown on the surface of the facet on the tape using an in-situ or an ex-situ deposition method as described previously.

Example 26

Figure 30:
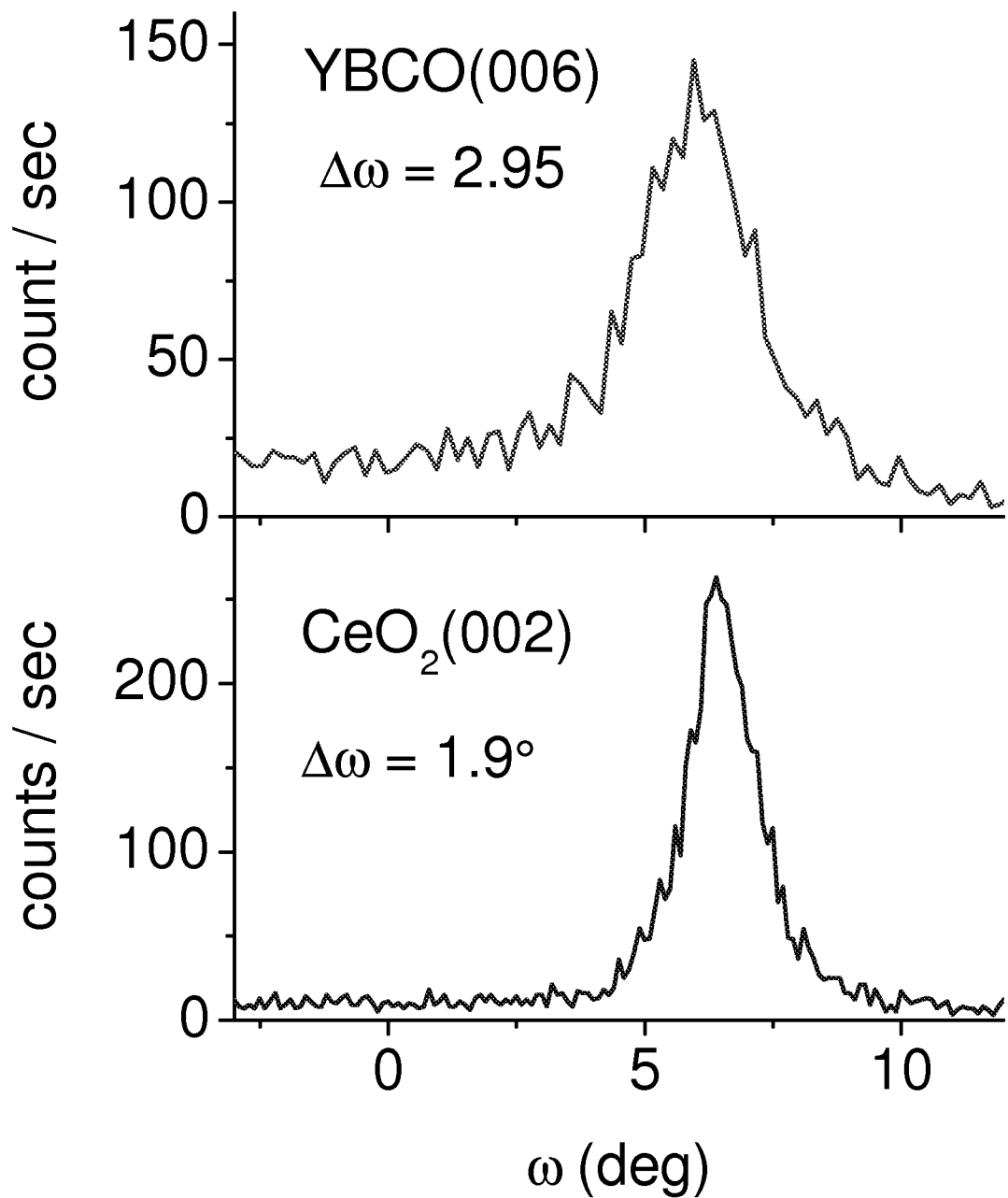
FIG. 30 shows omega scans or rocking curves for CeO$_2$ and YBCO grown on a fiber with miscut A-plane facets fabricated using the procedures outlines in Example 1 and 2, according to an embodiment of the invention.
Figure 31:
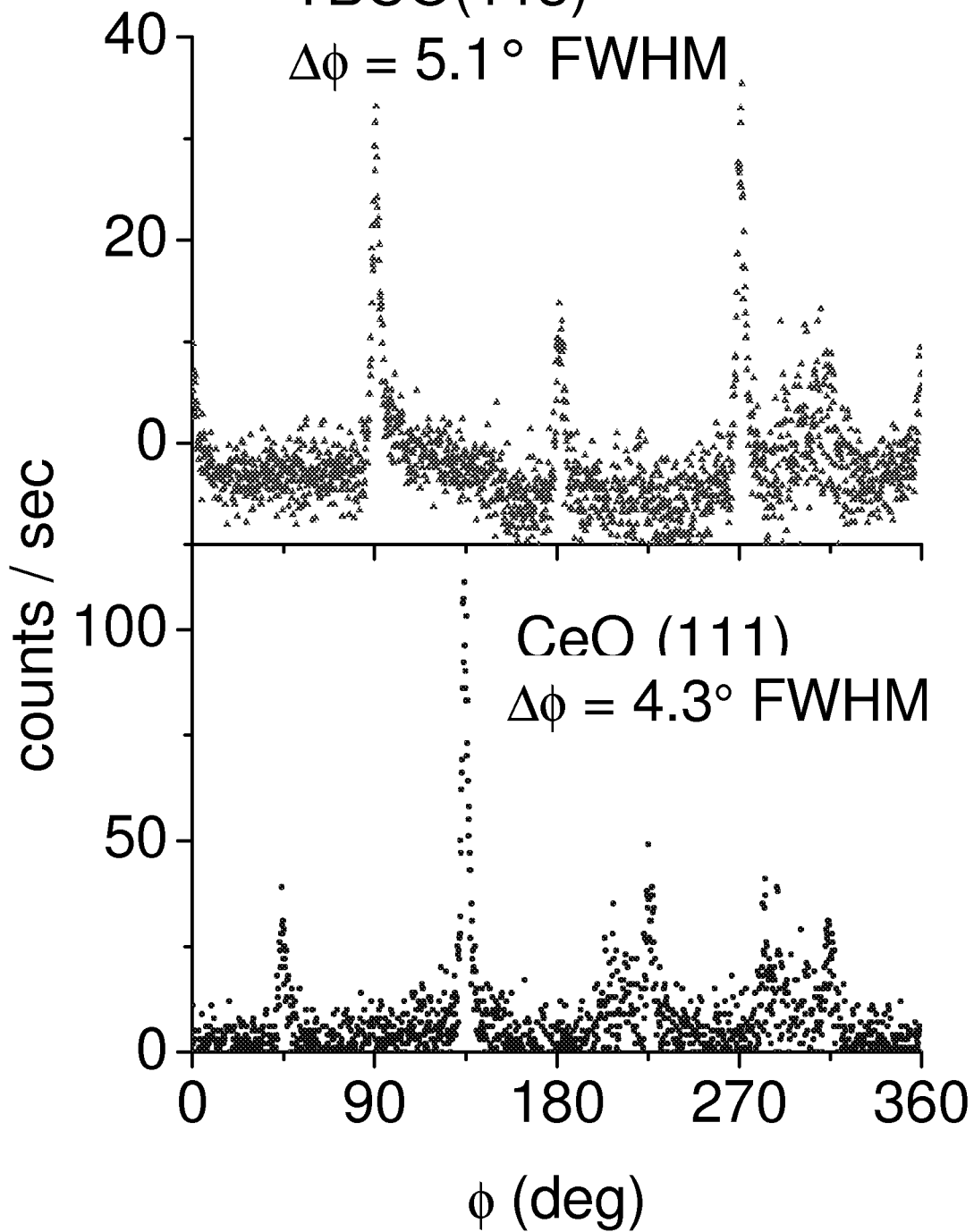
FIG. 31 shows phi-scans or the in-plane texture of CeO$_2$ and YBCO grown on a fiber with miscut A-plane facets fabricated using the procedures outlines in Example 1 and 2, according to an embodiment of the invention. Biaxial texture is clearly evident.
Figure 32:
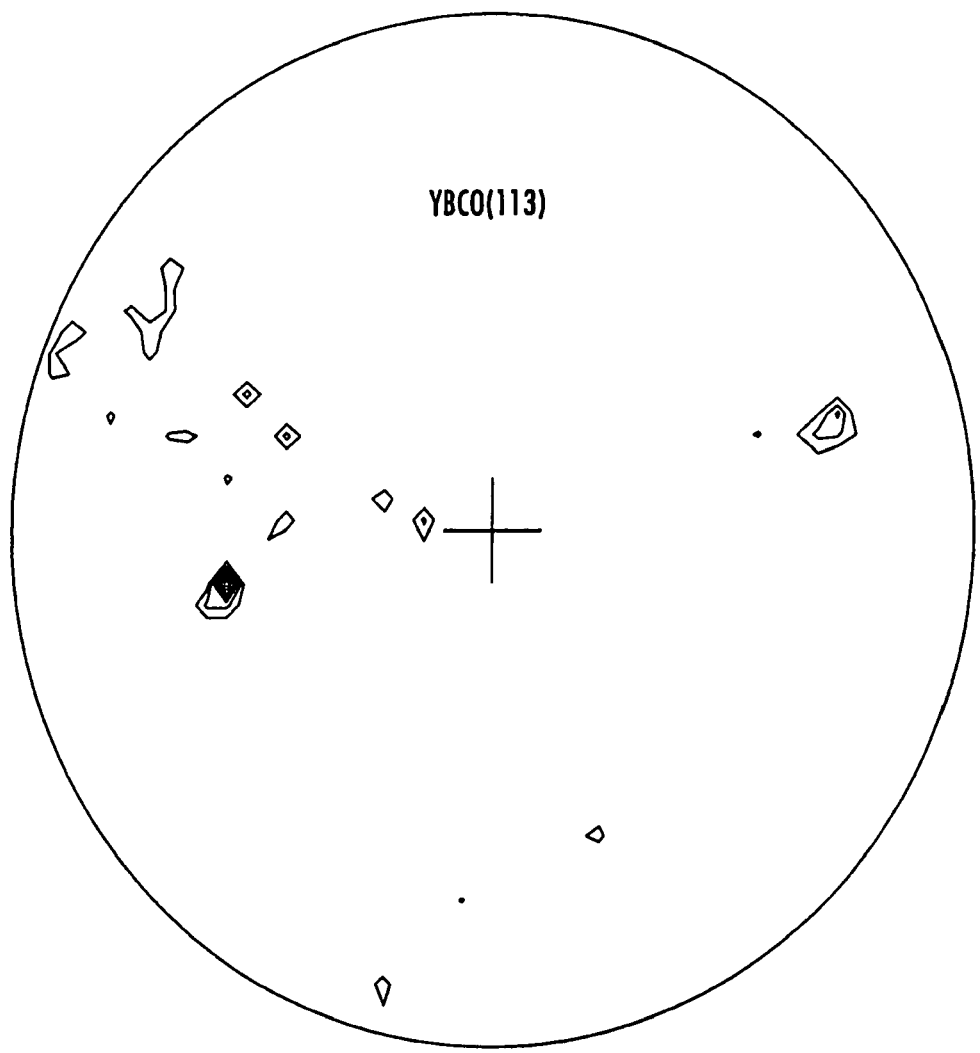
FIG. 32 shows the YBCO (113) pole figure for the coated fiber in FIG. 33 according to an embodiment of the invention. Only two points as opposed to four are seen since the fiber is very narrow in one direction and hence there is less signal.

Using the process described in Example 14 and 17, grow fibers and/or tapes having facets corresponding to the A-plane of sapphire. The facets can have a miscut angle of up to 10 degrees from the A-plane. Epitaxial $CeO_2$ and YBCO or REBCO superconductor is then deposited on the facet in the fiber or the tape similar to the data shown in FIGS. 14 and 15. Epitaxial deposition of $CeO_2$ and YBCO on A-plane sapphire substrates has been demonstrated before as shown in M. Shirakawa, M. Miura, T. Ohazama, Y. Shingai, A. Saito, M. Mukaida and S. Oshima, "Fabrication and characterization of YBCO thin film on $CeO_2$/a-plane sapphire substrate," Physica C, vol. 412-414, pages 1277-1280, 2004. FIG. 30 shows omega scans or rocking curves for $CeO_2$ and YBCO grown on a fiber with miscut A-plane facets fabricated using the procedures outlines in Example 1 and 2. FIG. 31 shows phi-scans or the in-plane texture of $CeO_2$ and YBCO grown on a fiber with miscut A-plane facets fabricated using the procedures outlines in Example 1 and 2. Clearly biaxial texture is evident. This is confirmed by the YBCO (113) pole figure shown in FIG. 32. Only two points as opposed to four are seen since the fiber is very narrow in one direction and hence there is very less signal.

Example 27

Using the process described in Example 16 and 19, grow fibers and/or tapes having facets corresponding to the M-plane of sapphire. The facets can have a miscut angle of up to 10 degrees from the M-plane. Epitaxial MgO and YBCO or REBCO superconductor is then deposited on the facet in the fiber or the tape. Epitaxial deposition of MgO and YBCO on M-plane sapphire substrates has been demonstrated before as shown in Guo-Chun Liang, Richard S. Withers, Brady F. Cole and Nathan Newman, "High-Temperature Superconductive Devices on Sapphire," IEEE Transactions on Microwave Theory and Techniques, vol. 42, No. 1., pages 34-40, 1994.

Light-emitting diodes (LEDs), laser diodes, and other electronic devices other than superconductors are typically manufactured by depositing various layers of semiconductor materials on a substrate. A known group of semiconductor materials which is useful in forming light-emitting devices is the gallium nitride (GaN) system. The gallium nitride system refers to semiconductor materials comprising one or more of the group III nitrides, GaN, AlN and InN. The GaN system allows various wavelengths of light, particularly the shorter wavelengths, to be produced based on the relative amounts of GaN, AlN and InN in the composition. GaN nitride-based semiconductor devices are commonly formed on a substrate comprising sapphire or single-crystal alumina. Growth of LEDs has been demonstrated on both C-plane and A-plane sapphire substrates, see for example Wei-Tsai Liao, Jyh-Rong Gong, Cheng-Liang Wang, Wei-Lin Wang, Chih-Chang Tsuei, Cheng-Yen Lee, Keh-Chang Chen, Jeng-Rong Ho, and Ren C. Luo, "Comparison of the Performance of InGaN/AlGaN MQW LEDs Grown on c-Plane and a-Plane Sapphire Substrates," Electrochem. Solid-State Lett., Volume 10, Issue 1, pp. H5-H7 (2007). Based on this invention, these devices for the solid-state lighting application can be grown on faceted sapphire fibers or tapes and ribbons. Rigid sapphire substrates are commonly used for solid state lighting applications. See for example, D. Doppalapudi, E. LLiopoulos, S, N. Basu and T. D. Moustakas, "Epitaxial growth of gallium nitride thin films on A-plane sapphire by molecular beam epitaxy," Journal of Applied Physics, vol. 85, No. 7, pages 3582-3589, 1999; S. Tripathy and R. K. Soni, "Optical properties of GaN layers grown on C-, A-, R- and M-plane sapphire substrates by gas source molecular beam epitaxy," Journal of Applied Physics, vol. 85, No. 12, pages 8386-8399, 1999 and T. Sasaki and S. Zembutsu, "Substrate-orientation dependence of GaN single-crystal films grown by metallorganic vapor-phase epitaxy," Journal of Applied Physics, vol. 61, pages 2533-2540, 1987. Integration of light emitting diodes on the flexible, faceted fibers and tapes or ribbons as taught in this invention can use prior body of work on growth of such devices on rigid sapphire substrates. See for example, "Light Emitting Diodes (LEDs) for General Illumination: An OIDA Technology Roadmap Update 2002, published by the Optoelectronics Industry Development Association (OIDA), Washington D.C., 2002, and U.S. Pat. No. 7,202,506 B1.

Example 28

Using the process described in Example 1 and 2, fibers and/or tapes having facets corresponding to the R, A, C or M-plane of sapphire were grown. Epitaxial Si layers on the facet surface were then grown. Optional buffer layers can also have been included. A device layer comprising of a Si-based pn-junction was then formed on the Si. This device can then function as a photovoltaic cell with high efficiency due to the single crystal nature of the Si-based device layer.

Example 29

Using the process described in Example 1 and 2, fibers and/or tapes having facets corresponding to the R, A, C or M-plane of sapphire were grown. Epitaxial Ge layers on the facet surface were then grown. Optional buffer layers could also have been included. A device layer comprising of a multi-junction cell comprising GaAs, GaInP, etc. was then fabricated. This device can then function as a photovoltaic cell with high efficiency due to the single crystal nature of the device layers.

Example 30

Using the process described in Example 1 and 2, fibers and/or tapes having facets corresponding to the R, A, C or M-plane of sapphire were grown. An epitaxial semiconductor layer (with the use of optional buffer layers) was grown selected from a group comprising of not limited to those based on indirect bandgap semiconductors such as Si, Ge, GaP; direct bandgap semiconductors such as CdTe, CuIn-$GaSe_2$ (CIGS), GaAs, AlGaAs, GaInP and AlInP; multiband semiconductors such as II-O-VI materials like $Zn_{1-y}Mn_yO_xTe_{1-x}$ and III-N-V multiband semiconductors such as $GaN_xAs_{1-x-y}P_y$, and combinations thereof. The epitaxial semiconductor can includes minor dopants of other materials in the semiconductor layers for obtaining the required n-type or p-type semiconducting properties. This results in the formation of a high-quality, flexible, single-crystal, semiconducting device.

Example 31

Using the process described in Example 1 and 2, fibers and/or tapes having facets corresponding to the R, A, C or M-plane of sapphire were grown. An epitaxial semiconductor layer (with the use of optional buffer layers) of a compound semiconductor was then grown thereon comprising the elements from two or more different groups of the Periodic Table, including compounds of Group III (B, Al, Ga, In) and Group V (N, P, As, Sb, Bi) for the compounds AlN, AlP, AlAs, GaN, GaP, GaAs, InP, InAs, InSb, AlInGaP, AlGaAs, InGaN etc, and the compounds of Group II (Zn, Cd, Hg) and Group VI (O, S, Se, Te) such as ZnS, ZnSe, ZnTe, CdTe, HgTe, CdHgTe, etc. In addition to binary compounds of the above, ternary (three elements, e.g. InGaAs) and quaternary (four elements, e.g. InGaAsP) compounds can also be included. This was found to result in the formation of a high-quality, flexible, single-crystal, semiconducting device.

Example 32

Using the process described in Example 1 and 2, fibers and/or tapes having facets corresponding to the R, A, C or M-plane of sapphire were grown. An epitaxial layer of superconducting material such as YBCO with at least one intervening, epitaxial buffer layer was then grown thereon. The fiber or tape/ribbon with the superconductor was thus used as high temperature superconducting delay line, a superconducting filter or as a superconducting antenna. See for example known superconductor articles on rigid sapphire substrates—"Electrically Small, Superdirective, and Superconducting Antennas," by R. C. Hansen, published by Wiley-Interscience, 2006, ISBN 047004103X; "Phased Array Antennas: Floquet Analysis, Synthesis, BFNs and Active Array Systems," by Arun K. Bhattacharya, published by Wiley-Interscience, 2006, ISBN 9780471727576; H. Chaloupka, "High-temperature Superconductor Antennas: Utilization of Low rf and of Nonlinear Effects," Journal of Superconductivity, vol. 5, No. 4, pages 403 416, 1992; G. C. Liang, R. S. Withers, B. F. Cole, S. M. Garrison, M. E. Johnsson, W. S. Ruby and W. G. Lyonns, "High-temperature Superconducting Delay Lines and Filters on Sapphire and Thinned LaAlO$_3$ Substrates," IEEE Trans. on Appl. Supercond., vol. 3, No. 3, pages 3037-3042, 1993.

Example 33

Using the process described in Example 1 and 2, fibers and/or tapes having facets corresponding to the R, A, C or M-plane of sapphire were grown. An epitaxial layer of superconducting material such as YBCO with at least one intervening, epitaxial buffer layer was then grown thereon. The individual fibers are now braided to achieve transposing of the individual fibers as shown in FIG. 33(*a*). The whole braided assembly can be twisted if desired as well. Also, multiple fibers with the superconductor can be braided together as shown in FIG. 33(*b*). A cable made in this manner will have very AC losses due to hysteretic losses in the superconductor layer.

While there has been shown and described what are at present considered the preferred embodiments of the invention, it will be obvious to those skilled in the art that various changes and modifications can be prepared therein without departing from the scope of the inventions defined by the appended claims.

I claim:
1. An article, comprising:
a single-crystal, non-planar, non-cubic, ceramic fiber having at least one crystallographic facet along its length,
at least one epitaxial buffer layer on said fiber facet, and
at least one epitaxial layer, comprising a REBCO-type superconductor, on said epitaxial buffer layer, wherein said fiber is sapphire or $Al_2O_3$ based, and said facet comprises an A-plane, R-plane, M-plane or a C-plane facet.
2. The article of claim 1, wherein said facet is miscut from an exact A-plane, R-plane, M-plane or a C-plane along said length by ±1 to ±10 degrees on average.
3. The article of claim 1, wherein said facet comprises at least two selected from the group consisting of said R-plane facets, A-plane facets, C-plane facets and M-plane facets, with said two facets being tilted about an axis parallel to said length by no more than 10 degrees on average.

* * * * *